US008299586B2

(12) United States Patent
Yamano et al.

(10) Patent No.: US 8,299,586 B2
(45) Date of Patent: Oct. 30, 2012

(54) SEMICONDUCTOR DEVICE AND METHOD OF MANUFACTURING THE SAME

(75) Inventors: Takaharu Yamano, Nagano (JP); Syota Miki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 100 days.

(21) Appl. No.: 12/877,149

(22) Filed: Sep. 8, 2010

(65) Prior Publication Data
US 2011/0095404 A1 Apr. 28, 2011

(30) Foreign Application Priority Data
Oct. 23, 2009 (JP) ................................. 2009-244682

(51) Int. Cl.
*H01L 23/552* (2006.01)
*H01L 21/78* (2006.01)

(52) U.S. Cl. . 257/660; 257/737; 257/686; 257/E21.599; 257/E23.114; 438/462; 438/113

(58) Field of Classification Search .................. 257/660, 257/E21.599, E23.114, 737, 686; 438/462, 438/113
See application file for complete search history.

(56) References Cited

U.S. PATENT DOCUMENTS

| 2004/0155323 | A1* | 8/2004 | Murakami et al. | ............ 257/676 |
| 2005/0012214 | A1* | 1/2005 | Nakamura et al. | ............ 257/738 |
| 2009/0205859 | A1* | 8/2009 | Tanaka et al. | ................. 174/260 |
| 2011/0140248 | A1* | 6/2011 | Tsai et al. | ..................... 257/659 |

FOREIGN PATENT DOCUMENTS

| JP | 3313547 | 5/2002 |
| JP | 3614828 | 11/2004 |
| JP | 3614829 | 11/2004 |

\* cited by examiner

*Primary Examiner* — Cuong Q Nguyen
*Assistant Examiner* — Cathy N Lam
(74) *Attorney, Agent, or Firm* — IPUSA, PLLC

(57) ABSTRACT

A disclosed semiconductor device includes a semiconductor chip having an electrode pad on a circuit forming face of the semiconductor chip, an internal connection terminal formed on the electrode pad, a stepped portion formed along an outer edge portion of the circuit forming face of the semiconductor chip, a first insulating layer formed on the circuit forming face of the semiconductor chip to cover at least the stepped portion, a second insulating layer formed on the circuit forming face of the semiconductor chip to cover the first insulating layer, and an interconnection formed on the second insulating layer and electrically connected to the electrode pad via the internal connection terminal.

14 Claims, 42 Drawing Sheets

SEMICONDUCTOR DEVICE AND METHOD OF MANUFACTURING THE SAME

CROSS-REFERENCE TO RELATED APPLICATIONS

This patent application is based upon and claims the benefit of priority of Japanese Patent Application No. 2009-244682 filed on Oct. 23, 2009 the entire contents of which are incorporated herein by reference.

BACKGROUND OF THE INVENTION

1. Field of the Invention

The present invention generally relates to a semiconductor device having a semiconductor chip on which interconnections are formed and a method of manufacturing the semiconductor device.

2. Description of the Related Art

Examples of products using semiconductors are recently used for various mobile apparatuses such as digital cameras and portable phones, and are rapidly becoming small-sized, thinned, and trimmed weight. The small-size and high-density are required also in semiconductor devices such as a NAND flash memory. So-called chip size package (CSP) which has substantially the same size as a semiconductor chip in the plan view as illustrated in FIG. 1 has been proposed as illustrated in FIG. 1. It is also required to reduce the price in addition to decreasing the small size and increasing the high density.

Hereinafter, examples of a semiconductor device and a manufacturing method of the semiconductor device are described. FIG. 1 is a cross-sectional view of the above example of the semiconductor device. Referring to FIG. 1, the semiconductor device 100 includes a semiconductor chip 101, an internal connection terminal 102, an insulating layer 103, an interconnection 104, a solder resist 106, and an externally connecting pad 107.

The semiconductor chip 101 includes a semiconductor substrate 109, a semiconductor element 111, an electrode pad 112, and a protection film 113. The semiconductor substrate 109 is obtained by taking apart a thinned Si wafer into pieces.

The semiconductor integrated circuit 111 is provided on a surface side of the semiconductor substrate 109. The semiconductor integrated circuit 111 is made of a diffusion layer, an insulating layer, via holes, interconnections or the like (not illustrated). Plural electrode pads 112 are provided on the semiconductor integrated circuits 111. The plural electrode pads 112 are electrically connected to the interconnections provided on the semiconductor integrated circuit 111. The protection layer 113 is provided on the semiconductor integrated circuit 111. The protection layer 113 is a film for protecting the semiconductor integrated circuit 111.

The internal connection terminal 102 is provided on the electrode pad 112. The upper end portions of the internal connection terminals 102 are exposed from the insulating layer 103. The upper end portions of the internal connection terminals 102 are connected to the interconnections 104. The insulating layer 103 is provided to cover the semiconductor chip 101 on a side where the internal connection terminal 102 is provided. The insulating layer 103 is a sheet-like insulating resin having adhesiveness such as a non conductive film (NCF). Such a sheet-like insulating resin may ordinarily be epoxy resin or cyanate ester series resin which has opalescent or colorless transparency. Alpha rays, visible rays, and ultraviolet rays transmit through the insulating layer 103 to a semiconductor integrated circuit 111 positioned below the insulating layer 103.

The interconnections 104 are provided on the insulating layer 103. The interconnections 104 are connected to the internal connection terminal 102. The interconnections 104 are electrically connected to the electrode pads 112 via the internal connection terminals 102. The interconnection 104 has a region for externally connecting pad 104A in which the externally connecting pad 107 is provided. The solder resist 106 is formed on the insulating layer 103 to cover the interconnections 104 except for the region for externally connecting pad 104A.

The externally connecting pads 107 are provided on the regions for externally connecting pad 104A of the interconnections 104. The externally connecting pads 107 are connected to the interconnections 104. The material of the externally connecting pads 107 may be an alloy containing Pb, an alloy containing Sn and Cu, an alloy containing Sn and Ag, an alloy containing Sn, Ag, and Cu, or the like.

FIG. 2 is a plan view of a semiconductor substrate on which the example semiconductor device of FIG. 1 is formed. Referring to FIG. 2, reference symbol 110 designates a semiconductor substrate, and reference symbol C designates positions (hereinafter, referred to as cutting position C) where the semiconductor substrate 110 is cut. Referring to FIG. 2, the semiconductor substrate 110 includes plural semiconductor device forming regions A and scribe regions B for separating the plural semiconductor device forming regions A. The semiconductor devices 100 are formed on the plural semiconductor device forming regions A. The semiconductor substrate 110 becomes the semiconductor substrate 109 (see FIG. 1) described above by thinning the semiconductor substrate 110 and cutting the thinned semiconductor substrate 110 at cutting positions C.

FIG. 3 thru FIG. 11 illustrate manufacturing processes of the example semiconductor device illustrated in FIG. 1. Referring to FIG. 3 to FIG. 11, the same reference symbols are attached to portions which are the same as those of the semiconductor device 100 illustrated in FIG. 1, and description of these portions may be omitted. Referring to FIG. 3 to FIG. 11, reference symbol A designates the plural semiconductor device forming regions (hereinafter, referred to as semiconductor device forming region A), reference symbol B designates the scribe regions (hereinafter, referred to as scribe region B), and reference symbol C designates the cutting positions (hereinafter, referred to as cutting position C) where the semiconductor substrate 110 is cut by the dicing blade.

First, in the process illustrated in FIG. 3, the semiconductor chip 101 having the semiconductor integrated circuit 111, plural electrode pads 112, and the protection layer 113 is formed on a surface side of the semiconductor substrate 110 before the semiconductor substrate 110 is thinned. Next, in the process of FIG. 4, the internal connection terminals 102 are formed in plural electrode pads 112. At this stage, there are variations of heights in the internal connection terminals 102.

In the process illustrated in FIG. 5, a flat plate 115 is pressured on the internal connection terminals 102 to arrange the heights of the plural internal connection terminals 102 to level the heights. In the process illustrated in FIG. 6, the insulating layer 103 made of the resin is formed to cover the semiconductor chip 101 on the side of forming the internal connection terminal 102 and the internal connection terminal 102. As described, the insulating layer 103 may be the sheet-like insulating resin having adhesiveness such as a non conductive film (NCF). As described, such a sheet-like insulating resin may ordinarily be epoxy resin or cyanate ester series resin which has opalescent or colorless transparency. Alpha rays, visible rays, and ultraviolet rays transmit through the insulating layer 103 to a semiconductor integrated circuit 111 positioned below the insulating layer 103.

In the process illustrated in FIG. 7, the insulating layer 103 is polished until upper surfaces 102A of the internal connection terminals 102 are exposed from the insulating layer 103. The insulating layer 103 is polished so that the upper surface 103A of the insulating layer 103 becomes substantially the same as the upper surface 102A of the internal connection terminal 102. With this, the upper surface of the structural body, specifically the upper surface 103A of the insulating layer 103 and the upper surfaces 102 of the internal connection terminals 102 illustrated in FIG. 7, becomes flat.

Referring to FIG. 8, the interconnection 104 is formed on the flattened upper surface of the structural body illustrated in FIG. 7. Specifically, the interconnections 104 may be formed by attaching a metallic foil (not illustrated) to the structural body, coating a resist on the metallic foil to cover the metallic foil, and exposing the resist to light and developing to form a resist film (not illustrated) on the metallic foil at a portion corresponding to forming regions for the interconnections 104. Thereafter, the metallic foil is etched using the resist film as a mask to form the interconnection 104 as a subtractive method. Thereafter, the resist film is removed.

In the process illustrated in FIG. 9, the solder resist 106 is formed on the insulating layer 103 to cover the interconnections 104 other than the regions 104A for externally connecting pads 107. In the process illustrated in FIG. 10, the semiconductor substrate 110 is polished from the back side of the semiconductor substrate 110 to thin the semiconductor substrate 110. In the process illustrated in FIG. 11, the externally connecting pads 107 are formed on the regions for externally connecting pad 104A. The material of the externally connecting pads 107 may be an alloy containing Pb, an alloy containing Sn and Cu, an alloy containing Sn and Ag, an alloy containing Sn, Ag, and Cu, or the like. Thereafter, by cutting the semiconductor substrate 110 at a portion corresponding to the cutting position C, plural semiconductor devices 100 can be manufactured.

In the above manufacturing processes, inferior semiconductor chips may be packaged. When the inferior semiconductor chips are packaged, there occurs a drop of yield in the semiconductor chips, the manufacturing cost increases, and the price reduction cannot be realized. One reason why the semiconductor chips manufactured are inferior may be peeling-off of the insulating layer from the semiconductor chip 101. This peeling-off of the insulating layer 103 is caused by insufficient adhesiveness contact between the protection layer 113 of the semiconductor chip 101 and the insulating layer 103 formed on the protection layer 113. This peeling-off has been a problem.

[Patent Document 1] Japanese Patent No. 3313547
[Patent Document 2] Japanese Patent No. 3614828
[Patent Document 3] Japanese Patent No. 3614829

SUMMARY OF THE INVENTION

Accordingly, embodiments of the present invention may provide a novel and useful semiconductor device having a semiconductor chip on which interconnections are formed and a method of manufacturing the semiconductor device solving one or more of the problems discussed above by improving the adhesiveness contact between the semiconductor chip and the insulating layer and preventing the insulating layer from peeling off from the semiconductor chip.

More specifically, the embodiments of the present invention may provide a semiconductor device that includes a semiconductor chip having an electrode pad on a circuit forming face of the semiconductor chip, an internal connection terminal formed on the electrode pad, a stepped portion formed along an outer edge portion of the circuit forming face of the semiconductor chip, a first insulating layer formed on the circuit forming face of the semiconductor chip to cover at least the stepped portion, a second insulating layer formed on the circuit forming face of the semiconductor chip to cover the first insulating layer, and an interconnection formed on the second insulating layer and electrically connected to the electrode pad via the internal connection terminal.

Another aspect of the present invention may be to provide a manufacturing method of a semiconductor device including forming a groove in a scribe region included in a semiconductor substrate which includes a semiconductor chip having an electrode pad on a circuit forming face of the semiconductor chip and the scribe region positioned next to the semiconductor chip, forming a first insulating layer on the circuit forming face of the semiconductor chip to cover at least the groove, forming an internal connection terminal on the electrode pad of the semiconductor chip, forming a second insulating layer over the circuit forming face of the semiconductor chip to cover the first insulating layer and the internal connection terminal, making a part of the internal connection terminal exposed from an upper surface of the second insulating layer and roughening the upper surface of the second insulating layer, and forming an interconnection electrically connected to the internal connection terminal on the upper surface of the second insulating layer.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 12 through FIG. 42 of the embodiments of the present invention.

In the embodiments, reference symbols typically designate as follows:

10, 40, 50: Semiconductor device;
11: Semiconductor chip;
12: Internal connection terminal;
12A, 26A, 27A, 29A, 39A: Upper surface;
14, 41: Interconnection;
14A, 41A: Region for externally connecting pad;
16: Solder resist;
17: Externally connecting pad;
21, 31: Semiconductor substrate;
22: Semiconductor integrated circuit;
23: Electrode pad;
24: Protection layer;
26: First metallic layer;
27: Second metallic layer;
28, 35, 42: Resist film;
29: Ti film or Cr film constituting first metallic layer 26;
30: Cu film constituting first metallic layer 26;
36: Groove;
36X: Stepped portion;
37: Screen mask;
38: First insulating layer;
39: Second insulating layer;
42A: Opening portion;
43: Third metallic layer;
A: Semiconductor device forming region;
B: Scribe region;
C: Cutting position;
$T_1, T_2, T_3, T_4, T_5, T_6, T_7, T_8$: Thickness; and
$H_1$: Height.

Embodiment 1

Figure 1:
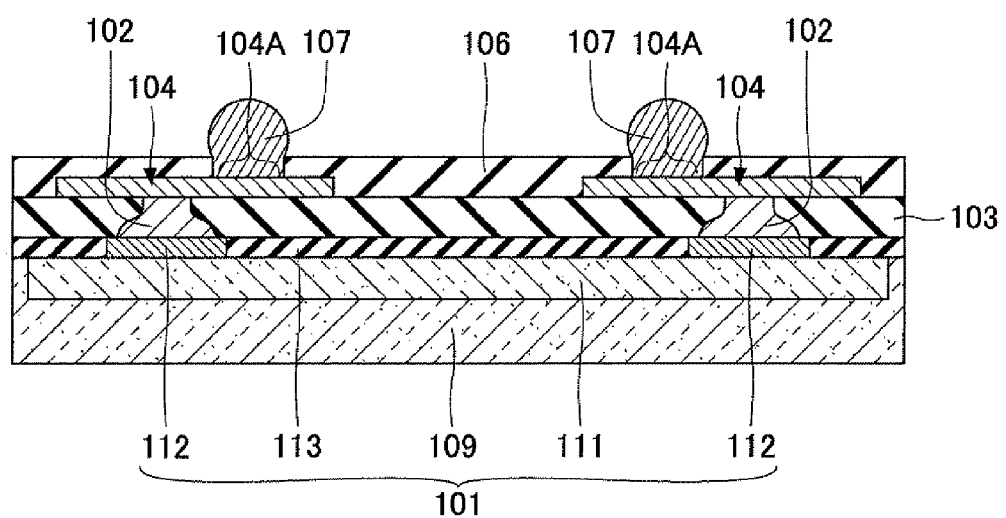
FIG. 1 is a cross-sectional view of an example of the semiconductor device.
Figure 2:
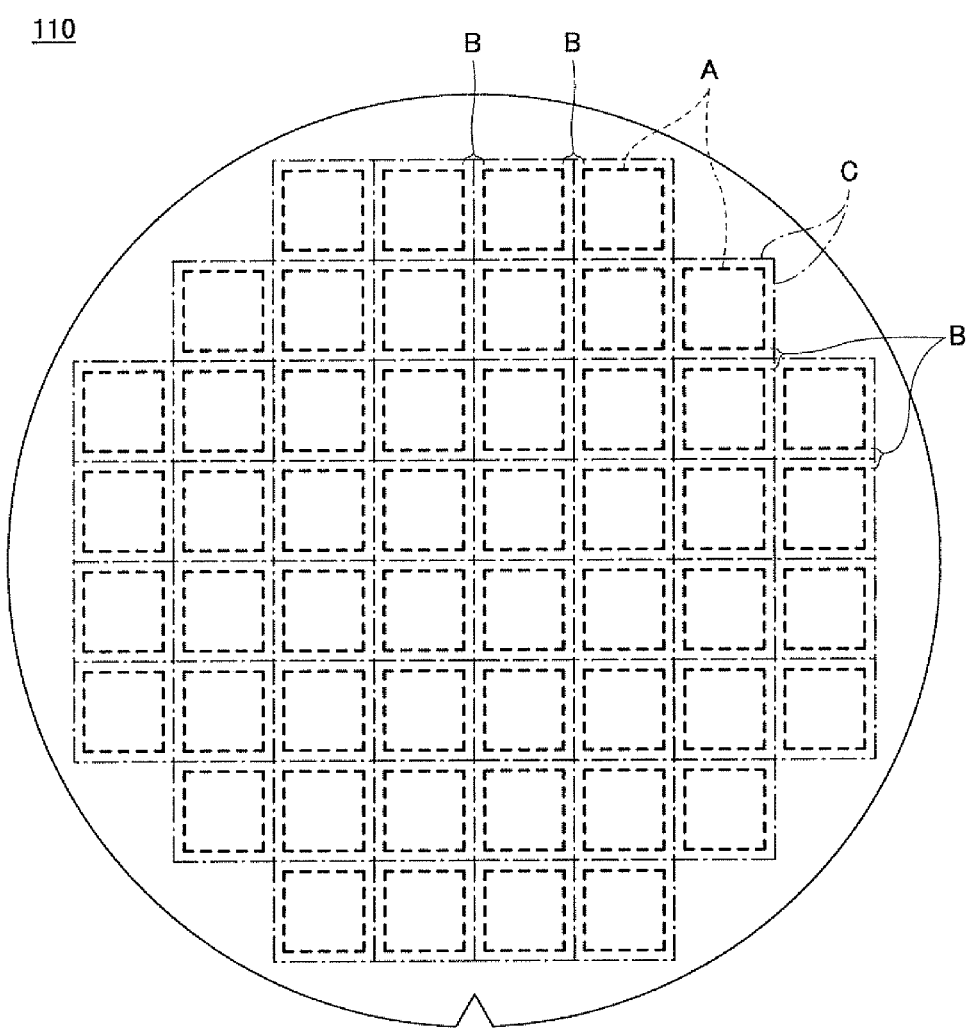
FIG. 2 is a plan view of a semiconductor substrate on which the example semiconductor device of FIG. 1 is formed.
Figure 3:
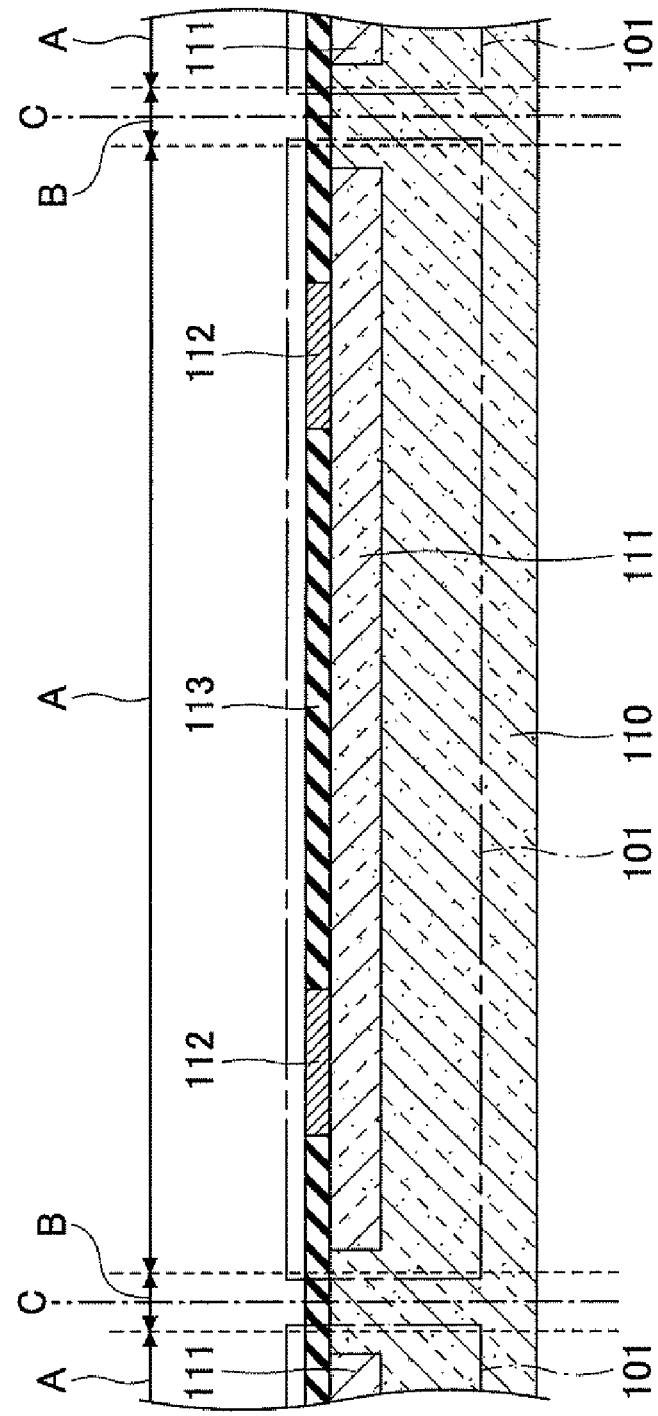
FIG. 3 illustrates the first process of the manufacturing method of the example semiconductor device illustrated in FIG. 1.
Figure 4:
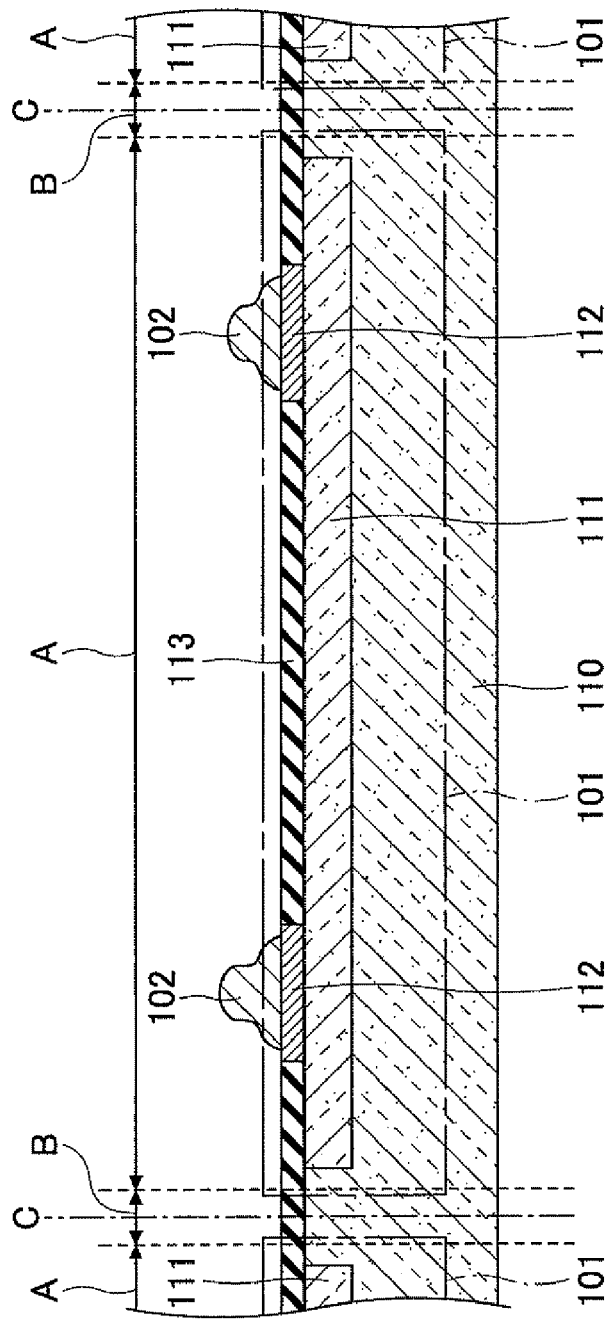
FIG. 4 illustrates the second process of the manufacturing method of the example semiconductor device illustrated in FIG. 1.
Figure 5:
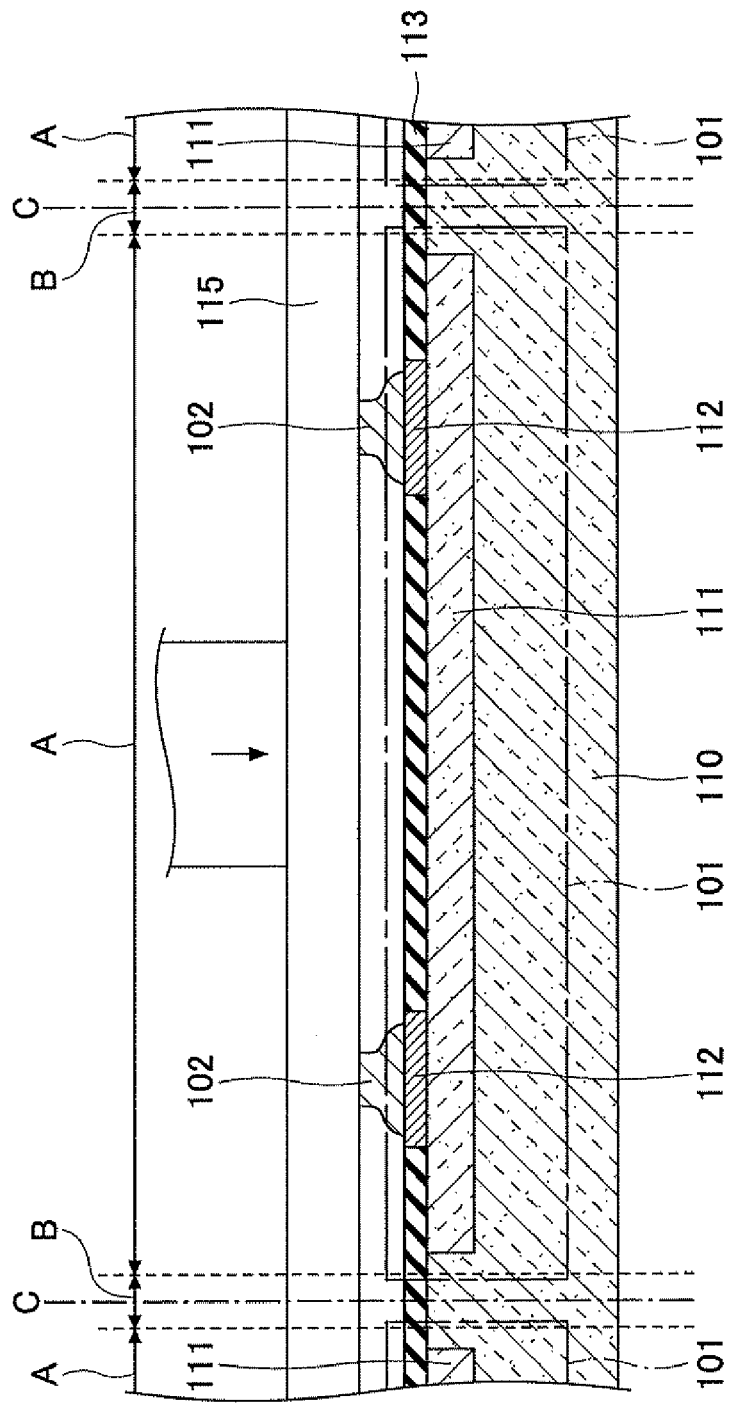
FIG. 5 illustrates the third process of the manufacturing method of the example semiconductor device illustrated in FIG. 1.
Figure 6:
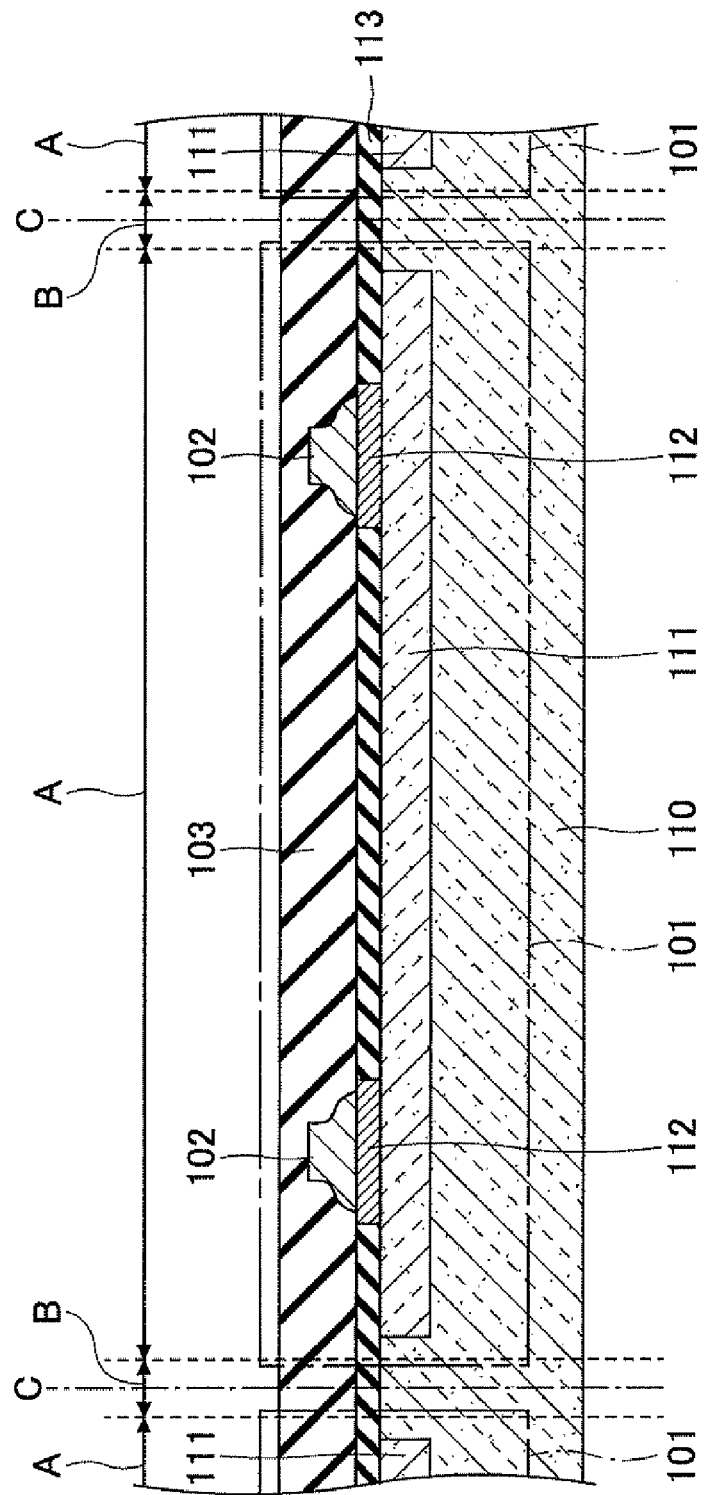
FIG. 6 illustrates the fourth process of the manufacturing method of the example semiconductor device illustrated in FIG. 1.
Figure 7:
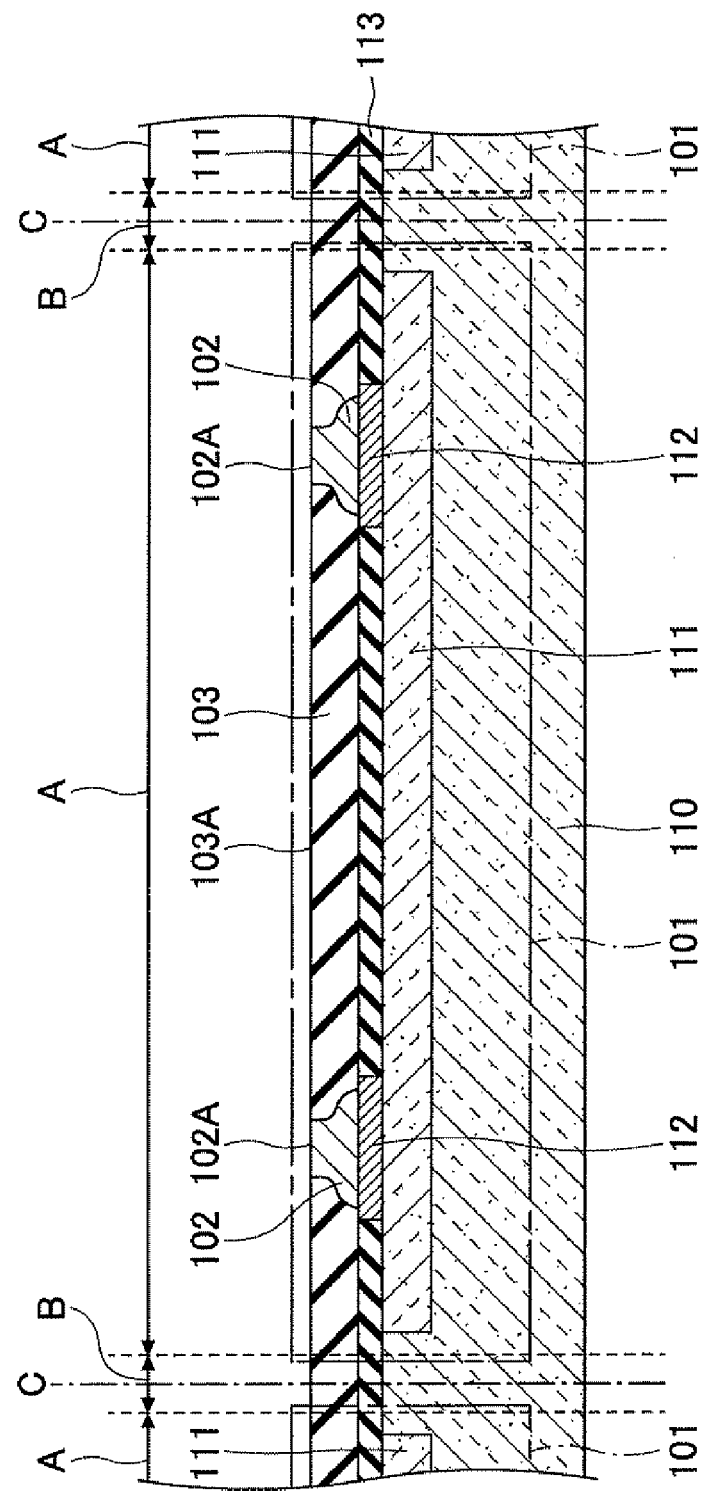
FIG. 7 illustrates the fifth process of the manufacturing method of the example semiconductor device illustrated in FIG. 1.
Figure 8:
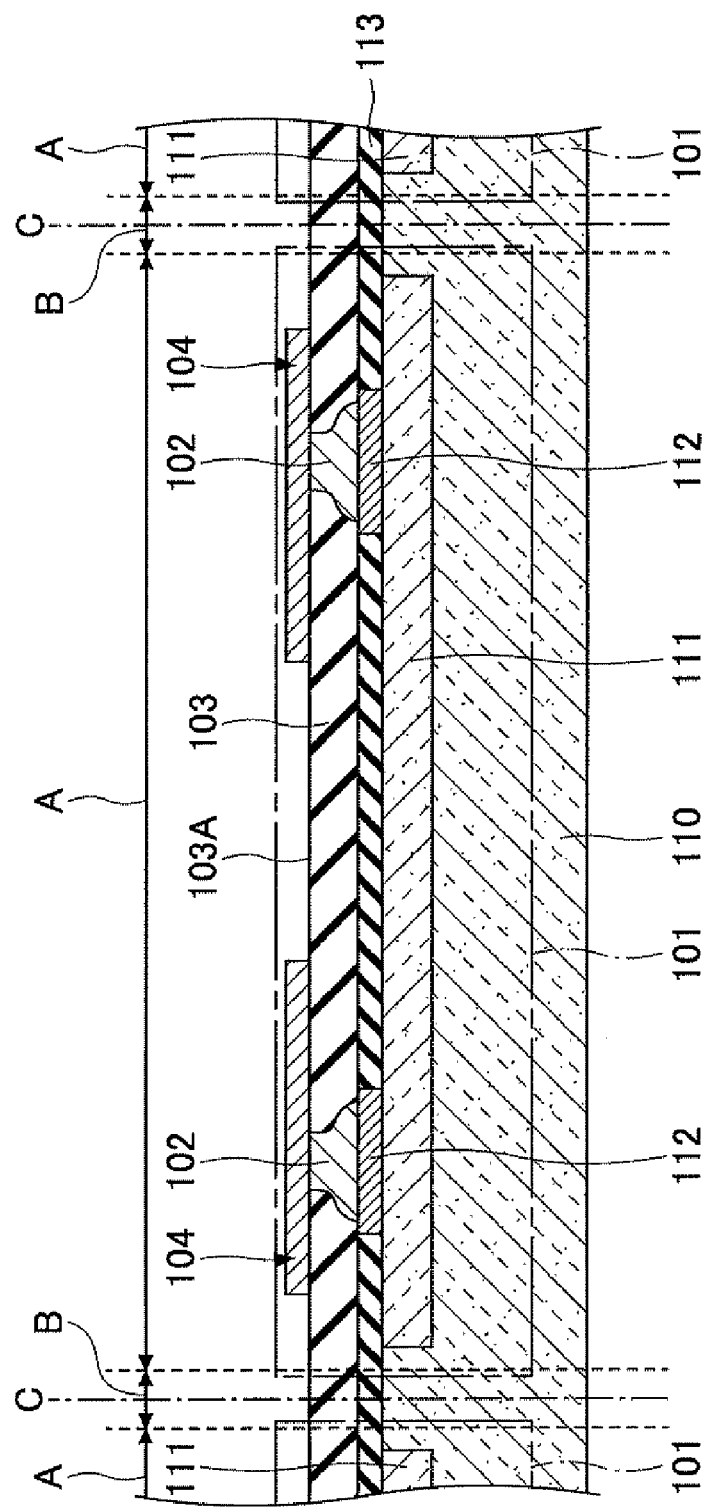
FIG. 8 illustrates the sixth process of the manufacturing method of the example semiconductor device illustrated in FIG. 1.
Figure 9:
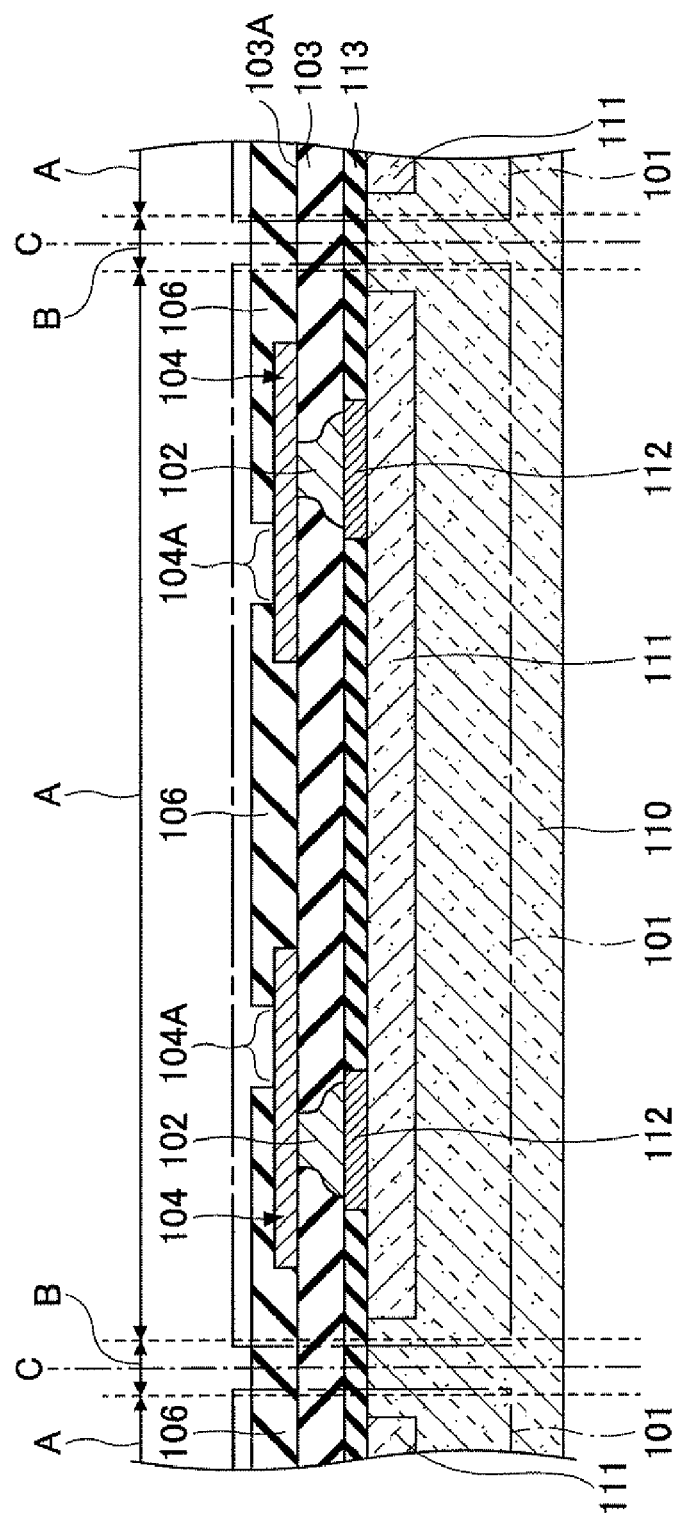
FIG. 9 illustrates the seventh process of the manufacturing method of the example semiconductor device illustrated in FIG. 1.
Figure 10:
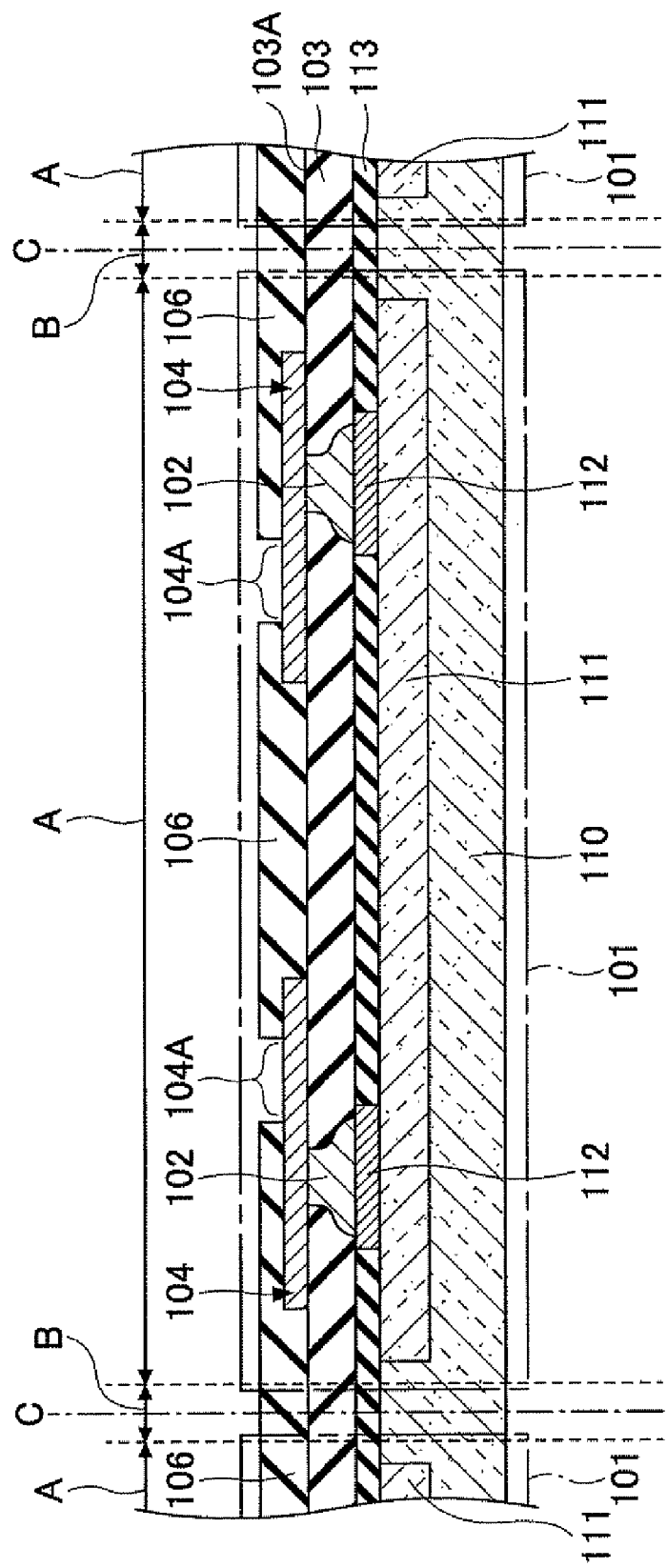
FIG. 10 illustrates the eighth process of the manufacturing method of the example semiconductor device illustrated in FIG. 1.
Figure 11:
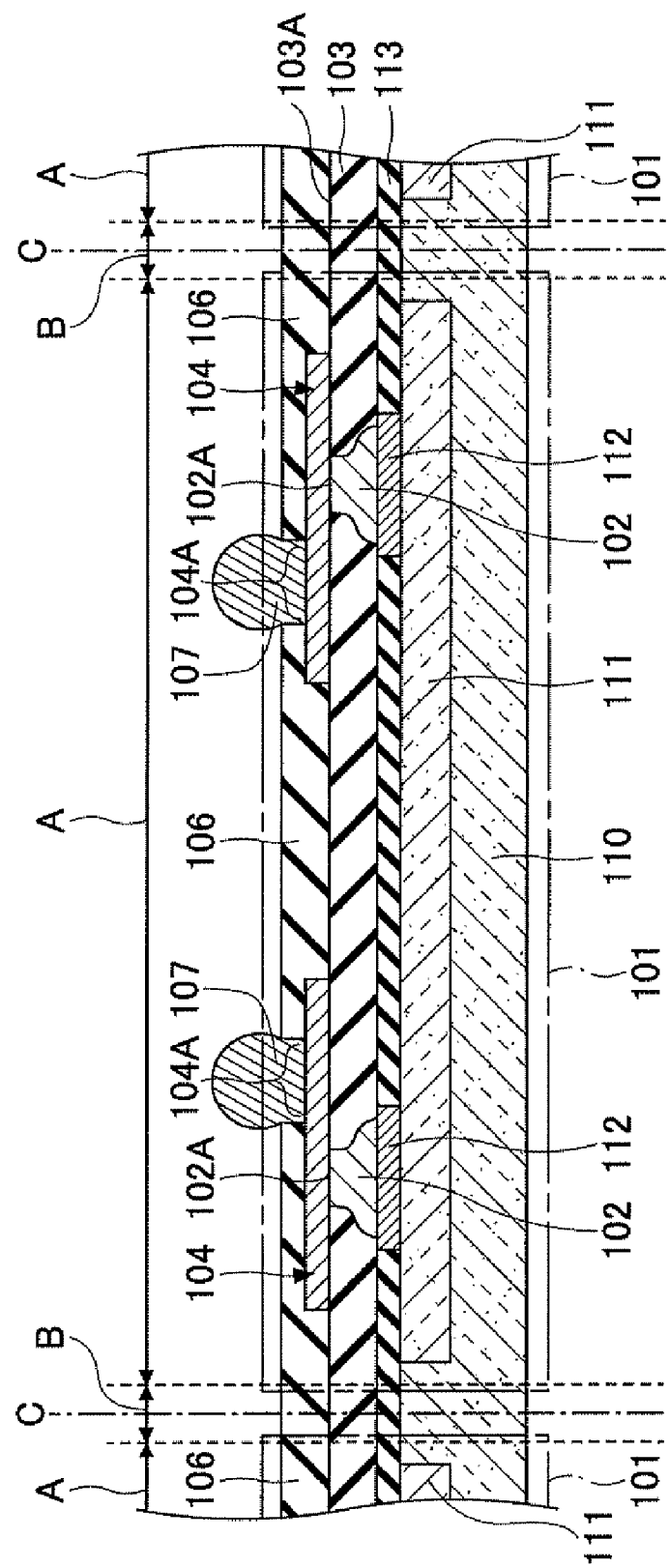
FIG. 11 illustrates the ninth process of the manufacturing method of the example semiconductor device illustrated in FIG. 1.
Figure 12:
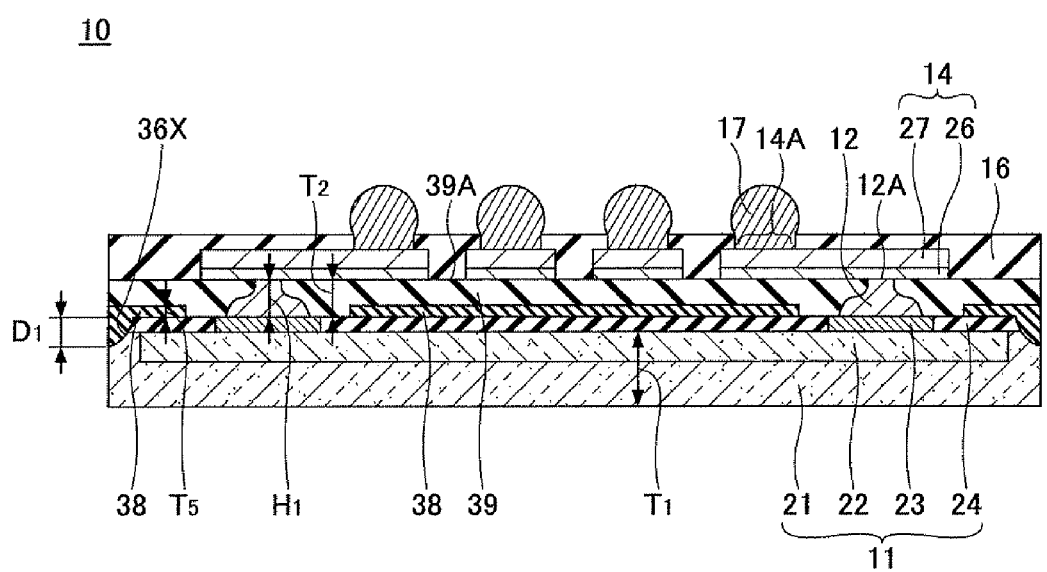
FIG. 12 is a cross-sectional view of a semiconductor device of Embodiment 1.

FIG. 12 is a cross-sectional view of a semiconductor device of Embodiment 1. Referring to FIG. 12, the semiconductor device 10 includes a semiconductor chip 11, an internal connection terminal 12, a stepped portion 36X, a first insulating layer 38, a second insulating layer 39, an interconnection 14a including a first metallic layer 26 and a second metallic layer 27, a solder resist 16, and an externally connecting pad 17.

Figure 13:
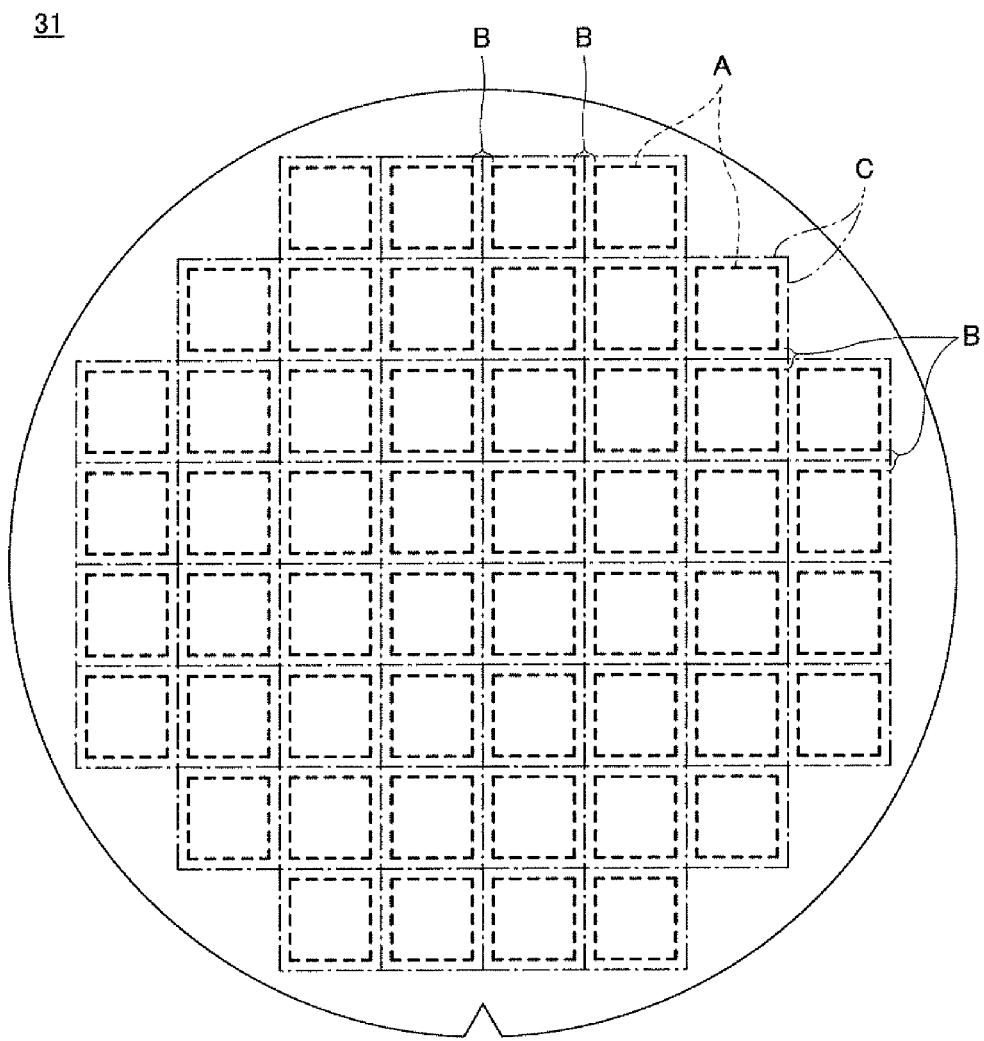
FIG. 13 is a plan view of the semiconductor device of Embodiment 1.

FIG. 13 is a plan view of a semiconductor substrate on which the semiconductor device of Embodiment 1 is formed. Referring to FIG. 13, reference symbol 31 designates a semiconductor substrate, and reference symbol C designates a position at which a dicer cuts the semiconductor substrate (hereinafter, referred to as cutting position C), wherein the semiconductor substrate 31 includes plural semiconductor device forming regions A and scribe regions B including the cutting positions C which separates the semiconductor device forming regions A. The semiconductor devices 10 are formed on the plural semiconductor device forming regions A. The semiconductor substrates 31 are thinned and cut at the cutting positions C. The semiconductor substrate 31 becomes the semiconductor substrates 21.

The semiconductor chip 11 includes a semiconductor substrate 21, a semiconductor element 22, plural electrode pads 23, and a protection film 24. The semiconductor substrates 21 are used to form semiconductor integrated circuits 22 on these. The semiconductor substrate 21 is thinned. The thickness $T_1$ including the thickness of the semiconductor integrated circuit 22 of the semiconductor substrate 21 may be 50 through 500 μm. The semiconductor substrate 21 may be obtained by taking apart a thinned Si wafer into pieces.

The semiconductor integrated circuit 22 is provided on a surface side of the semiconductor substrate 21. The semiconductor integrated circuit 22 includes a diffusion layer (not illustrated) formed on the semiconductor substrate 21, an insulating layer (not illustrated) laminated on the semiconductor substrate 21, via holes (not illustrated) provided in the laminated insulating layer, and an interconnections (not illustrated). Hereinafter, the face of the semiconductor chip 11 on which the semiconductor integrated circuit 22 is formed is referred to as a circuit forming face.

The plural electrode pads 23 are provided on the semiconductor integrated circuits 22. The plural electrode pads 23 are electrically connected to interconnections (not illustrated) provided on the semiconductor integrated circuit 22. The material of the electrode pads 23 may be Al. The material of the electrode pad 23 may be an Al layer formed on a Cu layer, an Al layer formed on a Si layer formed on a CU layer, or the like.

The protection layer 24 may be provided on the surface of the semiconductor substrate 21 and the surface of the semiconductor integrated circuit 22. The protection layer 24 is a film for protecting the semiconductor integrated circuit 22. This may be called as a passivation film. The protection film 24 may be a SiN film, a PSG film, or the like. A layer made of polyimide may be further laminated on the layer made of the SiN film, the PSG film, or the like.

The internal connection terminal 12 is provided on the electrode pad 23 of the semiconductor chip 11. The internal connection terminals 12 are provided to connect the semiconductor integrated circuit 22 of the semiconductor chip 11 with the interconnections 14. The height $H_1$ of the internal connection terminal 12 may be 20 through 50 μm. The internal connection terminal 12 may be an Au bump, a Cu bump, an Au plating film, a metallic film including an Ni film covered by an Au film formed by an electrolytic plating method, or the like. The Au bump and the Cu bump may be formed by a bonding wire using a wire bonding device. The Au bump and the Cu bump may also be formed by a plating method.

The stepped portion 36X is formed at an outer edge portion of the semiconductor chip 11. For example, when the semiconductor chip is shaped like a rectangle in a plan view, the stepped portion 36X is shaped like a casting trim. The width of the stepped portion 36X is approximately half of the width of the scribe region B, for example, 30 through 200 μm. The depth $D_1$ of the stepped portion 36X may be about 5 through 30 μm. The surface of the stepped portion 36X is finely roughened to have minute projections and dents.

The first insulating layer 38 is formed to position at a region where the stepped portion 36X is formed and a region immediately below a portion where the externally connecting pad 17 is formed. The first insulating layer 38 is not positioned at a region where the electrode pad 23 is formed. The thickness $T_5$ of the first insulating layer 38 may be 10 μm. The material of the first insulating layer 38 is a paste like insulating resin (for example, non conductive resin (NCR)), a paste-like anisotropic conductive resin (ACP), or the like.

Figure 22:
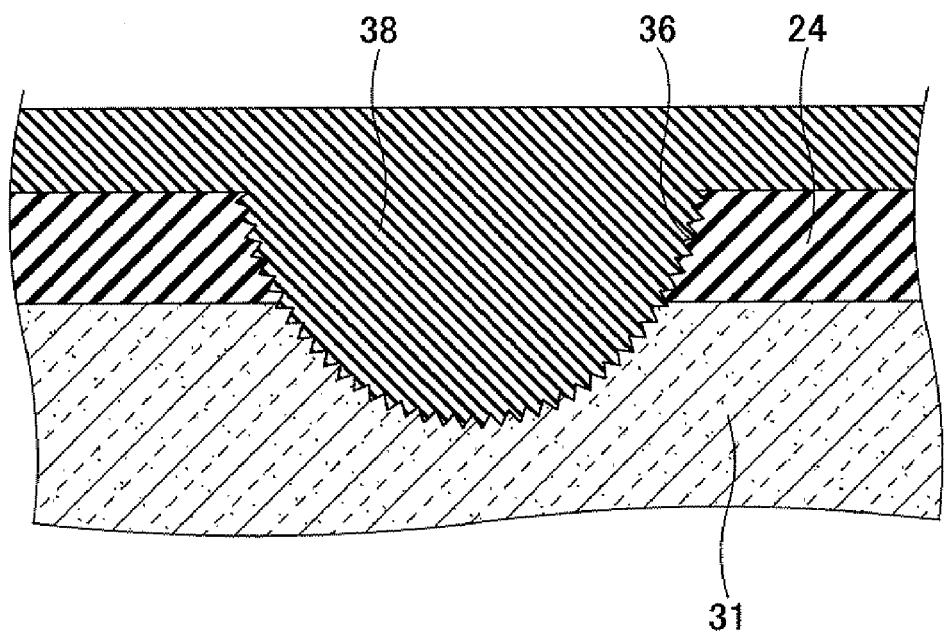
FIG. 22 illustrates the ninth manufacturing process in the manufacturing method of the semiconductor device of Embodiment 1.

Since the surface of the stepped portion 36X is finely roughened (not illustrated), the first insulating layer 38 digs into the finely roughened face, i.e. minute projections and dents, of the stepped portion 36X as illustrated in FIG. 22. An anchor effect is caused between the first insulating layer 38 and the stepped portion 36X. By providing the stepped portion 36X having the finely roughened face, i.e. minute projections and dents, the anchor effect caused between the first insulating layer 38 and the stepped portion 36X enhances the adhesiveness contact between the first insulating layer 38 and the stepped portion 36X to thereby prevent the first insulating layer 38 from peeling off from the stepped portion 36X of the semiconductor chip 11.

The first insulating layer 38 is preferably formed to contain a material of shielding alpha rays. By forming the first insulating layer 38 so that the first insulating layer 38 contains the material shielding alpha rays, it is possible to reduce the amount of alpha rays reaching the semiconductor substrate 21 from the outside or alpha rays generated in the externally connecting pads 17 or the like. Thus, it becomes possible to prevent erroneous operation of the semiconductor device 10 such as a soft error. Since it is an object to shield alpha rays, any material may be used as long as alpha rays are shielded. It is possible to effectively shield alpha rays using a material obtained by adding polyimide or a polyimide compound such as a modified polyimide to the paste-like insulating resin or the paste-like anisotropic conductive resin.

For example, it is preferable to use a black paste-like insulating resin or a black paste-like anisotropic conductive resin containing carbon black being a black colored material or a black organic colorant. This is in addition to the material shielding alpha rays such as a modified polyimide as the first insulating layer 38.

For example, the first insulating layer 38 black-colored by containing the black material such as carbon black, the black organic colorant, or the like in addition to the material shielding alpha rays such as modified polyimide, has a property of shielding alpha rays, visible rays, and ultraviolet rays. By shielding visible rays and ultraviolet rays, it is possible to prevent erroneous operations caused by a photoelectromotive force which is generated by irradiating visible rays or ultraviolet rays from occurring.

The carbon black includes carbon hydride and an aggregation of crystallites obtained by burning or thermally decomposing a compound containing carbon. Examples of the carbon black are channel black, roller black, oil furnace black, gas furnace black, acetylene black, fine thermal black, medium thermal black, lamp black, bone black, soot of burnt pine, soot of burnt oil, and vegetable black. When the carbon black is added to the insulating resin, it may be used in a powdered state, a slurry state, or a paste state.

The organic colorant is a generic name of pigments made of organic pigments. In comparison with the inorganic colorant, the organic colorant ordinarily has a large coloring power and various color phases. The organic colorant includes various organic colorants having various chemical structures such as an azo pigment and anthraquinone series. It is preferable to use the black organic colorant in Embodiment 1.

The first insulating layer 38 may contain an inorganic filler such as a spherical silica ($SiO_2$) in order to lower a coefficient of thermal expansion. However, an infinitesimal quantity of a radioactive ingredient such as uranium (U) and thorium (Th) is contained in the inorganic filler. Alpha rays may be generated from the radioactive ingredient such as uranium (U) and thorium (Th). Therefore, from a stand point of reducing alpha rays, it is preferable that the inorganic filler is not contained in the first insulating layer 38.

It is preferable that the detectable amount of alpha rays in the first insulating layer 38 is 0.0015 count/$cm^2$·h or less. Even though alpha rays, visible rays, or ultraviolet rays irradiated from the outside, i.e. the side of the externally connecting pad, are decreased, alpha rays may be generated in the first insulating layer 38 because the amount of alpha rays contained in the first insulating layer 38 is great. In this case, it is impossible to reduce an incidence rate of so-called "soft error". The detectable amount of alpha rays from the first insulating layer 38 is obtained by measuring the amount of alpha rays irradiated from the first insulating layer 38. The detectable amount of alpha rays from the first insulating layer 38 may become 0.0015 count/$cm^2$·h or less by adjusting the amount of the inorganic filler contained in the first insulating layer 38. It is empirically known that the incidence rate of soft error caused by alpha rays is drastically reduced if the detectable amount of alpha rays from the first insulating layer 38 is 0.0015 count/$cm^2$·h or less.

It is preferable to make the amounts of $Cl^-$ and $Na^+$ being ionic impurities, which are contained in the first insulating layer 38, 10 ppm or less each. It is preferable to make the amounts of $NH_4^+$ being ionic impurities, which are contained in the first insulating layer 38, 50 ppm or less. These amounts are determined to prevent the electrode pads 23 which may be made of Al from decaying. The amounts of the ionic impurities may be measured by extracting the ionic impurities with hot liquid under, for example, 121 degrees C./20 hours and analyzing the liquid with ion chromatography.

The second insulating layer 39 is formed on a circuit forming face of the semiconductor chip 11 so as to cover the first insulating layer 38. However, an upper surface 12A of the internal connection terminal 12 is exposed from an upper surface 39A of the second insulating layer 39. The upper surface 39A of the second insulating layer 39 and the upper surface 12 of the internal connection terminal 12 are arranged on substantially the same plane. The first insulating layer 38 and the second insulating layer 39 seals and protects the circuit forming face of the semiconductor chip 11 and are provided to serve as a base member when the interconnection 14 is formed.

The thickness $T_2$ of all over the first insulating layer 38 and the second insulating layer 39 may be 20 through 50 μm. The material of the second insulating layer 39 may be a sheet-like insulating resin such as a non conductive film (NCF) of B-stage having adhesiveness (partially-hydrogenated state), a paste-like insulating resin such as a non conductive paste (NCP), a sheet-like anisotropic conductive resin such as anisotropic conductive film (ACF) having adhesiveness, a paste-like anisotropic conductive resin such as anisotropic conductive paste (ACP), a build-up resin (epoxy resin containing inorganic filler or epoxy resin without containing inorganic filler), a liquid crystal polymer, or the like. ACP and ACF are formed by dispersing small spherically shaped resins obtained by coating an insulating resin basically made of an epoxy resin or a cyanate ester series resin with at least one of Ni/Au. ACP and ACF have conductivity in a vertical (perpendicular) direction and insulation property in a horizontal (parallel) direction.

By forming the first insulating layer 39 so that the first insulating layer contains the material shielding alpha rays, it is possible to reduce the amount of alpha rays reaching the semiconductor substrate 21 from the outside or alpha rays generated in the externally connecting pads 17 or the like. Thus, it becomes possible to prevent erroneous operation of the semiconductor device 10 such as so-called "soft error". Since it is an object to shield alpha rays, any material may be used as long as alpha rays can be shielded. It is possible to effectively shield alpha rays using a material obtained by adding polyimide or a polyimide compound such as a modified polyimide to a sheet-like insulating resin of B-stage (partially-hydrogenated state), a sheet-like anisotropic conductive resin, a paste-like insulating resin or a paste-like anisotropic conductive resin.

For example, it is preferable to use a sheet-like insulating resin of B-stage (partially-hydrogenated state), a sheet-like anisotropic conductive resin, a paste-like insulating resin, and a paste-like anisotropic conductive resin, which are black-colored by containing carbon black being a black colored material or a black organic colorant, in addition to the material shielding alpha rays such as a modified polyimide as the second insulating layer 39.

For example, the second insulating layer 39 black-colored by containing the black material such as carbon black, the black organic colorant, or the like in addition to the material shielding alpha rays such as modified polyimide has a property of shielding alpha rays, visible rays, and ultraviolet rays. By shielding visible rays and ultraviolet rays, it is possible to prevent erroneous operations from occurring, which are caused by a photoelectromotive force which is generated by irradiating visible rays or ultraviolet rays from occurring. As an example, when the thickness $T_2$ all over the first insulating layer 38 and the second insulating layer 39 is 30 μm and the additive amount of carbon black is 0.5 through 1.0 wt %, visible rays and ultraviolet rays are shielded.

The second insulating layer 39 may contain an inorganic filler such as a spherical silica ($SiO_2$) in order to lower a coefficient of thermal expansion. An infinitesimal quantity of radioactive ingredients such as uranium (U) and thorium (Th) may be contained in the inorganic filler. Therefore, alpha rays may be generated from radioactive ingredients such as uranium (U) and thorium (Th) contained in the inorganic filler.

It is preferable that the detectable amount of alpha rays in the second insulating layer 39 is 0.0015 count/$cm^2$·h or less. Even though alpha rays, visible rays, or ultraviolet rays irradiated from the outside, i.e. the side of the externally connecting pad 17, are decreased, alpha rays may be generated in the second insulating layer 39 because the amount of alpha rays contained in the second insulating layer 39 is great. In this case, it is impossible to reduce an incidence rate of so-called "soft error". Even though alpha rays, visible rays, or ultraviolet rays irradiated from the outside, i.e. the side of the externally connecting pad 17, are decreased, alpha rays may be generated in the second insulating layer 39 because the amount of alpha rays contained in the second insulating layer 39 is great. In this case, it is impossible to reduce an incidence rate of so-called "soft error". The detectable amount of alpha rays from the second insulating layer 39 is obtained by measuring the amount of alpha rays irradiated from the second insulating layer 39. The detectable amount of alpha rays from the second insulating layer 39 may become 0.0015 count/cm$^2$·h or less by adjusting the amount of the inorganic filler contained in the second insulating layer 39. It is empirically known that the incidence rate of soft error caused by alpha rays is drastically reduced if the detectable amount of alpha rays from the second insulating layer 39 is 0.0015 count/cm$^2$·h or less.

It is preferable to make the amounts of Cl$^-$ and Na$^+$ being ionic impurities, which are contained in the second insulating layer 39, 10 ppm each. It is preferable to make the amounts of NH$_4^+$ being ionic impurities, which are contained in the second insulating layer 39, 50 ppm or less. These amounts are determined to prevent the electrode pads 23 which may be made of Al from decaying. The amounts of the ionic impurities may be measured by extracting the ionic impurities with hot liquid under, for example, 121 degrees C./20 hours and analyzing with ion chromatography.

As described, the first insulating layer 38 and the second insulating layer 39 may contain the inorganic fillers. However, from a viewpoint of reducing alpha rays, the first insulating layer 38 may not contain the inorganic filler. It is preferable to reduce the amount of the inorganic filler in the first insulating layer 38 less than the amount of the inorganic filler in the second insulating layer 39. Further, the amount of the material such as modified polyimide for shielding alpha rays in the first insulating layer 38 is preferably greater than the amount of the material such as modified polyimide for shielding alpha rays in the second insulating layer 39. By increasing the material for shielding alpha rays in the first insulating layer 38 which is positioned closer to the semiconductor substrate 21 in comparison with that in the second insulating layer 39, the amount of alpha rays can be reduced to an amount as small as possible.

The contained amount of the inorganic filler in the first insulating layer 38 may be 0 through 20 wt %, which is a weight or mass ratio of the inorganic filler with respect to the weight or mass of the first insulating layer 38. The contained amount of the inorganic filler in the second insulating layer 39 may be 30 through 50 wt %, which is a weight or mass ratio of the inorganic filler with respect to the weight or mass of the second insulating layer 39. The amounts of the inorganic fillers in the first insulating layer 38 and the second insulating layer 39 cannot be simultaneously nulled in order to reduce a coefficient of thermal expansion of the semiconductor device 10 and to reduce deflection of a Si wafer caused by unmatched coefficients of thermal expansion between Si and the Si wafer. However, it is possible to null the amount of the inorganic filler contained in the first insulating layer 38. With this, the amount of alpha rays reaching the semiconductor substrate 21 can be drastically reduced. The purpose of reducing the coefficient of thermal expansion of the semiconductor device 10 may be achieved by the inorganic filler contained in the second insulating layer 39.

The internal connection terminals 12 are covered by only the second insulating layer 39 and are not covered by first insulating layer 38. With this structure, it is possible to prevent a local stress from being applied to the internal connection terminal 12 and to prevent cracks from occurring. When the internal connection terminal 12 is in contact with two or more insulating layers, cracks may occur in the internal connection terminal 12 due to the local stress applied at a portion, at which the internal connection terminal 12 is in contact with two or more insulating layers, by a temperature change or the like and differences of properties such as coefficients of thermal expansion and coefficients of elasticity between the two or more insulating layers. By configuring the internal connection terminal 12 to be in contact with only one insulating layer, it is possible to prevent cracks of the internal connection terminal 12 from occurring.

However, when the cracks of the internal connection terminal 12 are ignored and it is required to prevent peeling off of the first insulating layer 38 from the stepped portion 36X of the semiconductor chip 11, the first insulating layer 38 may be formed in the vicinity of the internal connection terminals 12 and the internal connection terminals 12 may be in contact with the first insulating layer 38 and the second insulating layer 39.

As described, there may be a case where the layer made of polyimide is further laminated on the protection layer 24. In this case, the layer made of polyimide has an effect of shielding alpha rays. In Embodiment 1, when the layer made of polyimide is not laminated, it is possible to shield alpha rays using the first insulating layer 38 and the second insulating layer 39.

The interconnection 14 may be called rewiring which is used to shift a position of the electrode pad 23 from a position of the externally connecting pad 17 in order to achieve fan-in and terminal arrangement to arbitrary positions (so-called pitch conversion). The interconnection 14 is made of the first metallic layer 26 and the second metallic layer 27. The first metallic layer 26 has a laminated structure of a Ti film and a Cu film, a laminated structure of a Cu film and a Cu film, or a singla layered structure of a Cu film. The material of the second metallic layer 27 may be Cu or the like.

The interconnection 14 is provided on the upper surface 39A of the second insulating layer 39 so as to be in contact with the upper surface 12A of the internal connection terminal 12. The interconnections 14 are electrically connected to the semiconductor integrated circuit 22 via the internal connection terminals 12. The interconnection 14 has a region 14A for externally connecting pad, in which the externally connecting pad 17 is provided. The thickness of the interconnection 14 may be 5 through 20 μm.

When the first metallic layer 26 has the laminated structure of the Ti film and the Cu film or the laminated structure of the Cr film and the Cu film, the upper surface 12A of the internal connection terminal 12 exposed from the upper surface 39A of the second insulating layer 39 is connected to the Ti film or the Cr film of the first metallic layer 26 by a metallic bond. When the first metallic layer 26 has the single layered structure of the Cu film, the upper surface 12A of the internal connection terminal 12 exposed from the upper surface 39A of the second insulating layer 39 is connected to the Cu film of the first metallic layer 26 by a metallic bond.

When the first metallic layer 26 has the laminated structure of the Ti film and the Cu film or the laminated structure of the Cr film and the Cu film, the Ti film or the Cr film of the first metallic layer 26 is connected to the Cu film by a metallic bond. By the metallic bond, it becomes possible to firmly join the upper surface 12A of the internal connection terminal 12 to the first metallic layer 26. Thus, it becomes possible to enhance mechanical and electrical connection reliability between the internal connection terminal 12 and the first metallic layer 26.

The solder resist 16 is opened at the region 14A for externally connecting pad in conformity with any or both of solder-mask defined (SMD) and nonsolder-mask defined (NSMD) and at least partially cover the interconnection 14. When the solder resist 16 contains the inorganic filler, since an infinitesimal quantity of a radioactive ingredient such as uranium (U) and thorium (Th) is contained in the inorganic filler, the solder resist 16 may become a source of generating alpha rays.

The semiconductor device 10 of Embodiment 1 uses a fillerless solder resist 16 which does not contain the inorganic filler. As a result, it is possible to cause the amount of alpha rays to be as close to zero as possible. The material of the solder resist 16 may be a resin containing a major component of epoxy, epoxy acrylate, cyanate ester or siloxane which does not contain the inorganic filler.

The externally connecting pads 17 are provided on the regions 14A for externally connecting pad of the interconnections 14. The externally connecting pads 17 are electrically connected to the pads provided in an implementation board (not illustrated) such as a motherboard. The internal connecting pads 17 may be solder bumps. The material of the externally connecting pads 17 may be an alloy containing Pb, an alloy containing Sn and Cu, an alloy containing Sn and Ag, an alloy containing Sn, Ag, and Cu, or the like. The externally connecting pads 17 may also be solder balls (Sn-3.5Ag) using a resin such as divinylbenzene as a core.

The material of the externally connecting pads 17 is preferably a Pd free solder such as Sn-3.5Ag and Sn-3.0Ag-0.5Cu. With a synergetic effect of the first insulating layer 38 and the second insulating layer 39 in which the contained amounts of the inorganic filler are adjusted so that the detectable amounts of alpha rays become 0.0015 count/cm$^2$·h or less, the fillerless solder resist 16 which does not contain the inorganic filler, and the externally connecting pads 17 using the Pb-free solder, it becomes possible to drastically reduce the amount of alpha rays reaching the semiconductor substrate 21.

FIG. 14 through FIG. 36 illustrate the manufacturing method of the semiconductor device of Embodiment 1. Referring to FIG. 14 to FIG. 36, the same reference symbols are attached to portions the same as those of the semiconductor device 10 illustrated in FIG. 12, and description of these portions may be omitted. Referring to FIG. 14 to FIG. 36, reference symbol C (hereinafter, referred to as cutting position C) desigantes a position of the semiconductor substrate 31 at which a dicing blade cuts the semiconductor substrate 31; reference symbol A (hereinafter, referred to as semiconductor device forming region A) designates a semiconductor device forming regions; and reference symbol B (hereinafter, referred to as scribe region B) designates a scribe region which is positioned next to the semiconductor device forming region A or interposed between the semiconductor device forming regions A and includes the cutting position C of the substrate for cutting the semiconductor device forming region A.

Figure 14:
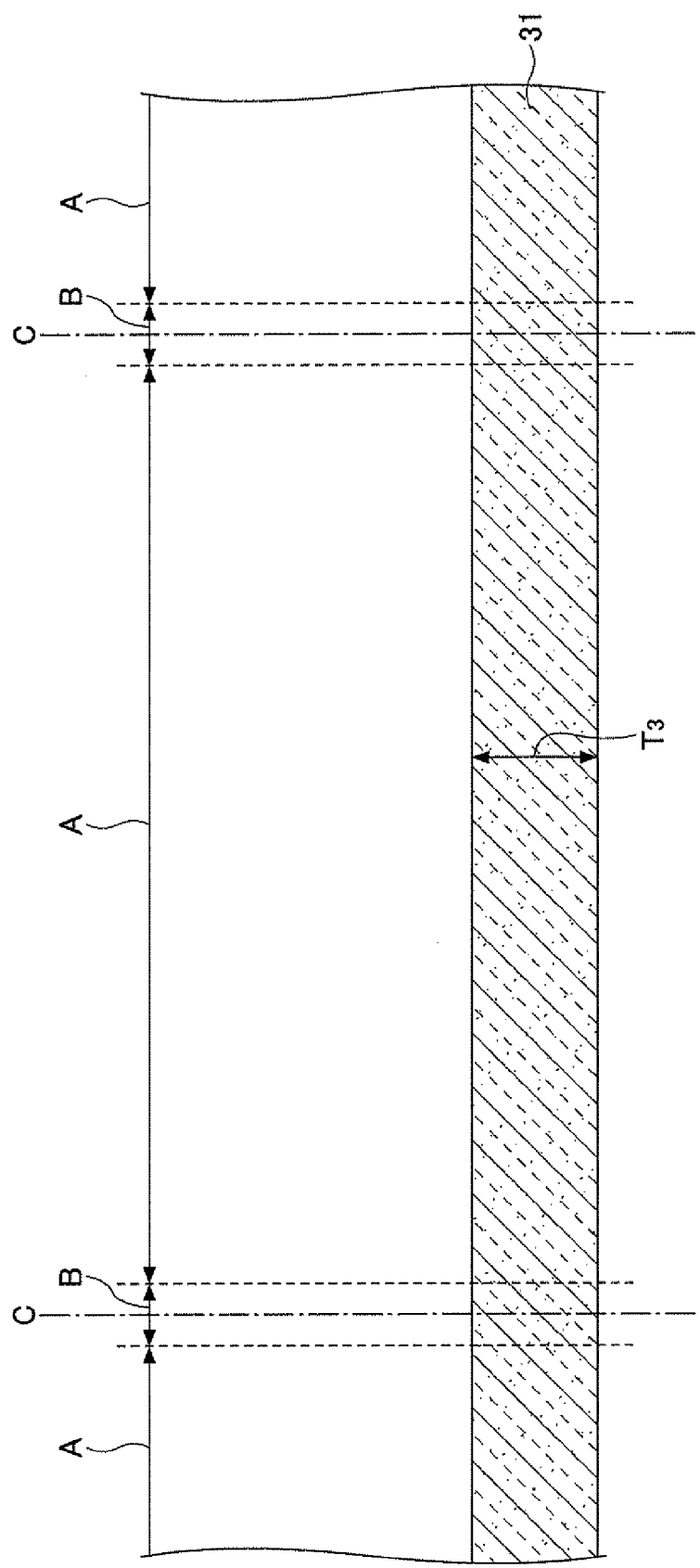
FIG. 14 illustrates the first manufacturing process in a manufacturing method of a semiconductor device of Embodiment 1.

Referring to FIG. 14, the semiconductor substrate 31 having the plural semiconductor device forming regions A and the scribe regions B including the cutting positions C for separating the semiconductor device forming region and the semiconductor device forming region A (see FIG. 13). The semiconductor substrate 31 becomes the semiconductor substrate 21 (see FIG. 12) described above by thinning the semiconductor substrate 31 and cutting the thinned semiconductor substrate 31 at the cutting positions C. It may be possible to use a silicon wafer as the semiconductor substrate 31. The thickness $T_3$ of the semiconductor substrate 31 may be 500 through 775 μm.

Figure 15:
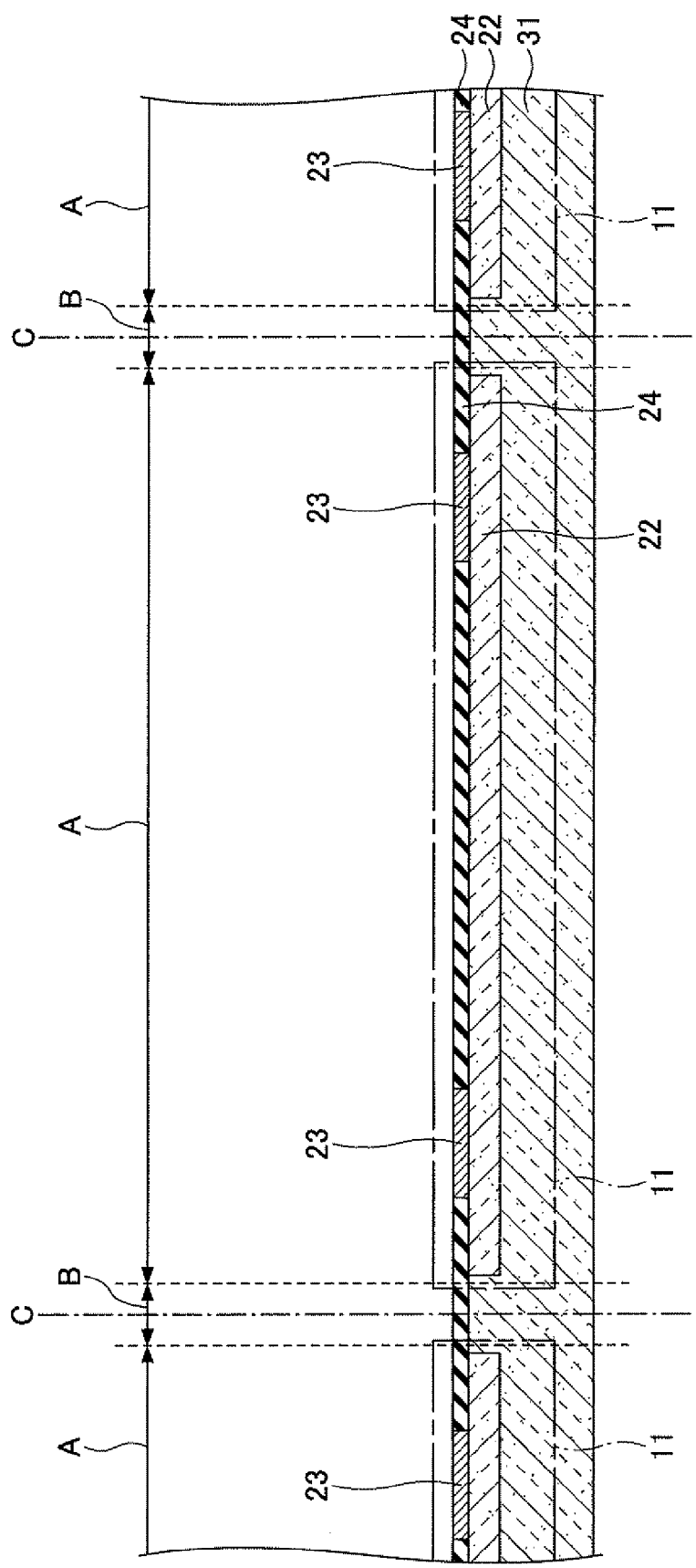
FIG. 15 illustrates the second manufacturing process in the manufacturing method of the semiconductor device of Embodiment 1.

In the process illustrated in FIG. 15, semiconductor integrated circuits 22, electrode pads 23, and semiconductor chips 11 including protection layers 24 are formed on a surface side of the semiconductor substrate 31. The material of the electrode pads 23 may be Al. The material of the electrode pad 23 may be an Al layer formed on a Cu layer, an Al layer formed on an Si layer formed on a CU layer, or the like. The protection film 24 may be a SiN film, a PSG film, or the like. A layer made of polyimide may be further laminated on the layer made of the SiN film, the PSG film, or the like.

Figure 16:
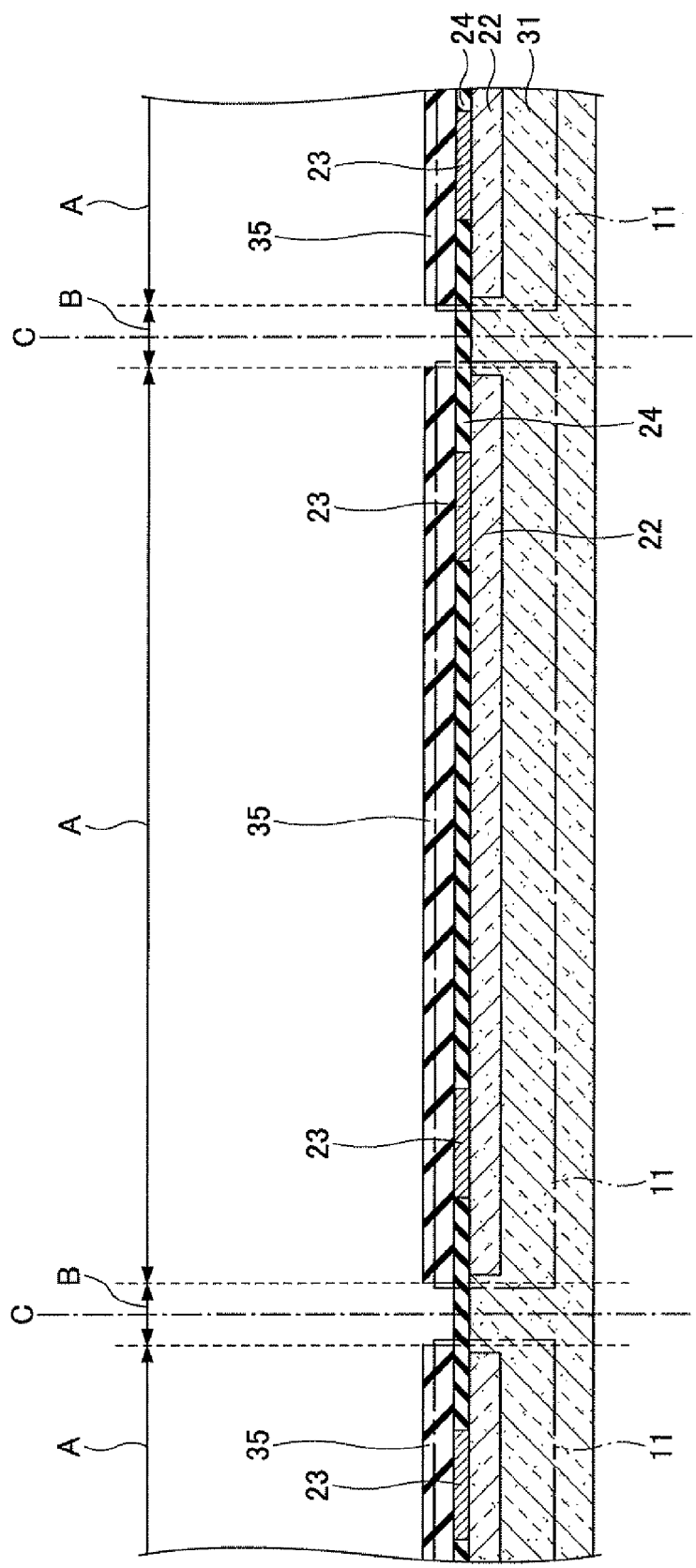
FIG. 16 illustrates the third manufacturing process in the manufacturing method of the semiconductor device of Embodiment 1.

In the process illustrated in FIG. 16, a resist is coated on the electrode pads 23 and the protection layer 24, and the resist is exposed to light to develop the resist. Thus, a resist film 35 is formed on the electrode pad 23 and the protection layer except for the scribe region B. Although the resist film 35 functions as a mask for a blast process to be described in reference to FIG. 17 and FIG. 18, a part of the surface of the resist film 35 is to be trimmed by the blast process. It is necessary to determine the thickness of the resist film 35, which enables demonstration of a function as a mask when a part of the surface of the resist film 35 is trimmed. The thickness of the resist film 35 may be 50 μm.

Figure 17:
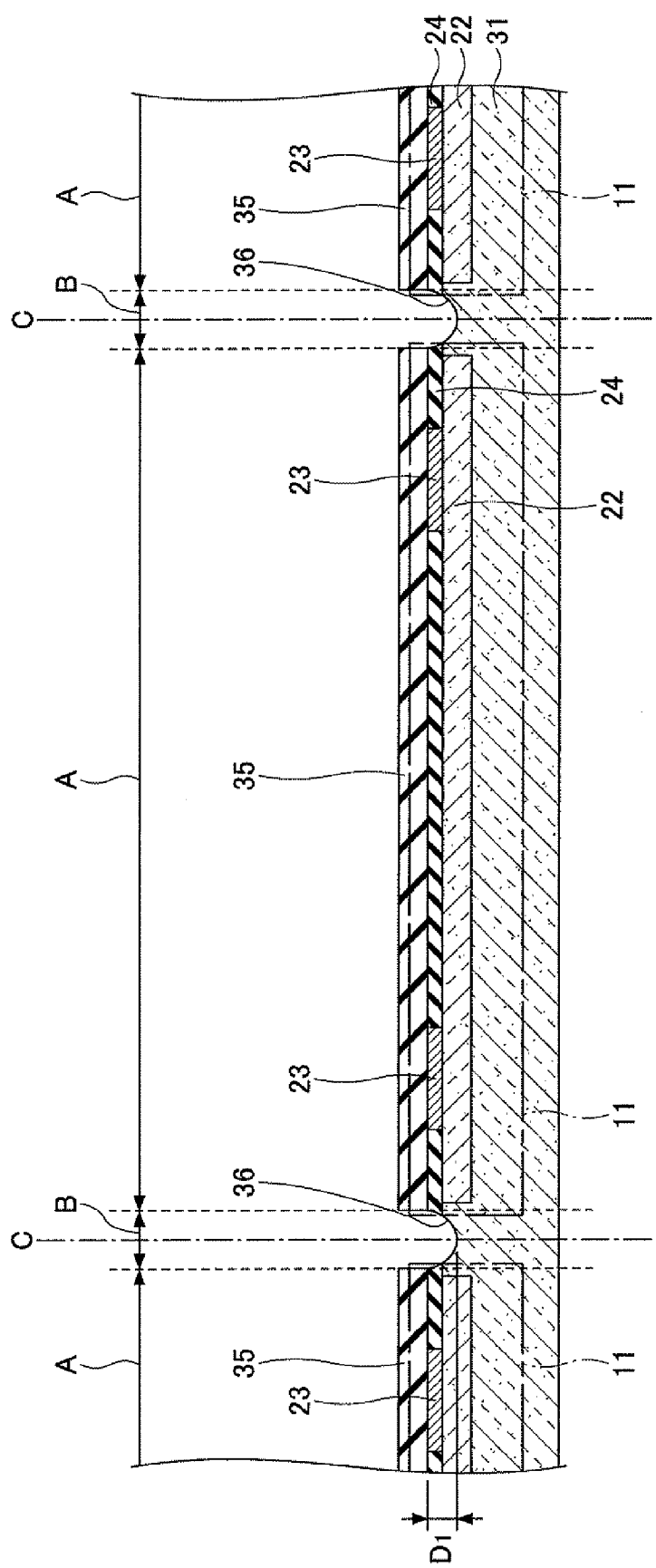
FIG. 17 illustrates the fourth manufacturing process in the manufacturing method of the semiconductor device of Embodiment 1.
Figure 18:
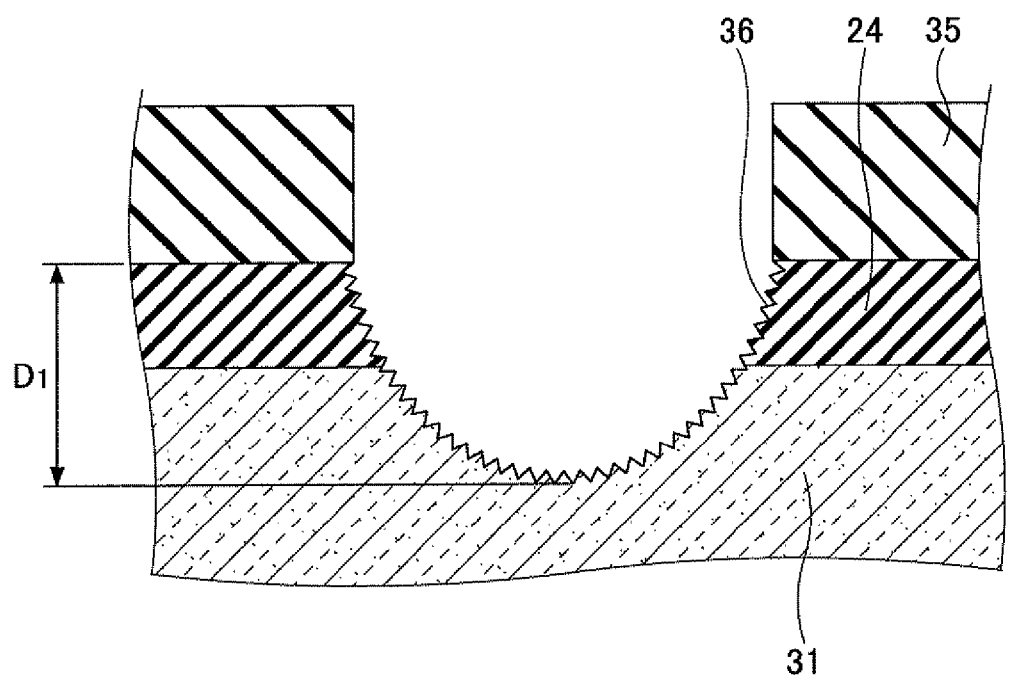
FIG. 18 illustrates the fifth manufacturing process in the manufacturing method of the semiconductor device of Embodiment 1.

In the processes illustrated in FIG. 17 and FIG. 18, the blast process is carried out using the resist mask 35 as a mask to thereby remove the protection layer 24 and a part of the semiconductor substrate 31. Thus, a groove 36 is formed in the scribe region B. The groove 36 is shaped like a U in section. The groove 36 is finally cut in the vicinity of the center of the groove to become a stepped portion 36X. FIG. 18 is an enlarged view of the groove 36 of FIG. 17. The width of the groove 36 is substantially the same as the width of the scribe region B, for example, about 30 through 200 μm. The depth $D_1$ is about 5 through 30 μm. The surface of the groove 36 formed by the blast process is roughened to have minute projections and dents as illustrated in FIG. 18.

The blast process is to mechanically adjust surface roughness of a processed material by blowing an abrading agent against the processed material with a high pressure. The blast process includes a dry blast treatment blast, a sand blast treatment blast, a wet blast treatment blast or the like. Especially, it is preferable to use a wet blast treatment to polish minute regions. This wet blast treatment causes a solvent such as water in which the abrading agent such as alumina abrasive grains and spherical silica abrasive grains are dispersed to collide against the processed material. This wet blast treatment makes it possible to elaboratively polish a semiconductor device without damaging the semiconductor device in comparison with a dry blast treatment. Further in the wet blast treatment, since the abrading agent is dispersed into the solvent such as water, the abrading agent does not fly apart in the air as dust. Further, since the solvent such as water washes away the abrading agent, it is possible to prevent the abrading agent from remaining on the surface of the processed material.

The grain diameter of the abrading agent such as the alumina abrasive grain or the spherical silica abrasive grain used for the wet blast treatment is about 5 through 20 μm. The concentration of the abrading agent such as the alumina abrasive grain or the spherical silica abrasive grain in the solvent such as water may be about 14 vol %. The injection pressure of injecting the solvent such as water in which the abrading agent is dispersed onto the surface of the processed material may be 0.25 MPa.

Figure 19:
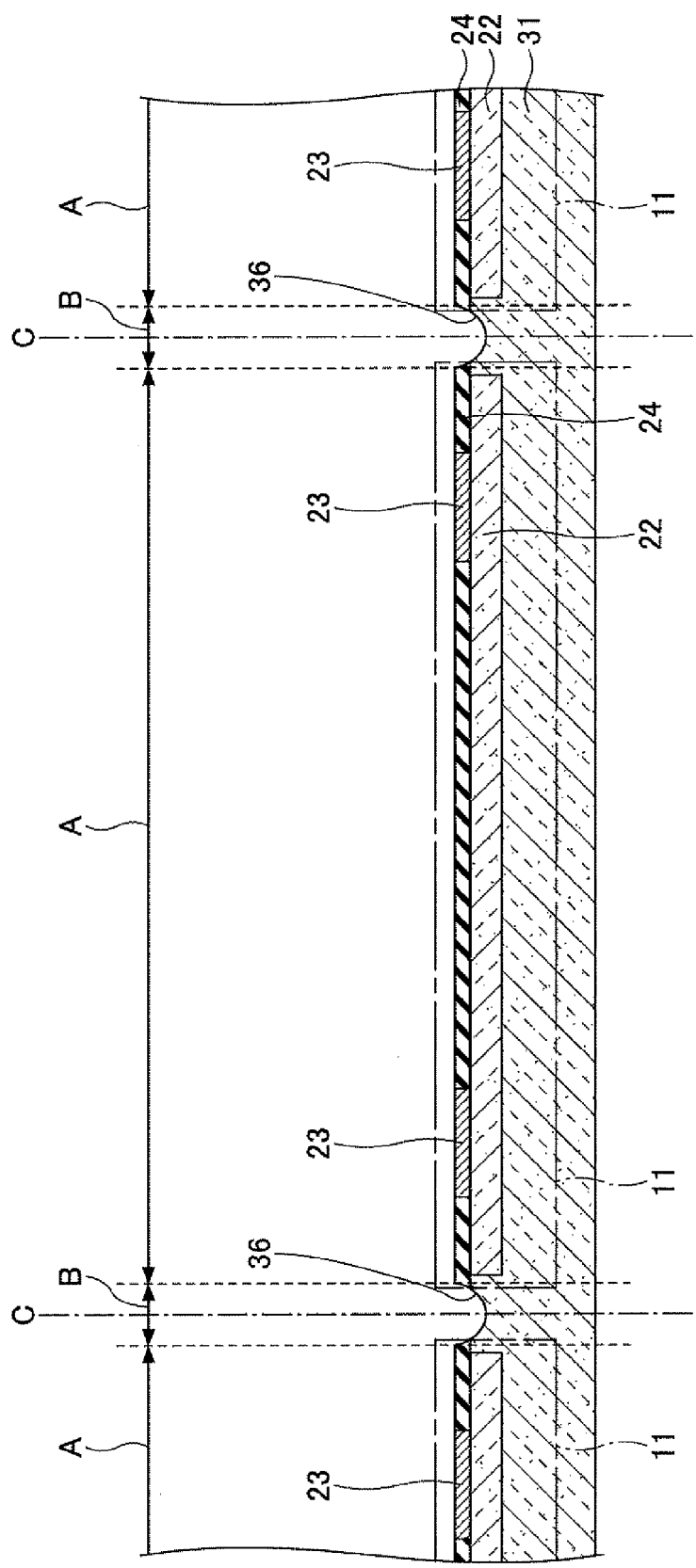
FIG. 19 illustrates the sixth manufacturing process in the manufacturing method of the semiconductor device of Embodiment 1.
Figure 20:
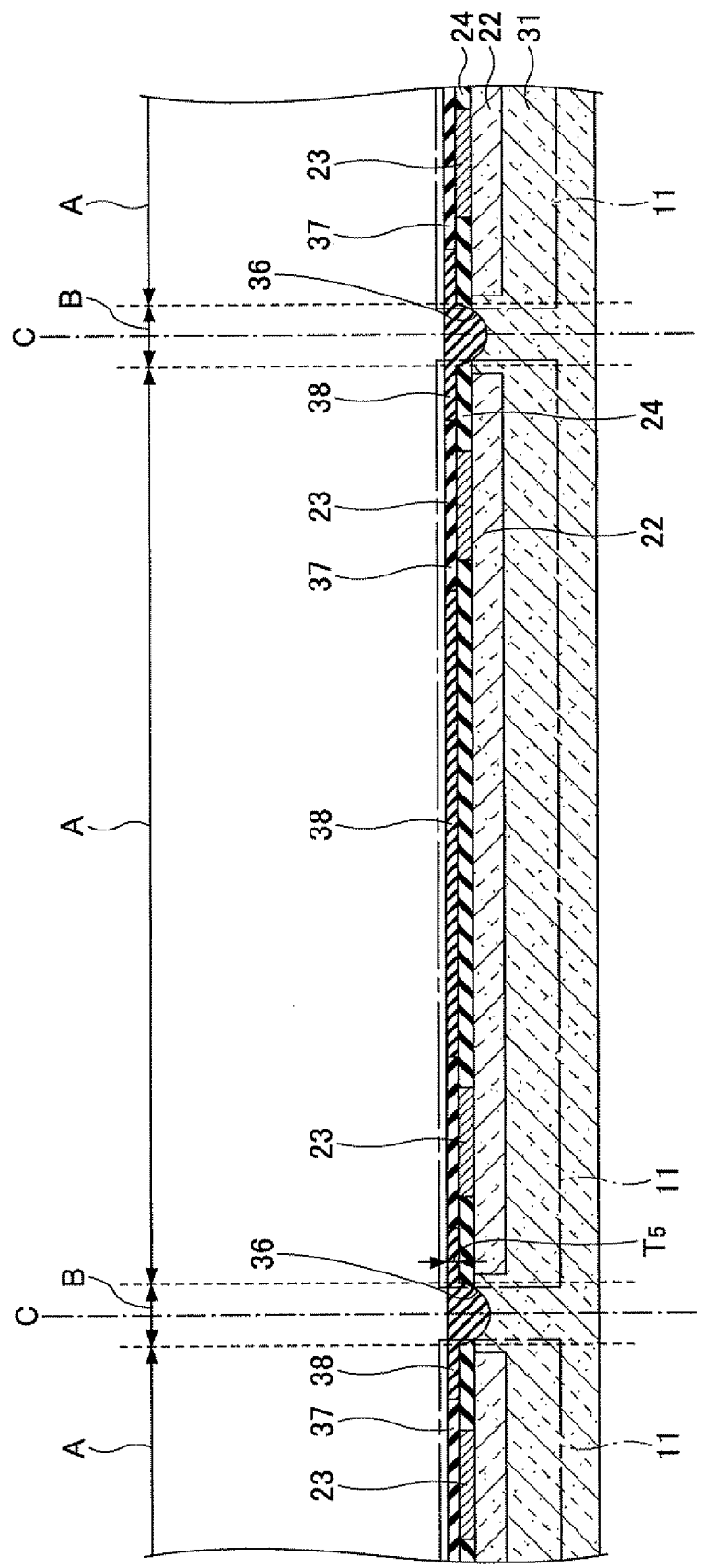
FIG. 20 illustrates the seventh manufacturing process in the manufacturing method of the semiconductor device of Embodiment 1.

The resist film 35 illustrated in FIG. 17 is removed in the process illustrated in FIG. 19. In the process illustrated in FIG. 20, a screen mask 37 for masking the area where at least the electrode pad 23 is formed is arranged on a structural body illustrated in FIG. 19. A past like resin is printed on the structural body illustrated in FIG. 19 via a screen mask 37 to form the first insulating layer 38 in an uncured state. The thickness $T_5$ of the first insulating layer 38 may be 10 μm. The material of the first insulating layer 38 is a paste-like insulating resin (for example, non conductive resin (NCR)), a paste-like anisotropic conductive resin (ACP), or the like.

The first insulating layer 38 is preferably formed to include a material of shielding alpha rays. By forming the first insulating layer 38 to contain the material shielding alpha rays, it is possible to reduce the amount of alpha rays reaching the semiconductor substrate 31 from the outside or alpha rays generated in the externally connecting pads 17 or the like. Thus, it becomes possible to prevent erroneous operation of the semiconductor device 10 such as so-called "soft error". Since it is an object to shield alpha rays, any material may be used as long as alpha rays are shielded. It is possible to effectively shield alpha rays using a material obtained by adding polyimide or a polyimide compound such as a modified polyimide to the paste-like insulating resin or the paste-like anisotropic conductive resin.

For example, it is preferable to use a black paste-like insulating resin or a black paste-like anisotropic conductive resin containing carbon black being a black colored material or a black organic colorant in addition to the material shielding alpha rays such as a modified polyimide as the first insulating layer 38.

For example, the first insulating layer 38 black-colored by containing the black material such as carbon black, the black organic colorant, or the like in addition to the material shielding alpha rays such as modified polyimide has a property of shielding alpha rays, visible rays, and ultraviolet rays. By shielding visible rays and ultraviolet rays, it is possible to prevent erroneous operations from occurring, which are caused by a photoelectromotive force which is generated by irradiating visible rays or ultraviolet rays.

The first insulating layer 38 may contain an inorganic filler such as a spherical silica ($SiO_2$) in order to lower a coefficient of thermal expansion. However, an infinitesimal quantity of a radioactive ingredient such as uranium (U) and thorium (Th) is contained in the inorganic filler. Alpha rays may be generated from the radioactive ingredient such as uranium (U) and thorium (Th). Therefore, from a stand point of reducing alpha rays, it is preferable that the inorganic filler is not contained in the first insulating layer 38.

It is preferable that the detectable amount of alpha rays in the first insulating layer 38 is 0.0015 count/$cm^2$·h or less. Even though alpha rays, visible rays, or ultraviolet rays irradiated from the outside, i.e. the side of the externally connecting pad 17, are decreased, alpha rays may be generated in the first insulating layer 38 because the amount of alpha rays contained in the first insulating layer 38 is great. In this case, it is impossible to reduce an incidence rate of so-called "soft error". The detectable amount of alpha rays from the first insulating layer 38 may become 0.0015 count/$cm^2$·h or less by adjusting the amount of the inorganic filler contained in the first insulating layer 38. It is empirically known that the incidence rate of so called "soft error" caused by alpha rays is drastically reduced if the detectable amount of alpha rays from the first insulating layer 38 is 0.0015 count/$cm^2$·h or less.

It is preferable to make the amounts of $Cl^-$ and $Na^+$ being ionic impurities, which are contained in the first insulating layer 38, 10 ppm each. It is preferable to make the amounts of $NH_4^+$ being ionic impurities, which are contained in the first insulating layer 38, 50 ppm or less. These amounts are determined to prevent the electrode pads 23, which may be made of Al, from decaying. The amounts of the ionic impurities may be measured by extracting the ionic impurities with hot liquid under, for example, 121 degrees C./20 hours and analyzing with ion chromatography.

As described, it is preferable that the first insulating layer 38 is configured to reduce the amount of alpha rays generated by the first insulating layer 38 in addition to the function of shielding alpha rays, visible rays, and ultraviolet rays irradiated from the outside of the first insulating layer 38 on the side of the externally connecting pads 17.

It is unnecessary to form the first insulating layer 38 on the entire surface of the semiconductor substrate 31, and the first insulating layer 38 may be formed on a part of the surface of the semiconductor substrate 31. The first insulating layer 38 is formed at least on a region in which the groove 36 is formed. However, it is preferable to form the first insulating layer 38 on a region immediately below the region in which the externally connecting pad 17 is formed in a process described later. This is because when an alloy containing Pb is used as the externally connecting pad 17 alpha rays generated from the radioactive ingredient such as uranium (U) and thorium (T) are shielded to prevent alpha rays from reaching the semiconductor substrate 31.

Figure 21:
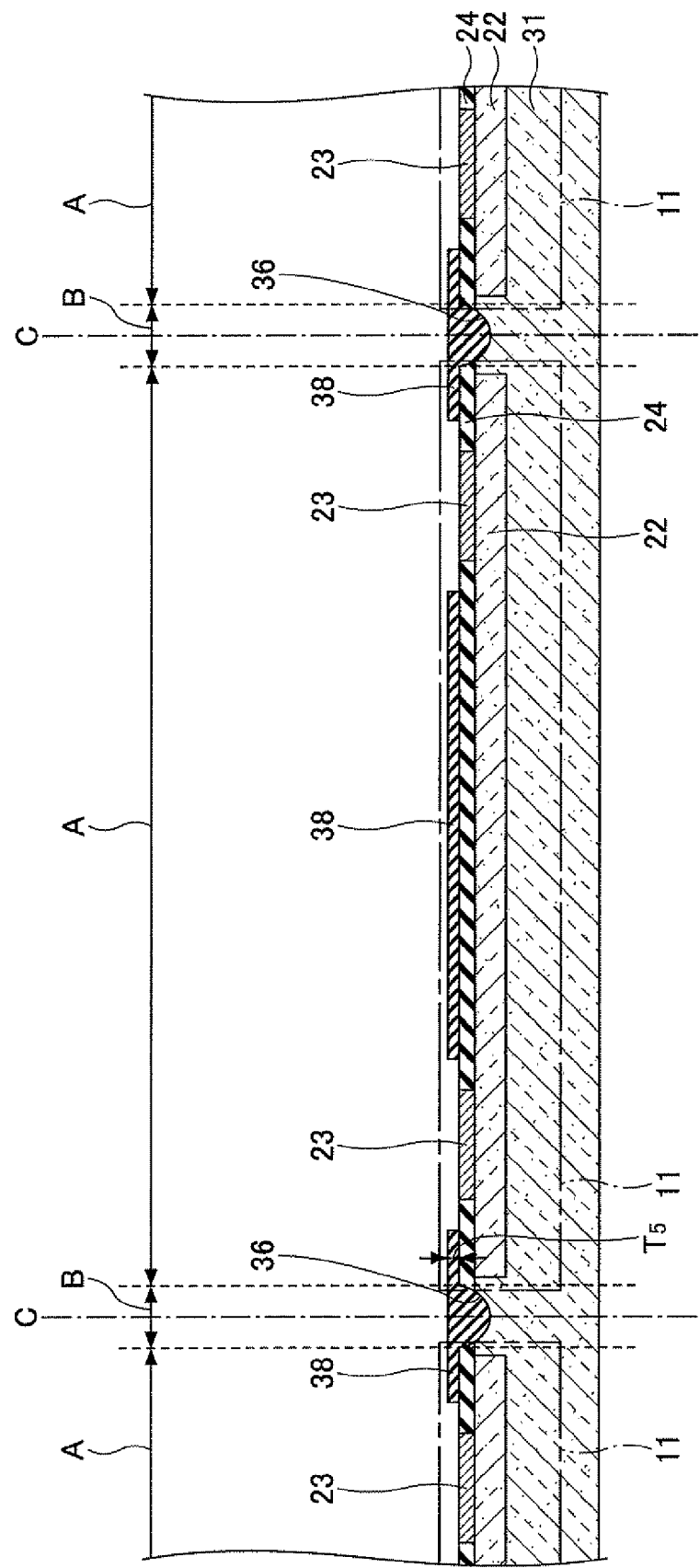
FIG. 21 illustrates the eighth manufacturing process in the manufacturing method of the semiconductor device of Embodiment 1.

Next, in the processes illustrated in FIG. 21 and FIG. 22, the screen mask 37 is removed and thereafter the first insulating layer 38 is hardened. When a thermal hardening resin is used for the first insulating layer 38, the first insulating layer 38 is heated and hardened. In this case, it is preferable to harden the first insulating layer 38 in an atmosphere of $N_2$ or the vacuum atmosphere. By thermally hardening the first insulating layer 38 in an atmosphere of $N_2$ or the vacuum atmosphere, it is possible to prevent the surface of the electrode pad 23 from being oxidized.

As described, the surface of the groove 36 formed by the blast process is roughened to have minute projections and dents as illustrated in FIG. 18. Since the first insulating layer 38 is formed in the region in which the groove 36 having the finely roughened face, i.e. minute projections and dents, is formed, the first insulating layer 38 digs into the finely roughened face, i.e. the minute projections and dents, formed on the surface of the groove 36 as illustrated in FIG. 22 to thereby cause so-called "anchor effect" between the first insulating layer 38 and the groove 36. As described, by providing the groove 36 having the finely roughened face having the minute projections and dents on the surface of the groove with the blast process, so-called "anchor effect" works between the first insulating layer 38 and the groove 36 to improve adhesiveness between the first insulating layer 38 and the groove 36, and it is possible to prevent the first insulating layer 38 from peeling off from the groove 36 of the semiconductor chip 11.

Next, plasma cleaning (not illustrated) is carried out to modify a surface of the first insulating layer 38 to improve wettability and clean surfaces of the electrode pads 23. The plasma cleaning process may be carried out by an $O_2$ plasma ashing method. The $O_2$ plasma ashing method is to oxidize an object to be processed with oxygen radicals obtained by a plasma excited oxygen gas and oxygen ions in the vacuum atmosphere and to remove the gaseous reactive product such as CO and $CO_2$.

Various inactive gases may be added to the oxygen gas to be supplied when necessary. The inactive gas may be an argon series gas, a hydrogen series gas, a nitrogen series gas, and a CF series gas such as $CF_4$ and $C_2F_6$.

By the plasma cleaning, the upper surface of the first insulating layer 38 is roughened to render the finely roughened face having the minute projections and dents. By roughening the upper surface of the first insulating layer 38, it is possible to enhance adhesiveness between the upper surface of the first insulating layer 38 and the lower surface of the second insulating layer 39 in a process illustrated in FIG. 24.

Figure 23:
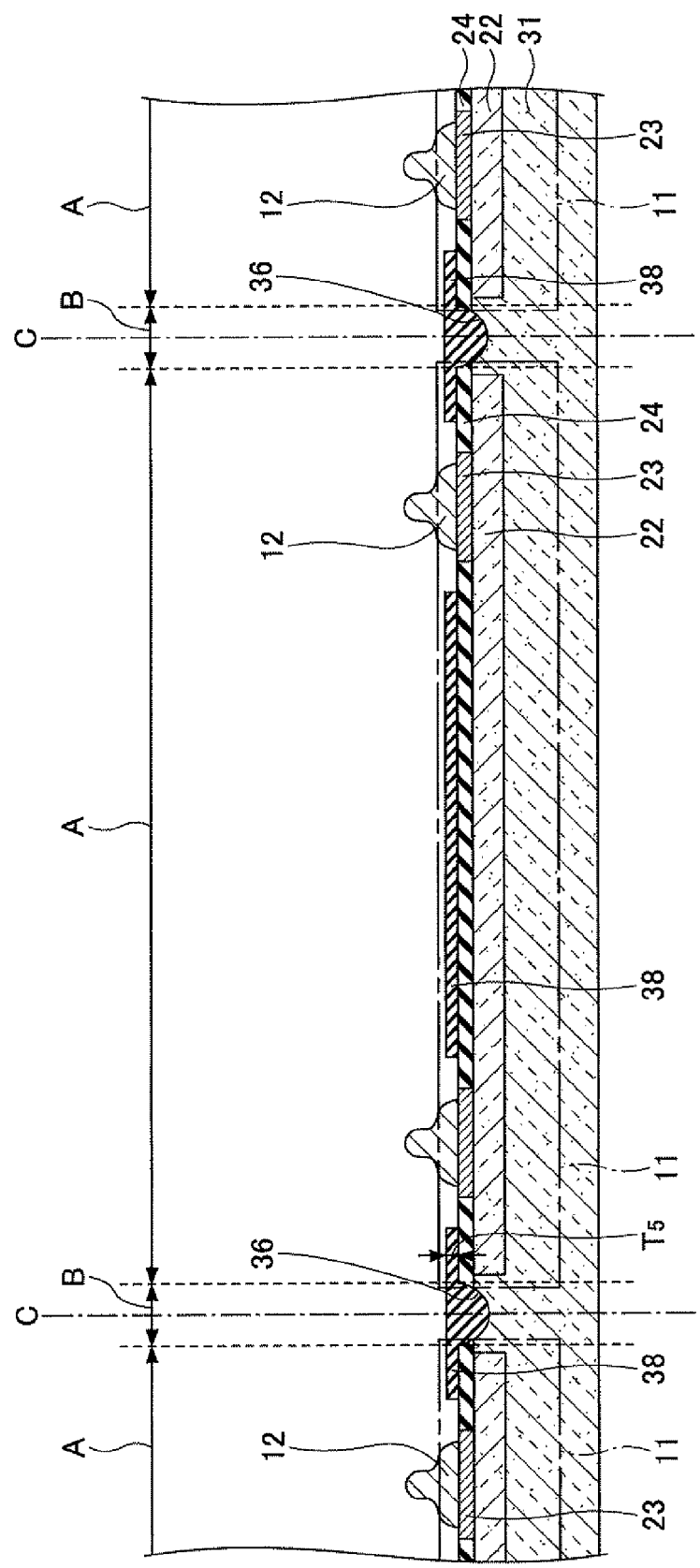
FIG. 23 illustrates the tenth manufacturing process in the manufacturing method of the semiconductor device of Embodiment 1.

Next, in the process illustrated in FIG. 23, the internal connection terminals 12 are formed on the corresponding plural electrode pads 23 which are provided on the plural semiconductor device forming regions A. The internal connection terminal 12 may be an Au bump, a Cu bump, an Au plating film, a metallic film including an Ni film covered by an Au film formed by an electrolytic plating method, or the like. The Au bump and the Cu bump may be formed by a bonding wire using a wire bonding device. The Au bump and the Cu bump may also be formed by a plating method. There is scattering of the heights in the plural internal connection terminals formed in the process illustrated in FIG. 23.

Subsequently, in the process illustrated in FIG. 24, the second insulating layer 39 is formed to cover the first insulating layer 38 and the internal connection terminals 12. The thickness $T_4$ all over the first insulating layer 38 and the second insulating layer 39 may be 20 through 60 μm. The material of the second insulating layer 39 may be a sheet-like insulating resin such as a non conductive film (NCF) of B-stage having adhesiveness (partially-hydrogenated state), a paste-like insulating resin such as a non conductive paste (NCP), a sheet-like anisotropic conductive resin such as anisotropic conductive film (ACF) having adhesiveness, a paste-like anisotropic conductive resin such as anisotropic conductive paste (ACP), a build-up resin (epoxy resin containing inorganic filler or epoxy resin without containing inorganic filler), a liquid crystal polymer, or the like. ACP and ACF are formed by dispersing small spherically shaped resins obtained by coating an insulating resin basically made of an epoxy resin or a cyanate ester series resin with at least one of Ni/Au. ACP and ACF have conductivity in a vertical (perpendicular) direction and an insulation property in a horizontal (parallel) direction.

When the sheet-like insulating resin having adhesiveness or the anisotropic conductive resin having adhesiveness are used as the second insulating resin, the sheet-like insulating resin or the anisotropic conductive resin is attached to the upper surface side of the structural body illustrated in FIG. 23 to thereby form the second insulating layer 39. When the paste-like insulating resin or the anisotropic conductive resin is used as the second insulating layer 39, the paste-like insulating resin or the anisotropic conductive resin is formed on the upper surface side of the structural body illustrated in FIG. 23 by a printing method, and thereafter the structural body is subjected to pre-baking to partially harden the insulating resin and the anisotropic conductive resin. These partially hardened insulating resin and partially hardened anisotropic conductive resin have adhesiveness.

The second insulating layer 39 is preferably formed to contain a material that shields alpha rays. By forming the second insulating layer 39 so that the second insulating layer 39 contains the material shielding alpha rays, it is possible to reduce the amount of alpha rays reaching the semiconductor substrate 31 from the outside or alpha rays generated in the externally connecting pads 17 or the like. Thus, it becomes possible to prevent erroneous operation of the semiconductor device 10 such as so-called "soft error". Since it is an object to shield alpha rays, any material may be used as long as alpha rays are shielded. It is possible to effectively shield alpha rays using a material obtained by adding polyimide or a polyimide compound such as a modified polyimide to the paste-like insulating resin or the paste-like anisotropic conductive resin.

For example, it is preferable to use a sheet-like insulating resin of B-stage (partially-hydrogenated state), a sheet-like anisotropic conductive resin, a paste-like insulating resin, and a paste-like anisotropic conductive resin, which are black-colored by containing carbon black being a black colored material or a black organic colorant, in addition to the material shielding alpha rays such as a modified polyimide as the second insulating layer 39.

For example, the second insulating layer 39 black-colored by containing the black material such as carbon black, the black organic colorant, or the like in addition to the material shielding alpha rays such as modified polyimide has a property of shielding alpha rays, visible rays, and ultraviolet rays. By shielding visible rays and ultraviolet rays, it is possible to prevent erroneous operations caused by a photoelectromotive force which is generated by irradiating visible rays or ultraviolet rays from occurring.

The second insulating layer 39 may contain an inorganic filler such as a spherical silica ($SiO_2$) in order to lower a coefficient of thermal expansion. An infinitesimal quantity of radioactive ingredients such as uranium (U) and thorium (Th) may be contained in the inorganic filler. Therefore, alpha rays may be generated from radioactive ingredients such as uranium (U) and thorium (Th) contained in the inorganic filler.

It is preferable that the detectable amount of alpha rays in the second insulating layer 39 is 0.0015 count/$cm^2 \cdot h$ or less. Even though alpha rays, visible rays, or ultraviolet rays irradiated from the outside, i.e. the side of the externally connecting pad 17, are decreased, alpha rays may be generated in the second insulating layer 39 because the amount of alpha rays contained in the second insulating layer 39 is great. In this case, it is impossible to reduce an incidence rate of so-called "soft error". The detectable amount of alpha rays from the second insulating layer 39 is obtained by measuring the amount of alpha rays irradiated from the second insulating layer 39. The detectable amount of alpha rays from the second insulating layer 39 may become 0.0015 count/$cm^2 \cdot h$ or less by adjusting the amount of the inorganic filler contained in the second insulating layer 39. It is empirically known that the incidence rate of soft error caused by the alpha rays is drastically reduced if the detectable amount of alpha rays from the second insulating layer 39 is 0.0015 count/$cm^2 \cdot h$ or less.

It is preferable to make the amounts of $Cl^-$ and $Na^+$ being ionic impurities, which are contained in the second insulating layer 39, 10 ppm each. It is preferable to make the amounts of $NH_4^+$ being ionic impurities, which are contained in the second insulating layer 39, 50 ppm or less. These amounts are determined to prevent the electrode pads 23, which may be made of Al, from decaying. The amounts of the ionic impurities may be measured by extracting the ionic impurities with hot liquid under, for example, 121 degrees C./20 hours and analyzing with ion chromatography.

As described, it is preferable that the second insulating layer 39 is configured to reduce the amount of alpha rays generated by the second insulating layer 38 in addition to the function of shielding alpha rays, visible rays, and ultraviolet rays irradiated from the outside of the second insulating layer 39 on the side of the externally connecting pads 17.

As described, the first insulating layer 38 and the second insulating layer 39 may contain the inorganic fillers. However, from a viewpoint of reducing alpha rays, the first insulating layer 38 may not contain the inorganic filler. It is preferable to reduce the amount of the inorganic filler in the first insulating layer 38 less than the amount of the inorganic filler in the second insulating layer 39. Further, the amount of the material such as modified polyimide for shielding alpha rays in the first insulating layer 38 is preferably greater than the amount of the material such as modified polyimide for shielding alpha rays in the second insulating layer 39. By increasing the material for shielding the alpha rays in the first insulating layer 38 which is positioned closer to the semiconductor substrate 31 in comparison with that in the second insulating layer 39, the amount of alpha rays reaching the semiconductor substrate 31 can be reduced to an amount as small as possible.

The contained amount of the inorganic filler in the first insulating layer 38 may be 0 through 20 wt %, which is a weight or mass ratio of the inorganic filler with respect to the weight or mass of the first insulating layer 38. The contained amount of the inorganic filler in the second insulating layer 39 may be 30 through 50 wt %, which is a weight or mass ratio of the inorganic filler with respect to the weight or mass of the second insulating layer 39. The amounts of the inorganic fillers in the first insulating layer 38 and the second insulating layer 39 cannot be simultaneously nulled in order to reduce the coefficient of thermal expansion of the semiconductor device 10 and to reduce deflection of the Si wafer caused by unmatched coefficients of thermal expansion between Si and the Si wafer. However, it is possible to null the amount of the inorganic filler contained in the first insulating layer 38. With this, the amount of alpha rays reaching the semiconductor substrate 31 can be drastically reduced. The purpose of reducing the coefficient of thermal expansion of the semiconductor device 10 may be achieved by the inorganic filler contained in the second insulating layer 39.

Figure 24:
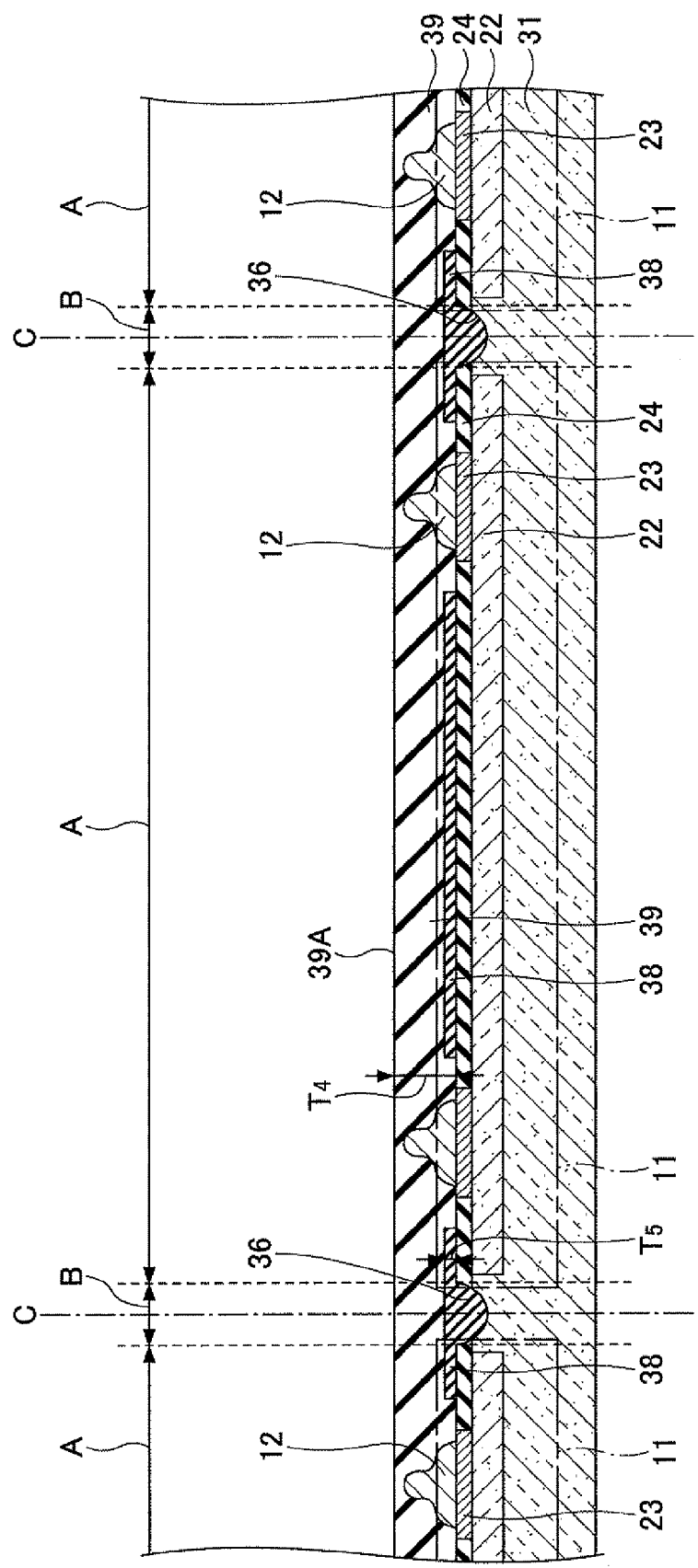
FIG. 24 illustrates the eleventh manufacturing process in the manufacturing method of the semiconductor device of Embodiment 1.
Figure 25:
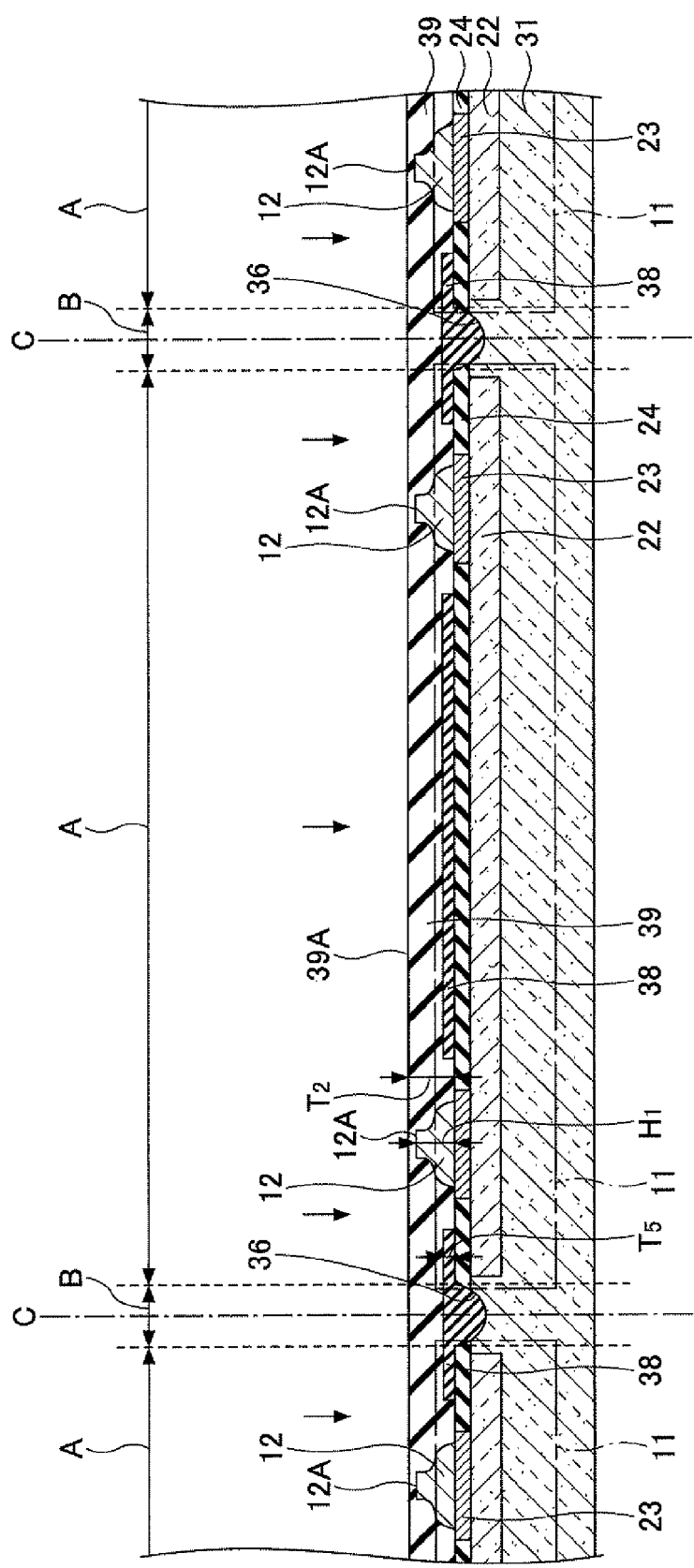
FIG. 25 illustrates the twelfth manufacturing process in the manufacturing method of the semiconductor device of Embodiment 1.

Next in the process illustrated in FIG. 25, the second insulating layer 39 is pushed from the side of the upper surface 39A of the second insulating layer 39 to the structural body illustrated in FIG. 24 along the arrow illustrated in FIG. 25 while the structural body is being heated. With this, the upper surface of the structural body, specifically the upper surface of the structural body, specifically the upper surface 39A of the second insulating layer 39 and the upper surfaces 12A of the internal connection terminals 12 illustrated in FIG. 24, becomes flat. Said differently, the upper surface 39A of the second insulating layer 39 and the upper surfaces 12A of the internal connection terminals 12 are collectively flattened at the same time.

By heating the structural body illustrated in FIG. 25 at a temperature higher than the temperature when the structural body is pushed, namely a hardening temperature of the second insulating layer 39, the second insulating layer 39 is hardened. The thickness $T_2$ of all over the first insulating layer 38 and the second insulating layer 39 may be 20 through 50 μm. Under the state, a part of the material forming the second insulating layer 39 is attached to the upper surfaces 12A of the internal connection terminals 12. Therefore, the upper surfaces 12A of the internal connection terminals 12 are not completely exposed to the outside.

Figure 26:
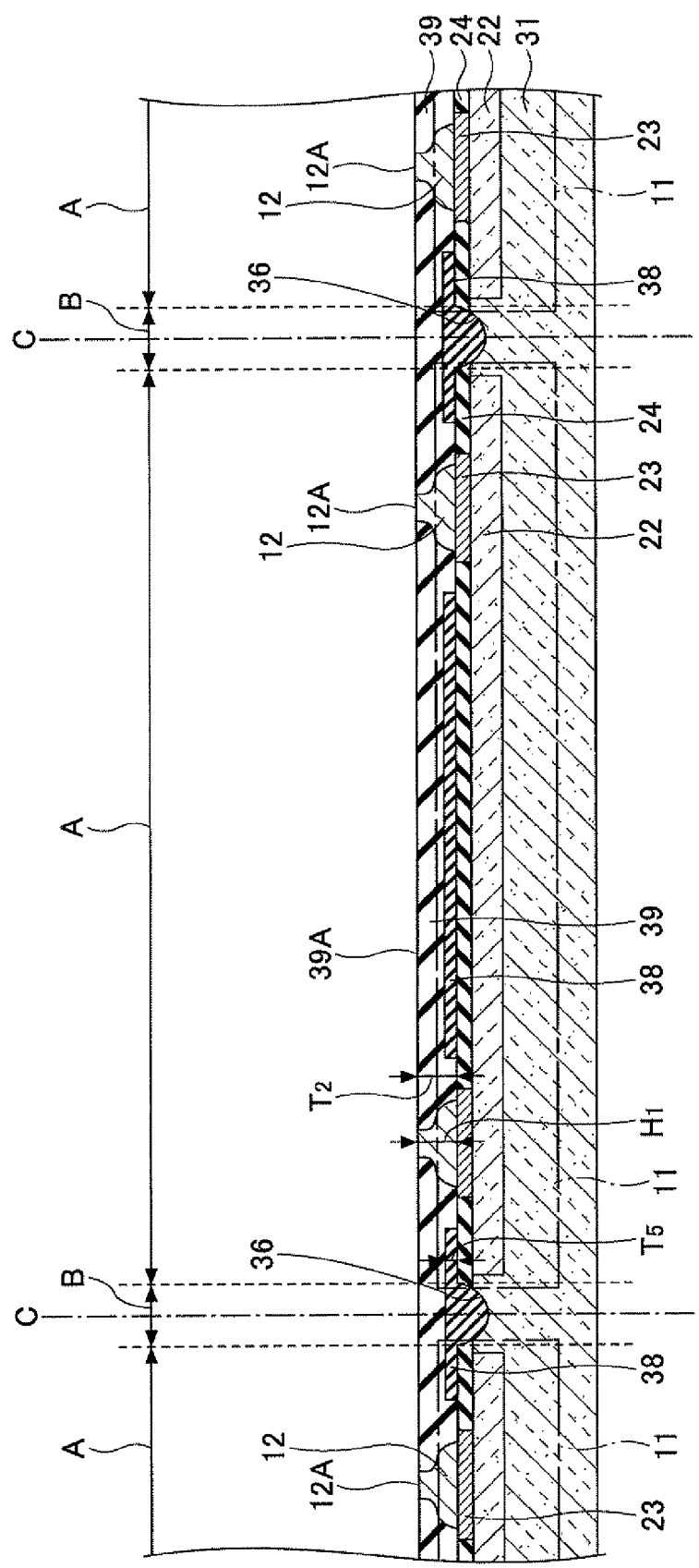
FIG. 26 illustrates the thirteenth manufacturing process in the manufacturing method of the semiconductor device of Embodiment 1.

In the process illustrated in FIG. 26, ashing of the upper surface 39A of the second insulating layer 39 is carried out to make the upper surface 12A of the internal connection terminal 12 be completely exposed from the second insulating layer 39 and roughen the upper surface 39A of the second insulating layer 39. The ashing process may be carried out by an O2 plasma ashing method.

Various inactive gases may be added to the oxygen gas to be supplied when necessary. The inactive gas may be an argon series gas, a hydrogen series gas, a nitrogen series gas, and a CF series gas such as $CF_4$ and $C_2F_6$. Ozone ashing may be used instead of the O2 plasma ashing method. However, the ozone ashing method may not demonstrate a sufficient etching property depending on the material of the second insulating layer 39, and has a lower etching rate than that of the O2 plasma ashing method to thereby lower productivity.

The surface provided with the ashing process is roughened to have the minute projections and dents. With the process illustrated in FIG. 26, the upper surface 39A of the second insulating layer 39 is roughened. It is possible to enhance adhesiveness contact between the upper surface 39A of the second insulating layer 39 and the first metallic layer 26 formed on the upper surface 39A of the second insulating layer 39. It is also possible to enhance adhesiveness contact between the upper surface 39A of the second insulating layer 39 and the solder resist 16 formed in the process illustrated in FIG. 33.

In order to roughen the upper surface 39A of the second insulating layer 39, a copper foil one of the two surfaces, which is roughened to have minute projections and dents, may be provided on the upper surface 39A of the second insulating layer 39 and pressed on the upper surface 39A, and subsequently removed to thereby transfer the roughened surface onto the upper surface 39A of the second insulating layer 39. However, the manufacturing process becomes complicated with this method, and the material cost increases because the copper foils are discarded. Therefore, there is a problem that a manufacturing cost of the semiconductor device 10 increases. In Embodiment 1, since the upper surface 39A of the second insulating layer 39 is subjected to ashing to roughen the upper surface 39A, the above problem does not occur and a production cost of the semiconductor device can be lowered.

Figure 27:
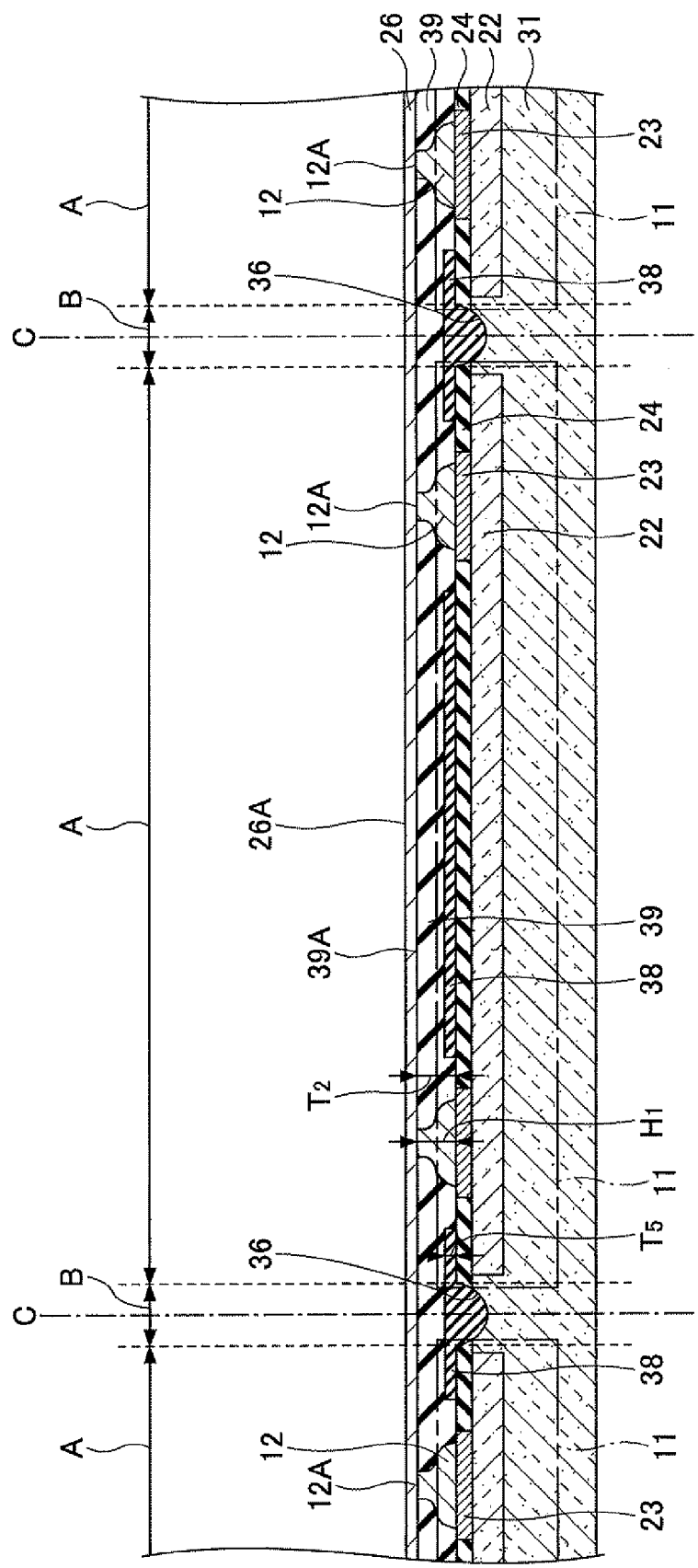
FIG. 27 illustrates the fourteenth manufacturing process in the manufacturing method of the semiconductor device of Embodiment 1.
Figure 28:
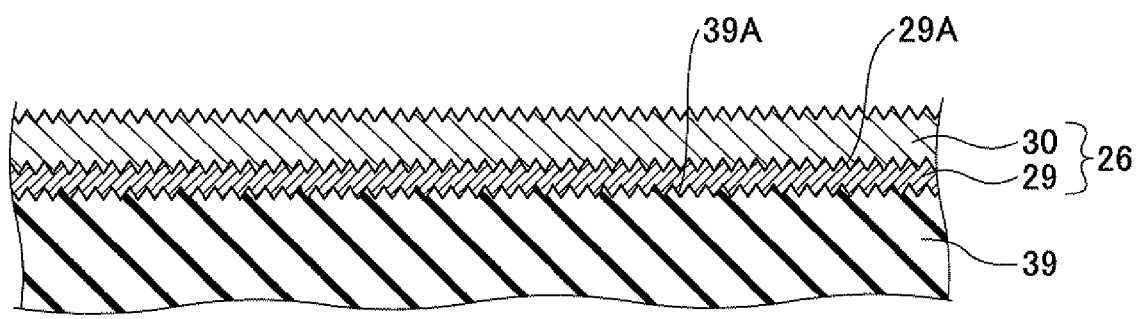
FIG. 28 illustrates the fifteenth manufacturing process in the manufacturing method of the semiconductor device of Embodiment 1.

In the process illustrated in FIG. 27 and FIG. 28, the first metallic layer 26 is formed on the upper surface 39A of the second insulating layer 39 and the upper surface 12A of the internal connection terminal 12. FIG. 28 is an enlarged view of the first metallic layer 26 of FIG. 27. The first metallic layer 26 may have a structure of sequentially laminating the Ti or Cr film and the Cu film on the upper surface 39A of the second insulating layer 39 and the upper surface 12A of the internal connection terminal 12, or a structure of forming the Cu film on the upper surface 39A of the second insulating layer 39 and the upper surface 12A of the internal connection terminal 12. In Embodiment 1, the first metallic layer 26 may be formed by a vapor-deposition method.

The vapor-deposition technique may be a physical vapor deposition method such as sputtering, a vacuum deposition method, and an ion plating method, or a chemical vapor-deposition method such as a metal CVD. It is preferable to use the physical vapor-deposition method. This is because the chemical vapor-deposition method is not prevailing as a manufacturing method for semiconductor devices, and the production cost increases in introducing a chemical vapor deposition apparatus. It is preferable to use the physical vapor-deposition method, such as sputtering. This is because sputtering has broad utility in manufacturing semiconductor devices and easily forms a dense and highly-pure metallic film.

Hereinafter, there is specifically described a method of forming the Ti or Cr film and the Cu film which form the first metallic layer 26 using sputtering as the physical vapor-deposition method. When the first metallic layer 26 is formed by the Ti or Cu film, the Ti film is formed on the upper surface 39A of the second insulating layer 39 and the upper surface 12A of the internal connection terminal 12 by using Ti as a target for sputtering, and then the Cu film is formed using Cu as a target. N2 reverse sputtering or Ar reverse sputtering may be carried out to enhance adhesiveness contact between Ti and the upper surface 39A of the second insulating layer 39 before the upper surface 39A of the second insulating layer 39 is provided with Ti by the sputtering.

Reverse sputtering and sputtering using Ti and Cu as targets can be carried out by the same sputtering equipment. It is preferable to make the thickness of Ti to be 0.05 μm or more and 2 μm or less, and make the thickness of Ti to be 0.2 μm or more and 1.5 μm or less. These ranges are obtained by the inventors of the present invention from results of testing the adhesiveness contact and repeatedly verifying sheet resistance values necessary for good electrolytic plating. By determining the thickness of the Ti film and the Cu film to be in the above range, it is possible to improve adhesiveness contacts between the upper surface 39A and the Ti film, the Ti film and the Cu film, and the Cu film and the interconnections 14, and to keep electrolytic plating good.

In some types of the material of the second insulating layer 39 such as black-colored insulating resin, a good adhesiveness contact between the upper surface 39A of the second insulating layer 39 and the Cu film is obtainable even when the Cu film is directly formed on the upper surface 39A of the second insulating layer 39 without forming the Ti film. When these types of the material are used for the second insulating layer 39, the upper surface 39A of the second insulating layer 39 is subjected to ashing as illustrated in FIG. 26, and thereafter the Cu film is formed by sputtering using Cu as the target. It is also possible to form the Cu film by providing ashing illustrated in FIG. 26 on the upper surface 39A of the second insulating layer 39, thereafter providing the N2 reverse sputtering or the AR reverse sputtering, and thereafter providing sputtering using Cu as the target.

Said differently, these types of the material (the black-colored insulating resin) used for the second insulating layer 39 does not require the process of forming the Ti film on the upper surface 39A of the second insulating layer 39 by sputtering using Ti as the target before forming the Cu film, and the N2 reverse sputtering and the AR reverse sputtering for enhancing adhesiveness contact between the upper surface 39A and Ti before sputtering Ti onto the upper surface 39A.

When the first metallic layer 26 is formed by the CR film and the Cu film, the Cr film is formed on the upper surface 39A of the second insulating layer 39 and the upper surface 12A of the internal connection terminal 12 by using Cr as the target for sputtering, and then the Cu film is formed by sputtering using Cu as the target. N2 reverse sputtering or Ar reverse sputtering may be carried out to enhance adhesiveness contact between Cr and the upper surface 39A of the second insulating layer 39 before the upper surface 39A of the second insulating layer 39 is provided with Cr by the sputtering.

The Cr film and the Cu film are sequentially formed using the same sputtering equipment. It is preferable to make the thickness of Cr film to be 0.01 μm or more and 0.05 μm or less, and make the thickness of Cu to be 0.2 μm or more and 1.5 μm or less. These ranges are obtained by the inventors of the present invention from results of testing the adhesiveness contact and repeatedly verifying sheet resistance values necessary for good electrolytic plating. By determining the thickness of the Cr film and the Cu film to be in the above range, it is possible to improve adhesiveness contacts between the upper surface 39A and the Cr film, the Cr film and the Cu film, and the Cu film and the interconnections 14, and to keep electrolytic plating good.

In some types of the material of the second insulating layer 39 such as black-colored insulating resin, a good adhesiveness contact between the upper surface 39A of the second insulating layer 39 and the Cu film is obtainable even when the Cu film is directly formed on the upper surface 39A of the second insulating layer 39 without forming the Cr film. When these types of the material are used as the second insulating layer 39, the upper surface of the second insulating layer 39 is subjected to ashing as illustrated in FIG. 26, and thereafter the Cu film is formed by sputtering using Cu as the target. It is also possible to form the Cu film by providing ashing illustrated in FIG. 26 on the upper surface 39A of the second insulating layer 39, thereafter providing the N2 reverse sputtering or the AR reverse sputtering, and thereafter providing sputtering using Cu as the target.

Said differently, these types of the material (the black-colored insulating resin) used for the second insulating layer 39 does not require the process of forming the Cr film on the upper surface 39A of the second insulating layer 39 by sputtering using Cr as the target before forming the Cu film, and the N2 reverse sputtering and the AR reverse sputtering for enhancing adhesiveness contact between the upper surface 39A and Cr before sputtering Ti onto the upper surface 39A.

As described in Embodiment 1, the first metallic layer 26 having a laminated structure of the Ti film and the Cu film, a laminated structure of the Cr film and the Cu film, or a single-layered structure of the Cu film is formed by a vapor-deposition technique such as sputtering. Therefore, the Ti film, the Cr film, or the Cu film are connected to the upper surfaces 12A of the internal connection terminal 12 exposed from the upper surface 39A of the second insulating layer 39 with a metallic bond. Further, in the laminated structure of the Ti film and the Cu film and the laminated structure of the Cr film and the Cu film, the Cu film formed on the Ti film or the Cr film is formed by sputtering. Therefore, the Ti or Cr film is connected to the Cu film by a metallic bond.

Therefore, in comparison with conventional connecting methods using crimping or a conductive paste, it is possible to firmly connect the upper surface 12A of the internal connection terminal 12 to the first metallic layer 26 to thereby enhance a mechanical and electrical connection reliability between the Ti or Cr film and the Cu film.

In Embodiment 1, the second metallic film 27 is formed over the upper surface 39A of the second insulating layer 39 made of a resin or the like via the first metallic layer 26. Therefore, adhesiveness contact is enhanced by forming the first metallic layer 26 as a contact metallic layer on the upper surface 39A of the second insulating layer 39. However, an adhesiveness contact between the first metallic layer 26 and the upper surface 39A may not be assured. However, since the upper surface 39A of the second insulating layer 39 is roughened in the process illustrated in FIG. 26 to have the minute projections and dents in Embodiment 1, there is no problem in the adhesiveness contact between the first metallic layer 26 and the upper surface 39A of the second insulating layer 39. Said differently, there are dual countermeasures of the anchor effect with the finely roughened face having the minute projections and dents and of the formation of the first metallic layer 26.

Reliability of the adhesiveness contact between the upper surface 39A of the second insulating layer 39 and the first metallic layer 26 is described in a case where the first metallic layer 26 has the laminated structure of the Ti film and the Cu film, or the laminated structure of the Cr film and the Cu film in reference to FIG. 28. Referring to FIG. 28, reference symbol 29 designates the Ti or Cr film forming the first metallic layer 26, reference symbol 29A designates the upper surface of the Ti or Cr film, and reference symbol 30 designates the Cu film forming the first metallic layer 26.

With the process illustrated in FIG. 26, the upper surface 39A of the second insulating layer 39 is roughened to have the minute projections and dents as illustrated in FIG. 28. Since the Ti or Cr film 29 is formed on the upper surface 39A of the second insulating layer 39 having the minute projections and dents, the Ti or Cr film 29 digs into the minute projections and dents. Thus, there is a so-called anchor effect between the upper surface 39A and the Ti or Cr film 29.

With this structure, if the second insulating layer 39 is made of a resin, the Ti or Cr film 29 can be certainly formed on the upper surface of the second insulating layer 39. Therefore, it is possible to prevent the Ti or Cr film 29 from peeling off from the upper surface 39A of the second insulating layer 39 to thereby enhance reliability of the semiconductor device 10. The reliability of the adhesiveness contact is assured by the dual countermeasures of the use of the Ti or Cr film 29 and the anchor effect caused by the minute projections and dents formed on the upper surface 39A of the second insulating layer 39.

Referring to FIG. 28, the upper surface 39A of the second insulating layer 39 having the minute projections and dents is transferred to the upper surface 29A of the Ti or Cr film 29 formed on the upper surface 39A. Therefore, the upper surface 29A of the Ti or Cr film 29 also has minute projections and dents. Thus, the anchor effect acts between the Ti or Cr film 29 and the Cu film 30 formed on the upper surface 29A of the Ti or Cr film 29 to thereby enhance adhesiveness contact between the Ti or Cr film 29 and the Cu film 30. Further, it is possible to enhance the adhesiveness contact between the resist film 28 and the Cu film 30 to thereby prevent inferior etching at a time of forming the interconnections 14.

The reason why the first metallic layer 26 is formed by laminating the Ti or Cr film 29 and the Cu film 30 is to provide the first metallic layer 26 as a power feeding layer. The Ti or Cr film 29 shows high adhesiveness contact with the material forming the second insulating layer 39, namely the Ti or Cr film 29 is used as the contact metallic layer. However, the Ti or Cr film 29 has a high electric resistance and is not suitable for the power feeding layer. Here, by laminating the Cu film 30 having a low electric resistance (sheet resistance), the electric resistance of the first metallic layer 26 can be lowered to thereby enable using the first metallic layer 26 as the power feeding layer.

Figure 29:
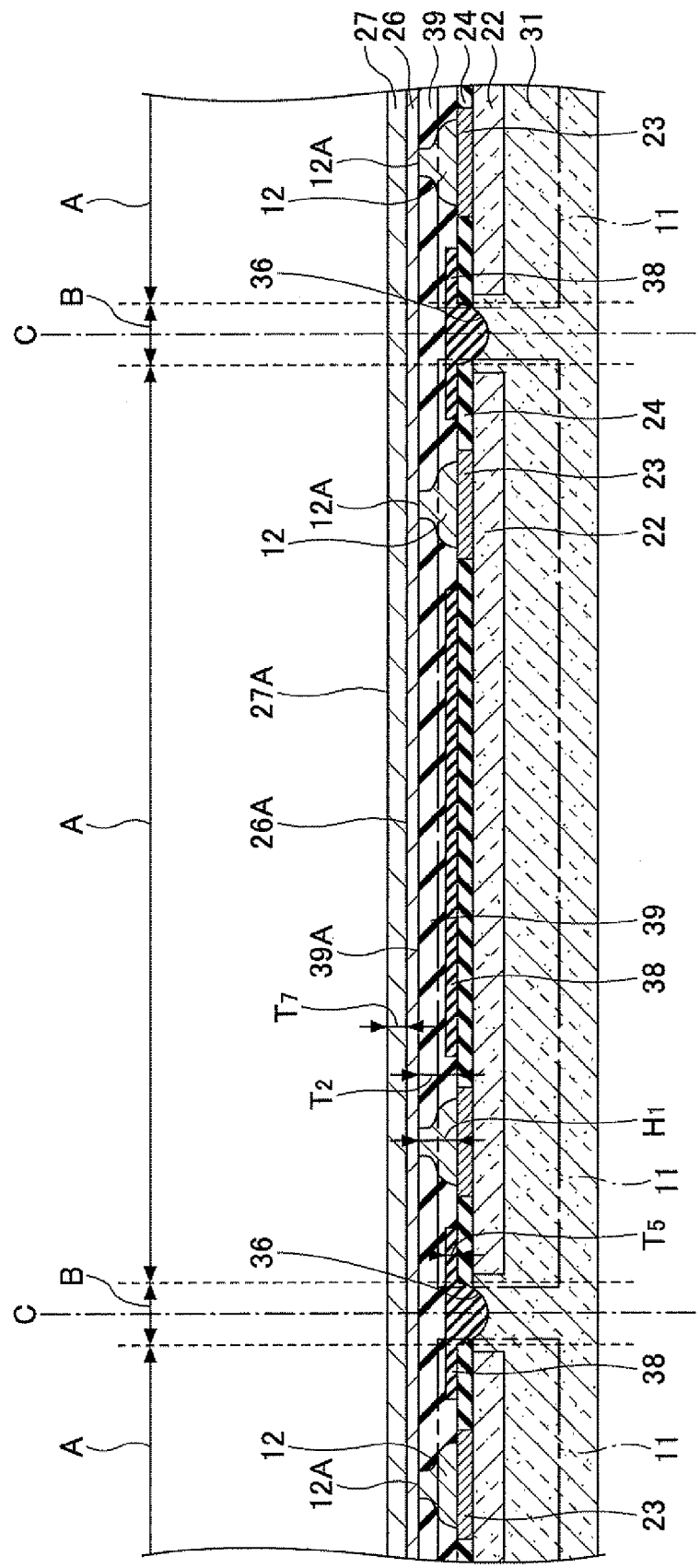
FIG. 29 illustrates the sixteenth manufacturing process in the manufacturing method of the semiconductor device of Embodiment 1.

In the process illustrated in FIG. 29, the second metallic layer 27 is formed by an electrolytic plating method or the like using the first metallic layer 26 as a power feeding layer so as to cover the upper surface of the structural body, i.e. the upper surface 26A of the first metallic layer 26, illustrated in FIG. 27. The material of the second metallic layer 27 may be Cu or the like. The thickness $T_7$ of the second insulating layer 27 may be 10 µm.

Figure 30:
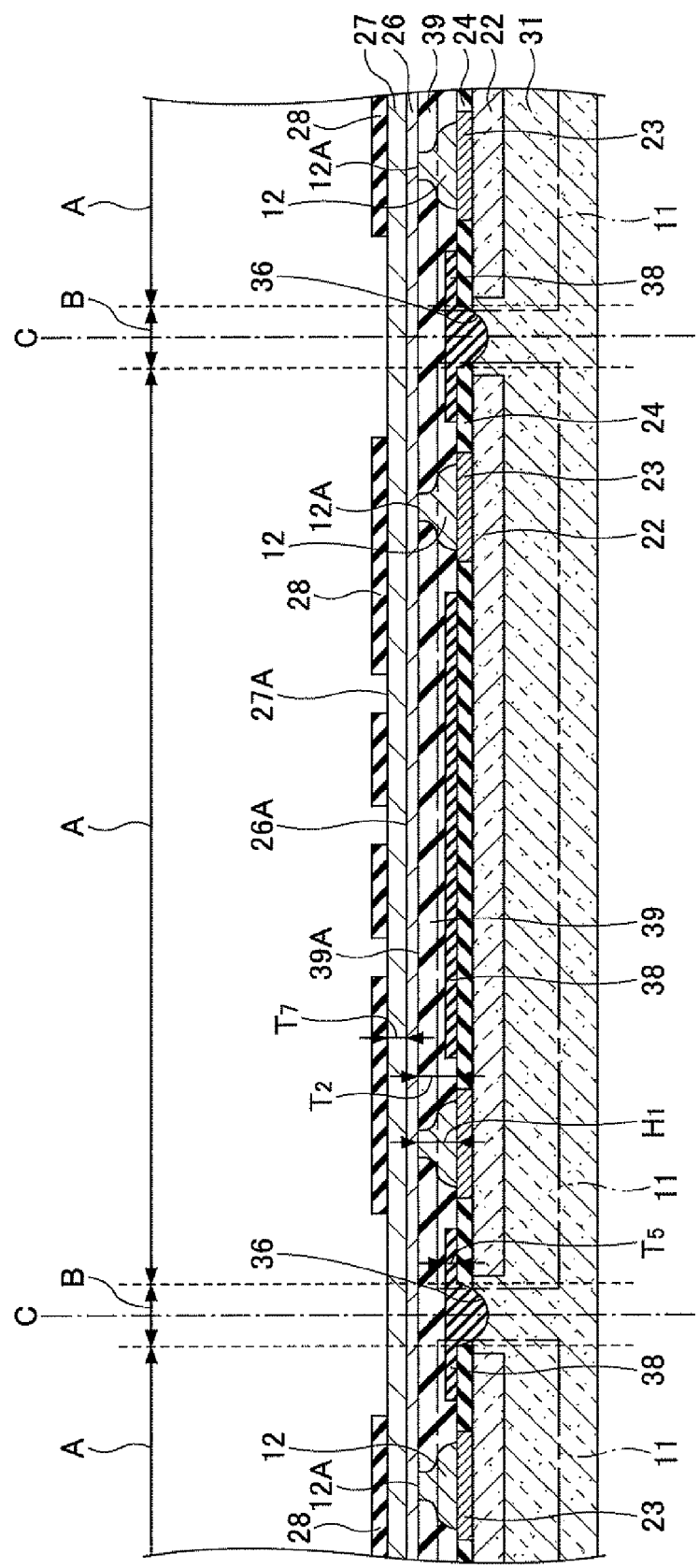
FIG. 30 illustrates the seventeenth manufacturing process in the manufacturing method of the semiconductor device of Embodiment 1.

In the process illustrated in FIG. 30, a resist is coated on the upper surface 27A of the second metallic layer 27, and the resist is exposed to light and developed to form the resist film 28 on upper portions 27A of the second metallic layers 27 corresponding to portions in which the interconnections 14 are formed.

Figure 31:
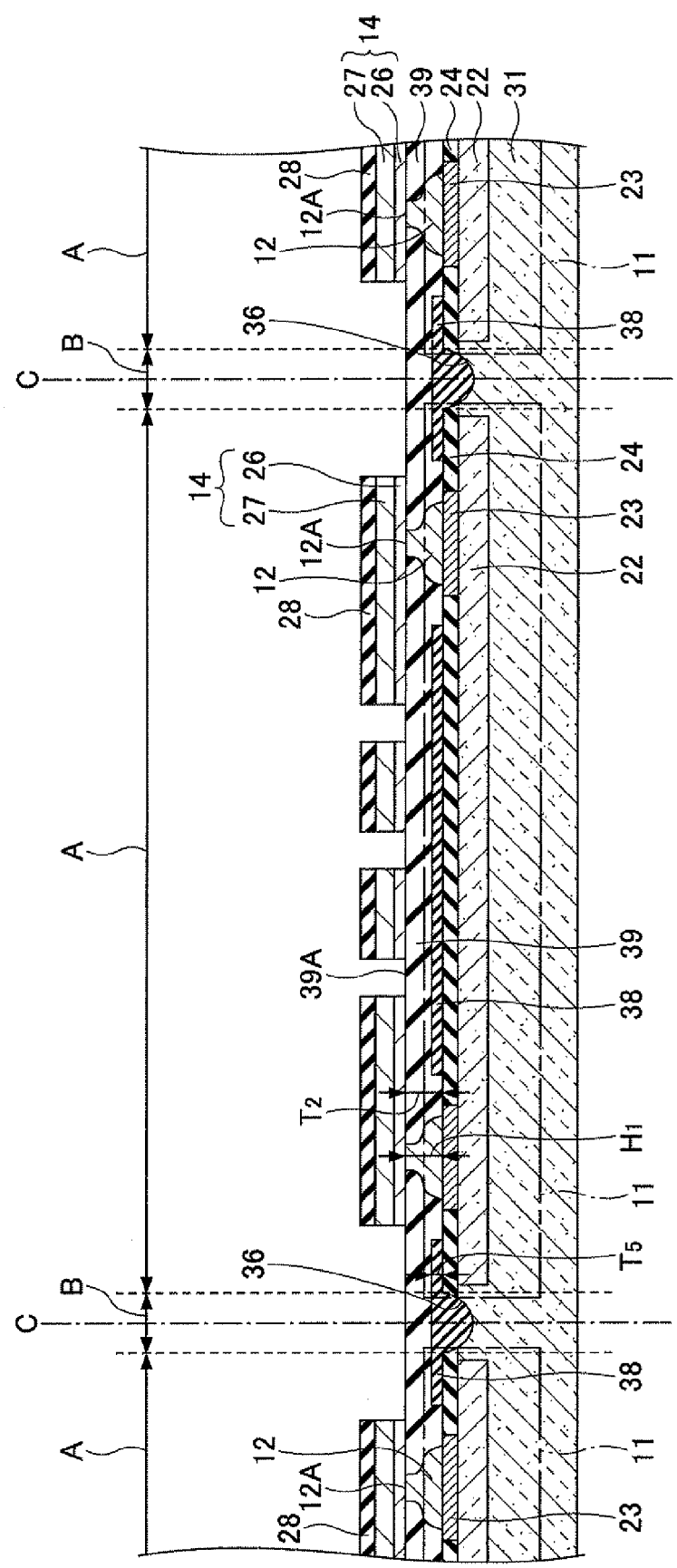
FIG. 31 illustrates the eighteenth manufacturing process in the manufacturing method of the semiconductor device of Embodiment 1.

In the process illustrated in FIG. 31, the first metallic layer 26 and the second metallic layer 27 are subjected to etching using the resist film 28 as the mask. By removing the first metallic layer 26 and the second metallic layer 27 at the portions in which the resist film 28 is not formed, the interconnections 14 are formed.

Figure 32:
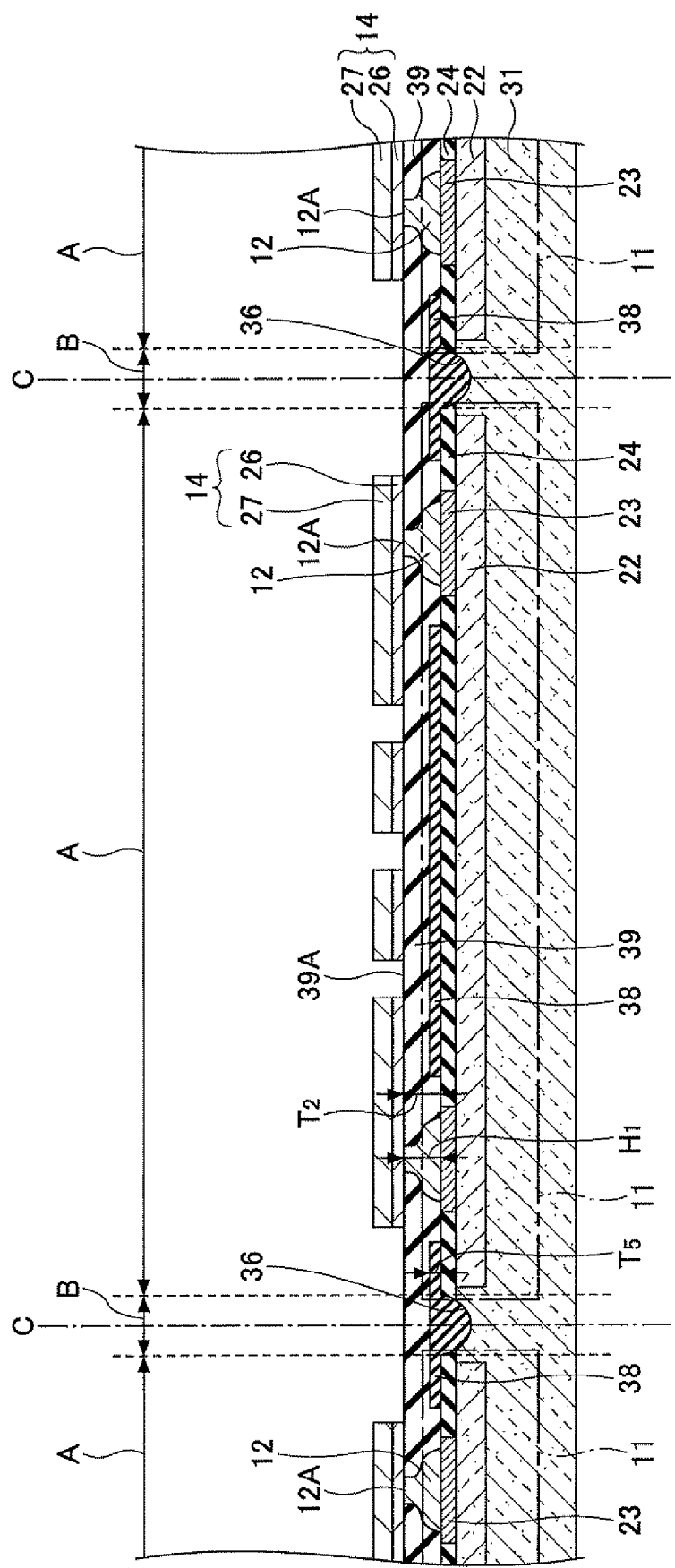
FIG. 32 illustrates the nineteenth manufacturing process in the manufacturing method of the semiconductor device of Embodiment 1.

The resist film 28 illustrated in FIG. 31 is removed in the process illustrated in FIG. 32. Thereafter, the interconnections 14 are roughened. The roughening of the interconnections 14 is carried out by any one of methods of a blackening process or a roughening and etching process. The roughening process is to improve adhesiveness contact between the upper and side surfaces of the interconnections 14 and the solder resist 16.

Figure 33:
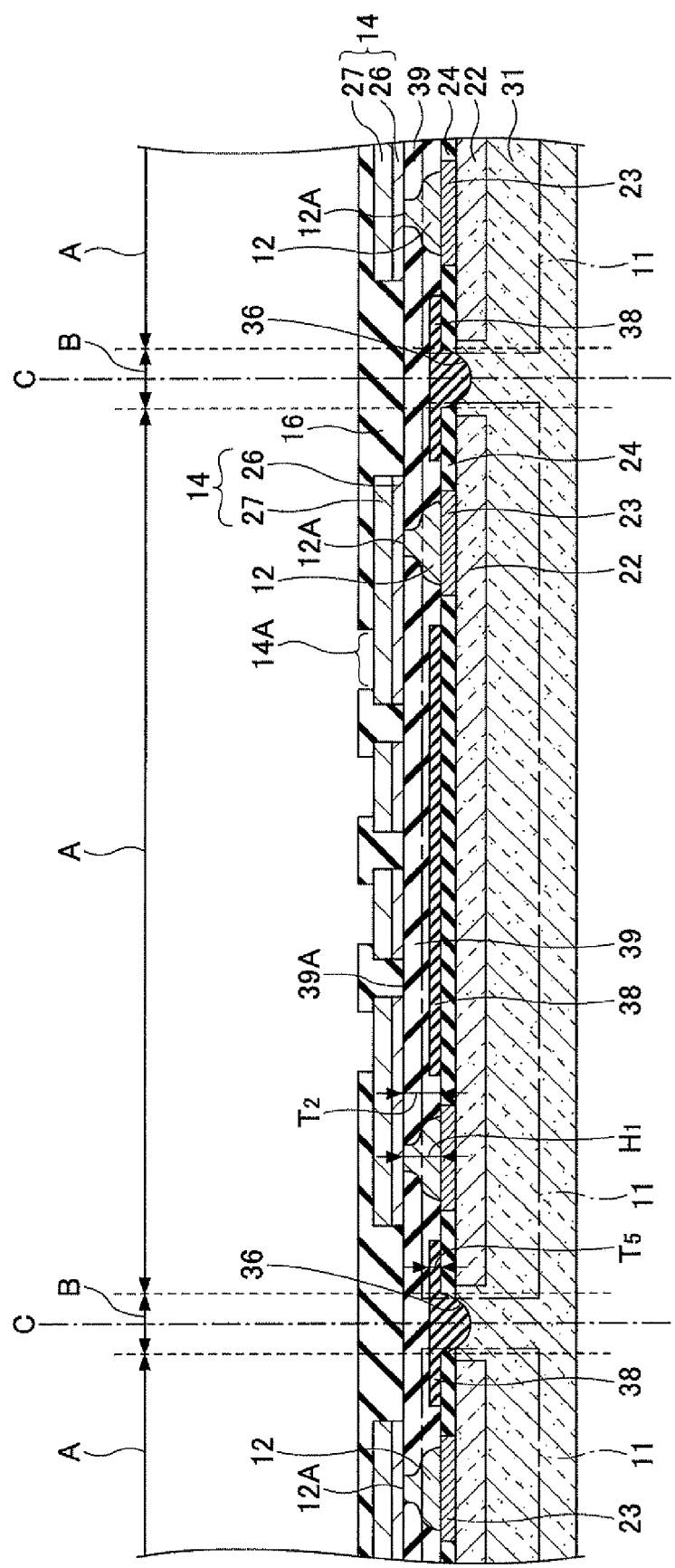
FIG. 33 illustrates the twentieth manufacturing process in the manufacturing method of the semiconductor device of Embodiment 1.

In the process illustrated in FIG. 33, the solder resist 16 having opening portions from which regions 14A for externally connecting pads are exposed to the outside by coating the interconnections 14 and the second insulating layer 39, exposing the resist with light by a photolithography method, developing the resist, removing the resist at portions corresponding to the regions 14A for externally connecting pads by etching. The material of the solder resist 16 may be a resin containing a major component of epoxy, epoxy acrylate, cyanate ester or siloxane which does not contain an inorganic filler.

Figure 34:
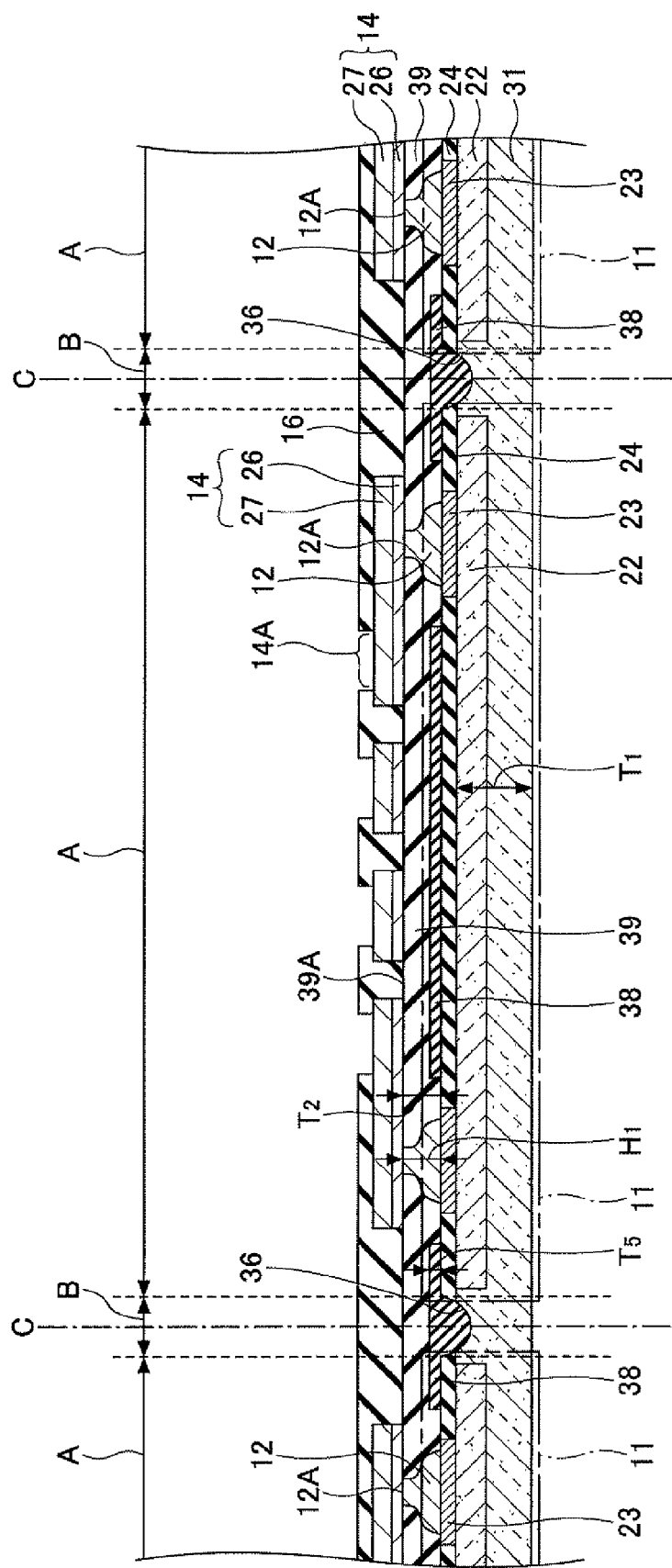
FIG. 34 illustrates the twenty first manufacturing process in the manufacturing method of the semiconductor device of Embodiment 1.

In the process illustrated in FIG. 34, the semiconductor substrate 31 is polished from the back side of the semiconductor substrate 31 to thin the semiconductor substrate 31. For example, it may be possible to use a back side grinder to thin the semiconductor substrate 31. The thickness $T_1$ of the semiconductor substrate 31 may be 50 through 500 µm after the semiconductor substrate 31 is thinned. The process illustrated in FIG. 34 may be omitted.

Figure 35:
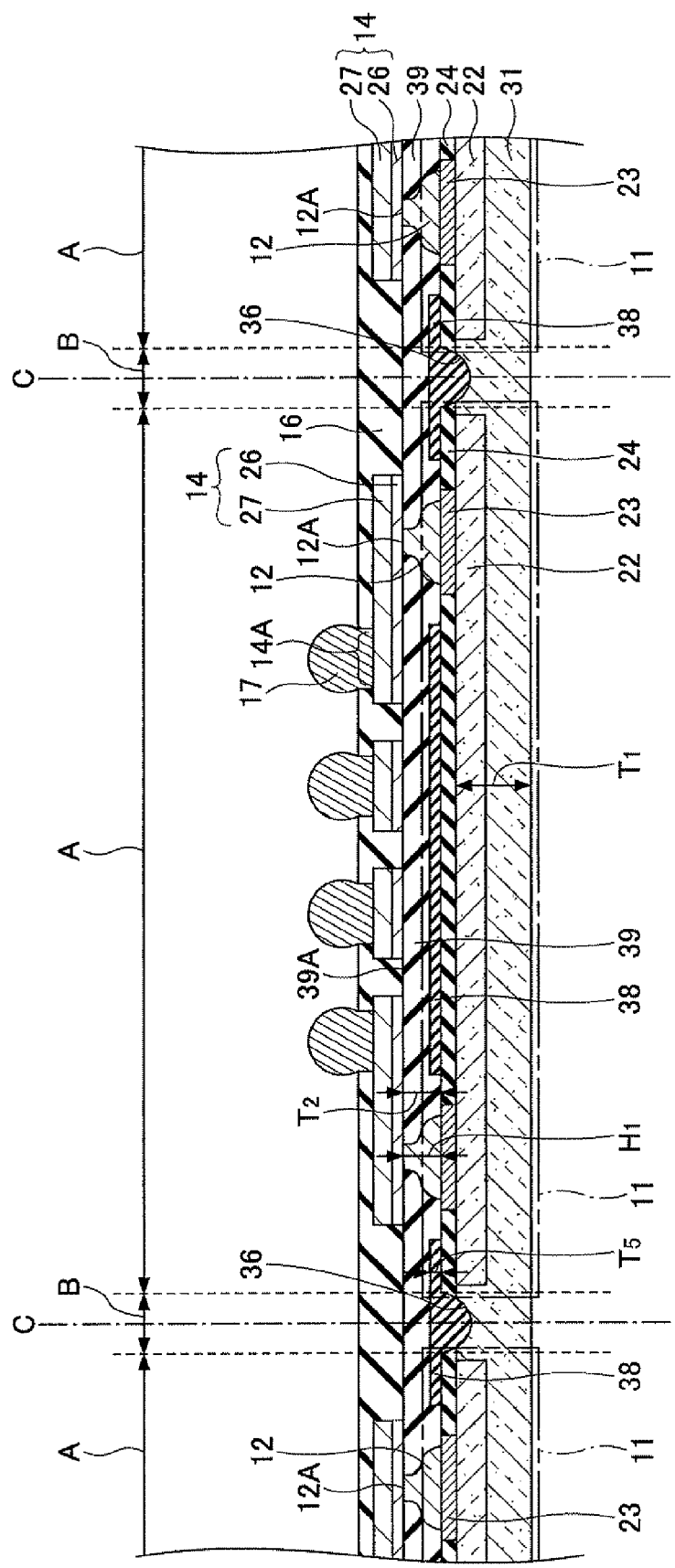
FIG. 35 illustrates the twenty second manufacturing process in the manufacturing method of the semiconductor device of Embodiment 1.

In the process illustrated in FIG. 35, the externally connecting pads 17 are formed on the regions 14A for externally connecting pads. The material of the externally connecting pads 17 is preferably a Pd free solder such as Sn-3.5Ag and Sn-3.0Ag-0.5Cu. The reason for using the material is as described above. Thus, the structural bodies corresponding to the semiconductor devices 10 are formed on plural semiconductor device forming regions A. The process illustrated in FIG. 34 and the process illustrated in FIG. 35 may be substituted. A back grind tape may be formed to absorb the heights of the externally connecting pads 17, and the back surface of the semiconductor substrate 31 is polished.

Figure 36:
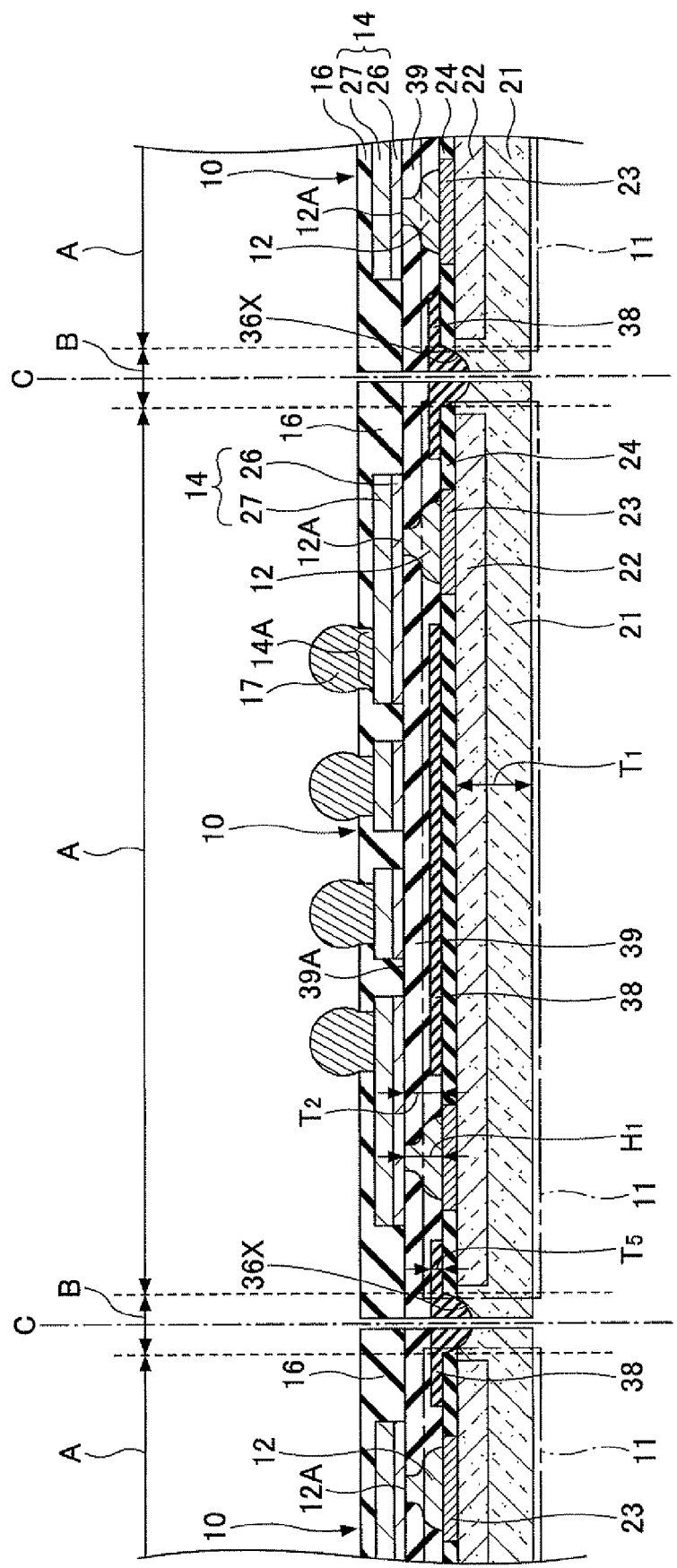
FIG. 36 illustrates the twenty third manufacturing process in the manufacturing method of the semiconductor device of Embodiment 1.

In the process illustrated in FIG. 36, the solder resist 16, the first insulating layer 38, the second insulating layer 39, and the semiconductor substrate are cut along the cutting portions C to thereby manufacture plural semiconductor devices 10. The semiconductor substrates 21 are obtained by cutting the semiconductor substrate 31. On outer edge portions of the semiconductor devices 10, stepped portions 36X are formed. The stepped portion 36X is formed by cutting the groove 36 in the vicinity of the center of the groove 36. The semiconductor substrate may be cut by a dicing blade having a width (the width of the groove 36) narrower than the width of the scribe region B.

As described, in the semiconductor device of Embodiment 1 and the manufacturing method of the semiconductor device, the adhesiveness contact between the first insulating layer 38 and the stepped portion 36X of the groove 36 is improved by the anchor effect between the first insulating layer 38 and the stepped portion 36X of the groove 36 acting by providing the stepped portion 36X with the minute projections and dents. Thus, it is possible to prevent the first insulating layer 38 from peeling off from the stepped portion 36X. Said differently, the first insulating layer 38 can be prevented from peeling off from the semiconductor chip 11.

Further, by adopting the dual-layer structure including the first insulating layer 38 and the second insulating layer 39 in the insulating layer and making the contained amount of the inorganic filler of the first insulating layer 38 closer to the semiconductor substrate 21 (the semiconductor substrate 31) less than that of the second insulating layer 39 positioned farther from the semiconductor substrate 21 (the semiconductor substrate 31) or null, it is possible to drastically reduce the amount of alpha rays reaching the semiconductor substrate 21 (the semiconductor substrate 31).

When the first insulating layer 38 and the second insulating layer 39 contain any one of or both of polyimide and a polyimide compound, and an aggregate amount of the polyimide and the polyimide compound (even if any one of the amounts is zero) contained in the first insulating layer 38 is larger than an aggregate amount of the polyimide and the polyimide compound (even if any one of the amounts is zero) contained in the second insulating layer 39, the amount of alpha rays reaching the semiconductor substrate 21 (semiconductor substrate 31) can be drastically reduced.

When the internal connection terminals 12 are covered by the second insulating layer 39, it becomes possible to prevent a local stress from being applied to the internal connection terminals 12. Thus, it is possible to prevent cracks from occurring in the internal connection terminals 12.

Further, when the fillerless solder resist 16 does not contain an inorganic filler, it is possible to prevent the solder resist 16 from generating alpha rays.

When the material of the externally connecting pads 17 is a Pd free solder such as Sn-3.5Ag and Sn-3.0Ag-0.5Cu, it is possible to reduce the amount (alpha ray detectable amount) of alpha rays generated by the externally connecting pads 17.

With a synergetic effect of the first insulating layer 38 and the second insulating layer 39 in which the contained amounts of the inorganic filler are adjusted so that the detectable amounts of alpha rays become 0.0015 count/cm$^2$·h or less, the fillerless solder resist 16 which does not contain the inorganic filler, and the externally connecting pads 17 using the Pb-free solder, it becomes possible to drastically reduce the amount of alpha rays reaching the semiconductor substrate 21 (semiconductor substrate 31).

By forming the first insulating layer 38 and the second insulating layer 39 so as to contain a black material such as carbon black, the black organic colorant, or the like, visible rays and ultraviolet rays may be shielded to prevent false operation of the semiconductor device 10 caused by a photoelectromotive force generated upon irradiation of the visible rays or the ultraviolet rays.

When aching is provided in the upper surface 39A of the second insulating layer 39, the upper surface 39A of the second insulating layer 39 is roughened without causing complicated manufacturing processes and an unnecessary material cost. Thus, it is possible to prevent the production cost of the semiconductor device 10 from increasing.

When the first metallic layer 26 is formed by providing a vapor-deposition technique such as sputtering to the upper surface 39A of the second insulating layer 39 and upper surfaces 12A of the internal connection terminals 12, the upper surfaces 12A of the internal connection terminals 12 are further firmly connected to the first metallic layer 26 by a metallic bond to thereby enhance the mechanical and electrical connection reliability between the upper surfaces 12A and the first metallic layer 26.

When the first metallic layer 26 has the laminated structure of the Ti film and the Cu film or the laminated structure of the Cr film and the Cu film, the thickness of the Ti film forming the first metallic layer 26 is 0.05 µm or more and 2 µm or less and the thickness of the Cu film is 0.2 µm or more and 1.5 µm or less, or the thickness of the Cr film forming the first metallic layer 26 is 0.01 µm or more and 0.05 µm or less and the thickness of the Cu film is 0.2 µm or more and 1.5 µm or less, it is possible to improve the adhesiveness contact of the upper surface 39A of the second insulating layer 39 and the upper surfaces 12A of the internal connection terminals 12 with the first metallic layer 26 and the adhesiveness contact of the first metallic layer 26 with the second metallic layer 27. Therefore, electrolytic plating carried out in a later process becomes good. Said differently a sheet resistance necessary for the electrolytic plating may be certainly maintained.

Modified Example of Embodiment 1

Figure 37:
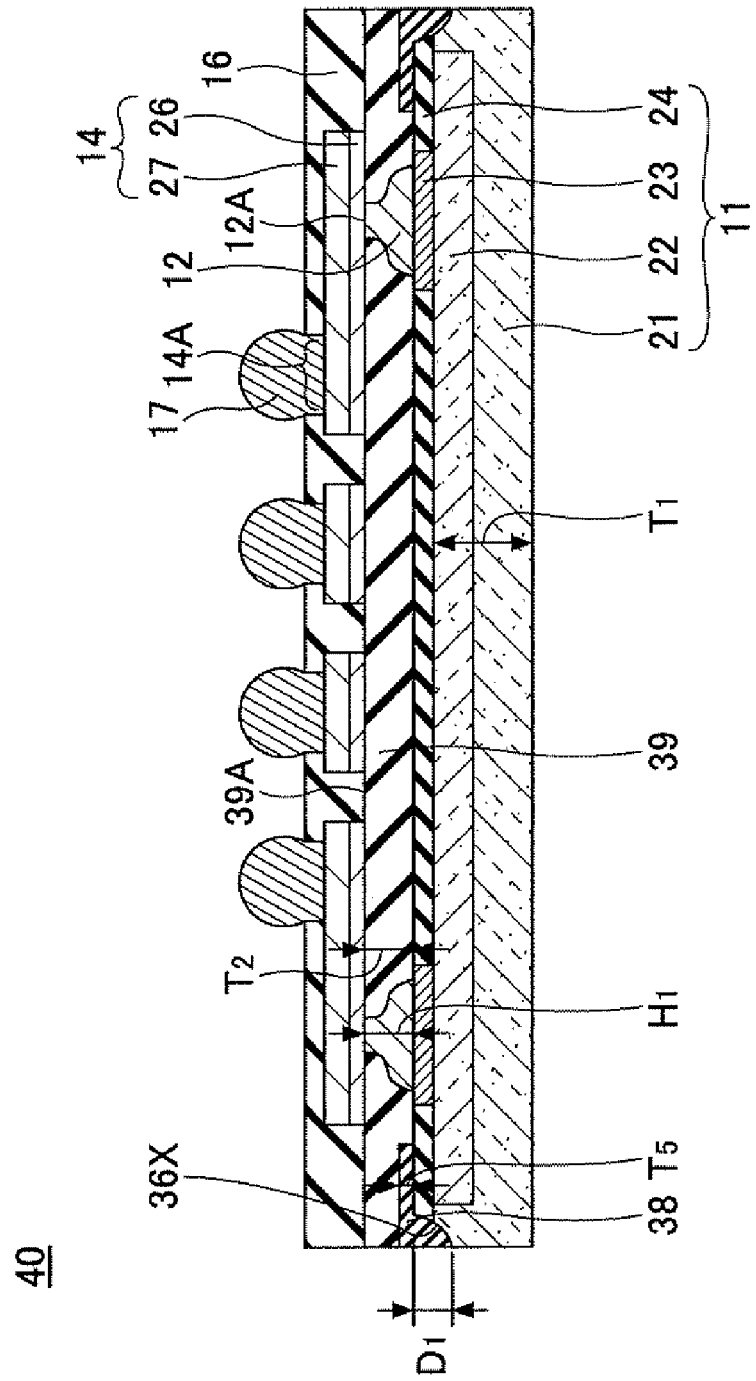
FIG. 37 is a cross-sectional view of a modified example of the semiconductor device of Embodiment 1.

FIG. 37 is a cross-sectional view of a modified example of the semiconductor device of Embodiment 1. Referring to FIG. 37, a semiconductor device 40 is described. The same reference symbols are attached to portions that are the same as those of the semiconductor device 10 illustrated in FIG. 12, and description of these portions may be omitted. Referring to FIG. 37, the semiconductor device 40 of the modified example of Embodiment 1 has the first insulating layer 38 only in regions in which the stepped portions 36X are formed and the first insulating layer 38 is not formed in a region below a region in which the externally connecting pads are formed.

In a case where false operation in the semiconductor integrated circuit 22 does not cause a problem, the first insulating layer 38 may be formed only on the regions in which the stepped portions 36X are formed as in the semiconductor device 40. The semiconductor device 40 may be formed by methods similar to those of the semiconductor device 10.

As described, the manufacturing methods and effects of the semiconductor device of the modified example of Embodiment 1 are similar to manufacturing methods and effects of the semiconductor device of Embodiment 1.

Embodiment 2

Figure 38:
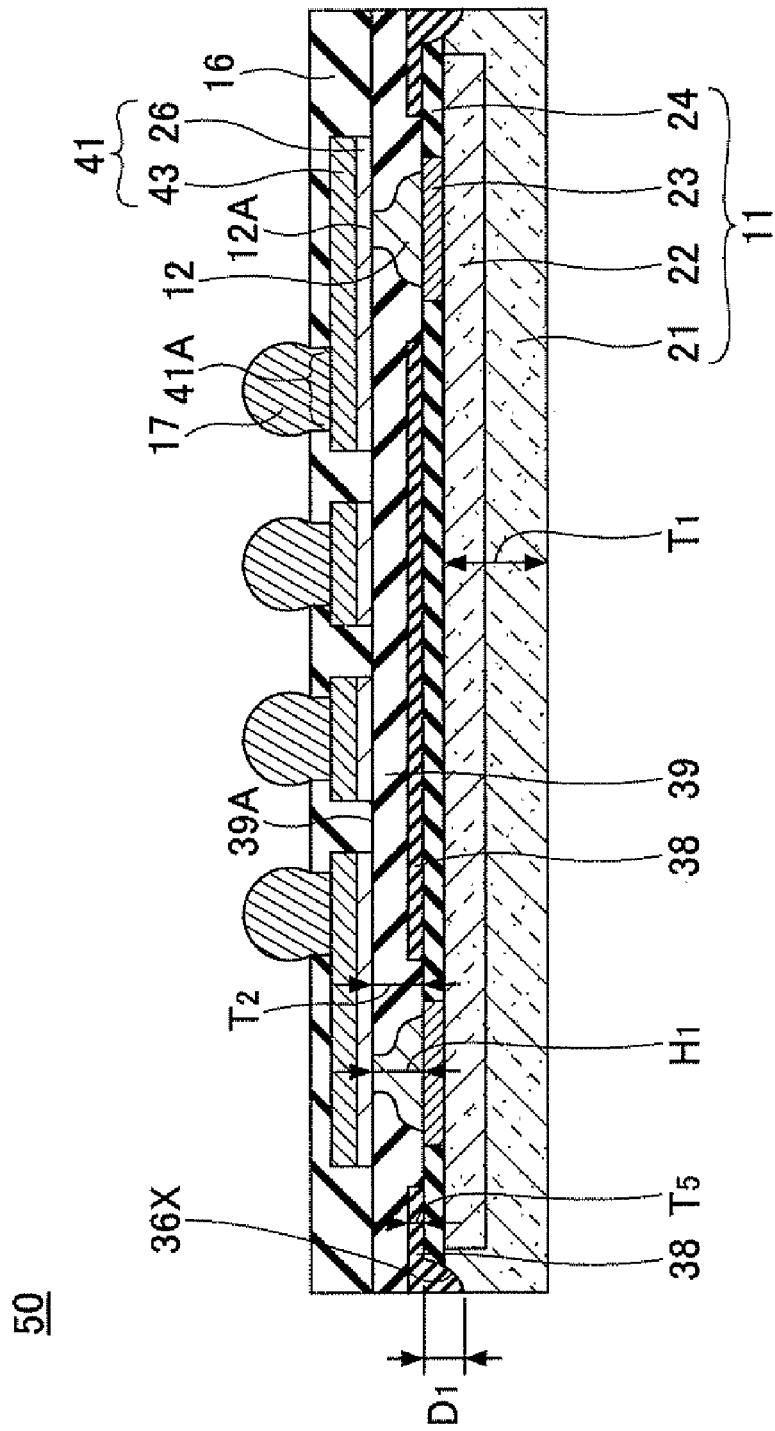
FIG. 38 is a cross-sectional view of a semiconductor device of Embodiment 2.

FIG. 38 is a cross-sectional view of a semiconductor device of Embodiment 2. Referring to FIG. 38, a semiconductor device 50 is described. The same reference symbols are attached to portions that are the same as those of the semiconductor device 10 illustrated in FIG. 12, and description of these portions may be omitted. Referring to FIG. 38, the semiconductor device 50 of Embodiment 2 has a structure similar to that of the semiconductor device 10 except for interconnections 41 provided instead of the interconnections 14 of the semiconductor device 10 of Embodiment 1. The interconnections 41 are made of a first metallic layer 26 and a third metallic layer 43.

Although the interconnections 14 of the semiconductor device 10 are formed by a subtractive method in Embodiment 1, an example of forming the interconnections 41 in the semiconductor device 50 with a semi-additive method is described.

FIG. 39 through FIG. 42 illustrate manufacturing processes of the semiconductor device of Embodiment 2. Referring to FIG. 39 to FIG. 42, the same reference symbols are attached to portions that are the same as those of the semiconductor device 50 illustrated in FIG. 38, and description of these portions may be omitted. Referring to FIG. 39 thru FIG. 42, a method of manufacturing the semiconductor device 50 of Embodiment 2 is described. At first, the structural body illustrated in FIG. 27 is formed by providing the processes similar to those described in Embodiment 1 in reference to FIG. 14 through FIG. 27.

Figure 39:
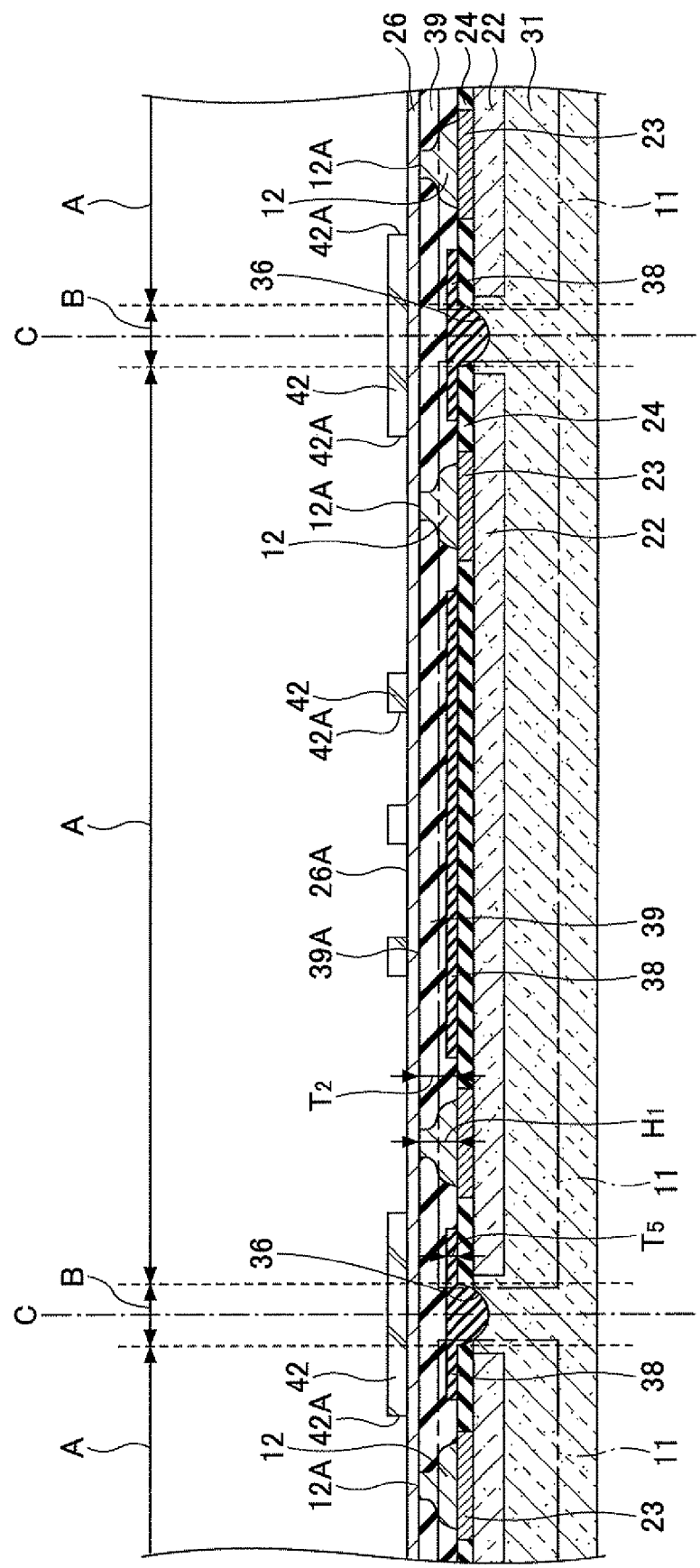
FIG. 39 illustrates the first manufacturing process in a manufacturing method of the semiconductor device of Embodiment 2

Next, in the process illustrated in FIG. 39, a resist is applied to the upper surface 26A of the first metallic layer 26, and the resist is exposed to light and developed to thereby form a resist film 42 having opening portions 42A corresponding to interconnection forming regions. In the process illustrated in FIG. 40, third metallic layers 43 are formed in the opening portions 42A by an electrolytic plating method using the first metallic layer 26 as a power feeding layer. The first metallic layer 26 and the third metallic layer 43 are electrically connected. The material of the third metallic layer 43 may be Cu or the like. The thickness $T_8$ of the third metallic layer 43 may be 5 µm through 20 µm.

Figure 40:
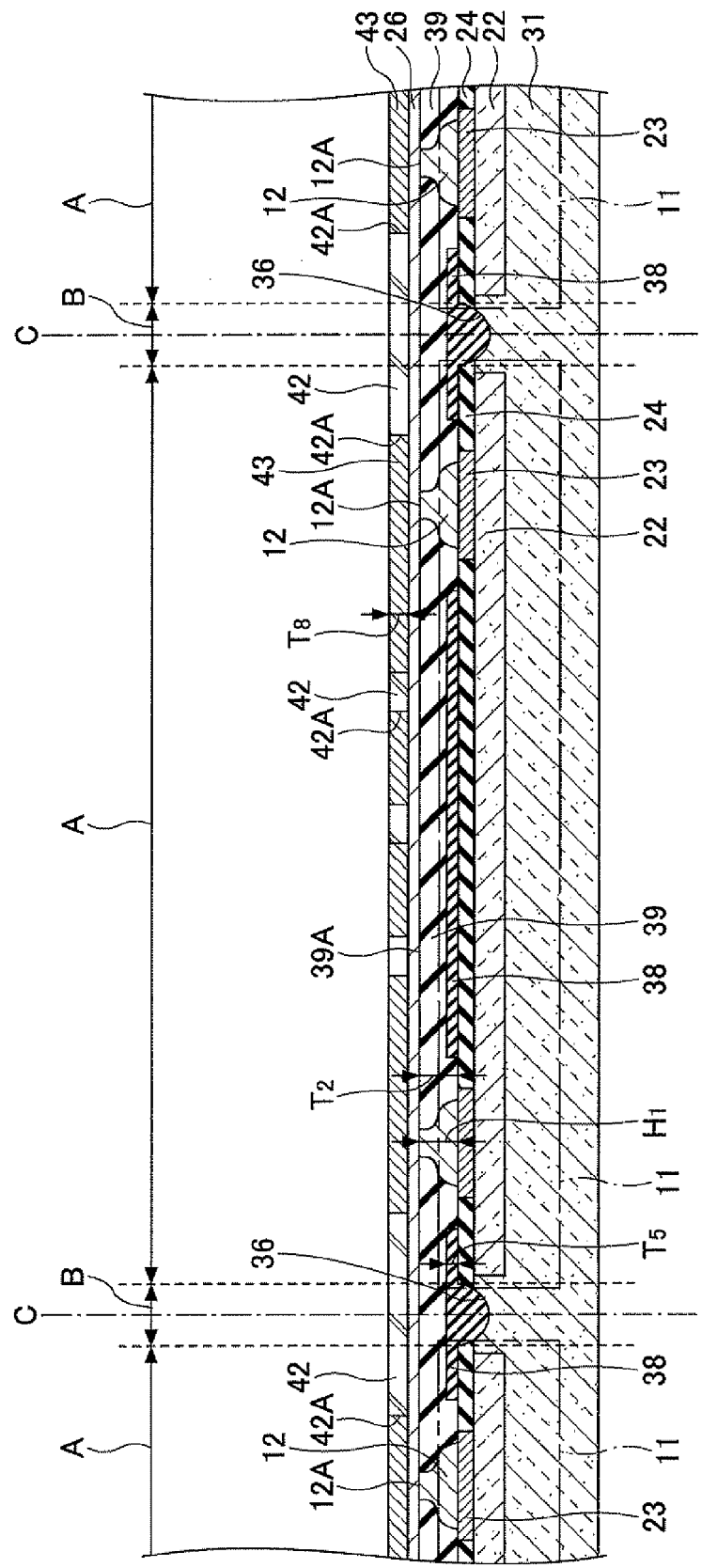
FIG. 40 illustrates the second manufacturing process in the manufacturing method of the semiconductor device of Embodiment 2.
Figure 41:
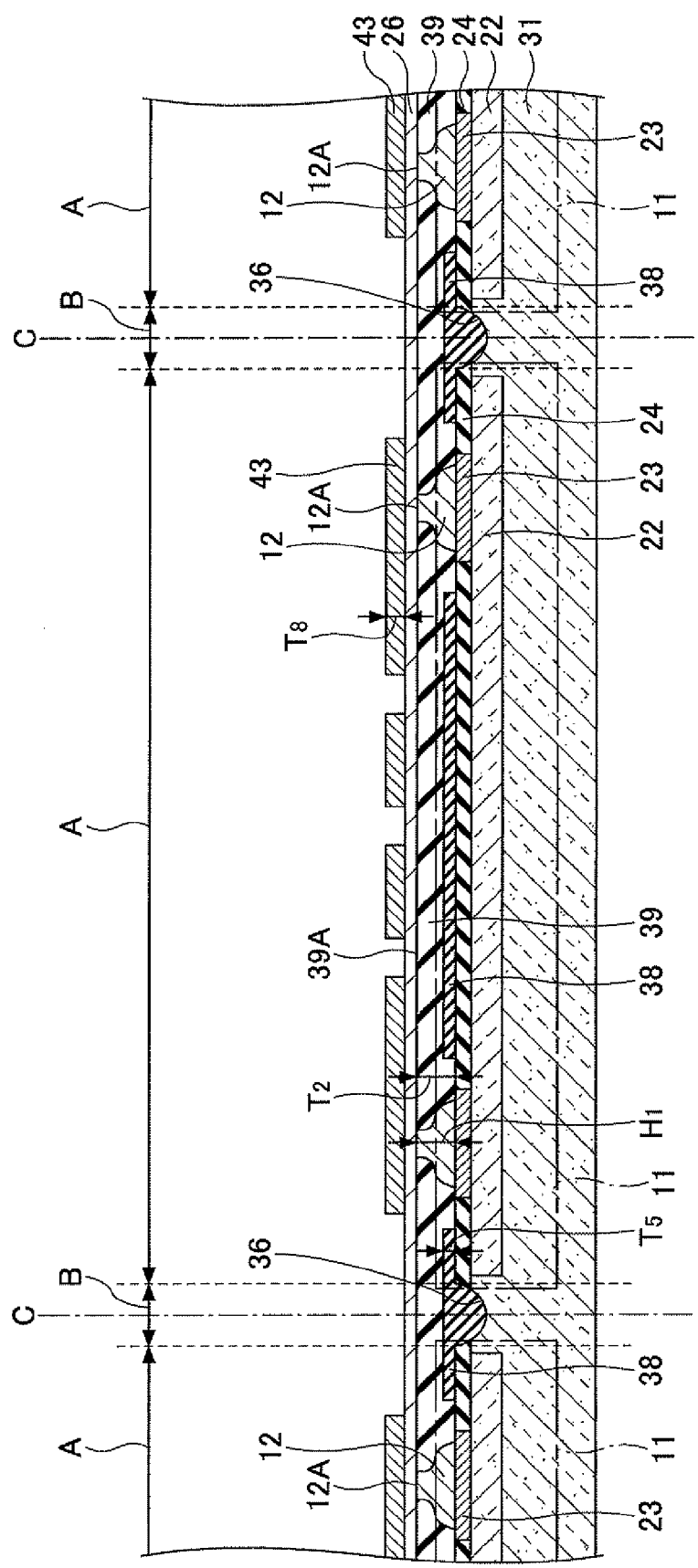
FIG. 41 illustrates the third manufacturing process in the manufacturing method of the semiconductor device of Embodiment 2.
Figure 42:
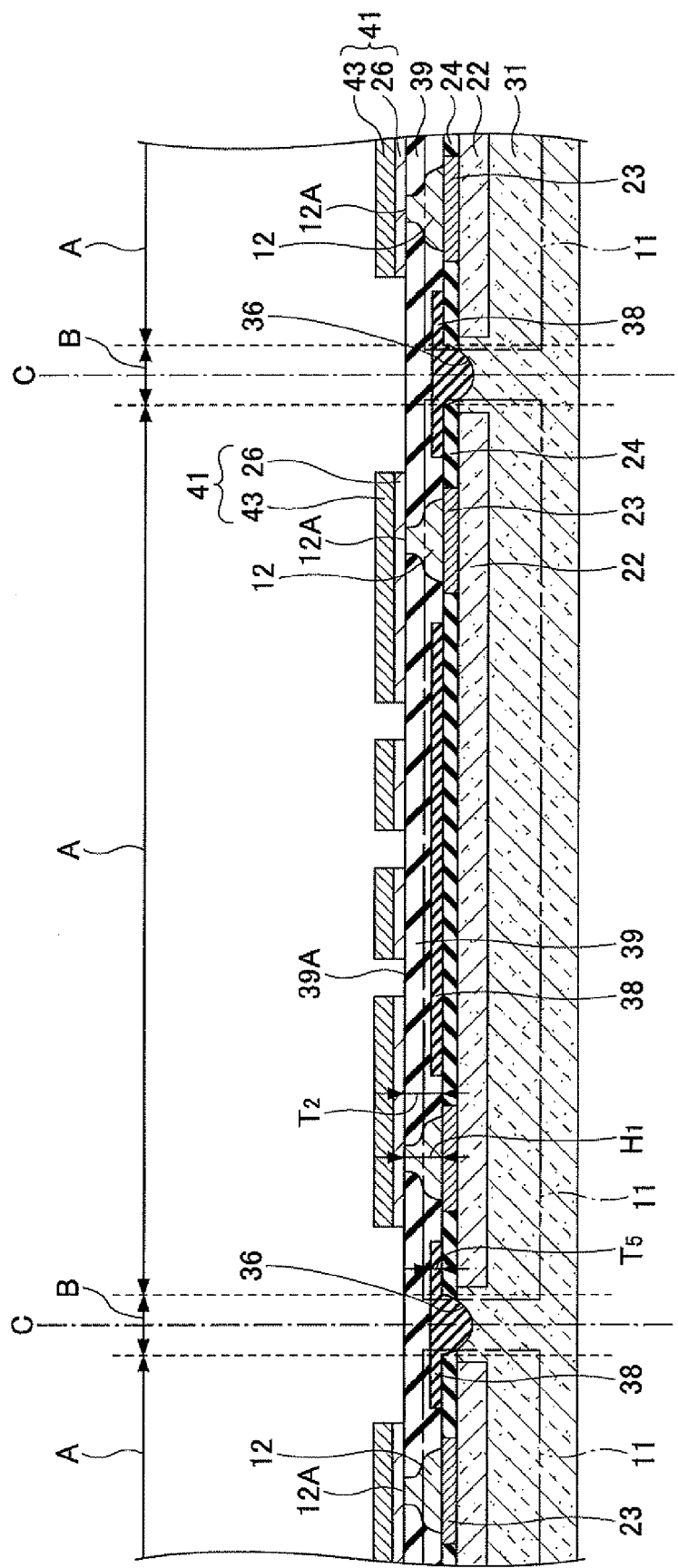
FIG. 42 illustrates the fourth manufacturing process in the manufacturing method of the semiconductor device of Embodiment 2.

The resist film 42 illustrated in FIG. 40 is removed in the process illustrated in FIG. 41. Next, in the process illustrated in FIG. 42, the interconnections 41 made of the first metallic layer 26 and the third metallic layer 43 are formed by removing the first metallic layer 26 in regions in which the third metallic layer 43 is not formed.

As illustrated in FIG. 39 through FIG. 42, the example of forming the interconnections 41 with the semi-additive method is described. Next, the semiconductor device 50 illustrated in FIG. 38 is formed by providing the processes similar to those described in Embodiment 1 in reference to FIG. 33 through FIG. 36.

As described, in the semiconductor device of Embodiment 2 and the manufacturing method of the semiconductor device like the semiconductor device of Embodiment 1 and the manufacturing method of the semiconductor device, the adhesiveness contact between the first insulating layer 38 and the stepped portion 36X of the groove 36 is improved by the anchor effect between the first insulating layer 38 and the stepped portion 36X of the groove 36 acting by providing the stepped portion 36X with the minute projections and dents. Thus, it is possible to prevent the first insulating layer 38 from peeling off from the stepped portion 36X. Said differently, the first insulating layer 38 can be prevented from peeling off from the semiconductor chip 11.

Further, by adopting the dual-layer structure including the first insulating layer 38 and the second insulating layer 39 in the insulating layer and making the contained amount of the inorganic filler of the first insulating layer 38 closer to the semiconductor substrate 21 (the semiconductor substrate 31) less than that of the second insulating layer 39 positioned farther from the semiconductor substrate 21 (the semiconductor substrate 31) or null, it is possible to drastically reduce the amount of alpha rays reaching the semiconductor substrate 21 (the semiconductor substrate 31).

When the first insulating layer 38 and the second insulating layer 39 contain any one of or both of polyimide and a polyimide compound, and an aggregate amount of the polyimide and the polyimide compound (even if any one of the amounts is zero) contained in the first insulating layer 38 is larger than an aggregate amount of the polyimide and the polyimide compound (even if any one of the amounts is zero) contained in the second insulating layer 39, the amount of alpha rays reaching the semiconductor substrate 21 (semiconductor substrate 31) can be drastically reduced.

Further, when the fillerless solder resist 16 does not contain an inorganic filler, it is possible to prevent the solder resist 16 from generating alpha rays.

When the material of the externally connecting pads 17 is a Pd free solder such as Sn-3.5Ag and Sn-3.0Ag-0.5Cu, it is possible to reduce the amount (alpha ray detectable amount) of alpha rays generated by the externally connecting pads 17.

With a synergetic effect of the first insulating layer 38 and the second insulating layer 39 in which the contained amounts of the inorganic filler are adjusted so that the detectable amounts of alpha rays become 0.0015 count/cm$^2$·h or less, the fillerless solder resist 16 which does not contain the inorganic filler, and the externally connecting pads 17 using the Pb-free solder, it becomes possible to drastically reduce the amount of alpha rays reaching the semiconductor substrate 21 (semiconductor substrate 31), and occurrence of soft error can be decreased.

By forming the first insulating layer 38 and the second insulating layer 39 so as to contain a black material such as carbon black, the black organic colorant, or the like, visible rays and ultraviolet rays may be shielded to prevent false operation of the semiconductor device 50 caused by a photo-electromotive force generated upon irradiation of the visible rays or the ultraviolet rays.

When ashing is provided in the upper surface 39A of the second insulating layer 39, the upper surface 39A of the second insulating layer 39 is roughened without causing complicated manufacturing processes and an unnecessary material cost. Thus, it is possible to prevent the production cost of the semiconductor device 50 from increasing.

When the first metallic layer 26 is formed by providing a vapor-deposition technique such as sputtering to the upper surface 39A of the second insulating layer 39 and upper surfaces 12A of the internal connection terminals 12, the upper surfaces 12A of the internal connection terminals 12 are further firmly connected to the first metallic layer 26 by a metallic bond to thereby enhance a mechanical and electrical connection reliability between the upper surfaces 12A and the first metallic layer 26.

When the first metallic layer 26 has the laminated structure of the Ti film and the Cu film or the laminated structure of the Cr film and the Cu film, the thickness of the Ti film forming the first metallic layer 26 is 0.05 μm or more and 2 μm or less and the thickness of the Cu film is 0.2 μm or more and 1.5 μm or less, or the thickness of the Cr film forming the first metallic layer 26 is 0.01 μm or more and 0.05 μm or less and the thickness of the Cu film is 0.2 μm or more and 1.5 μm or less, it is possible to improve the adhesiveness contact of the upper surface 39A of the second insulating layer 39 and the upper surfaces 12A of the internal connection terminals 12 with the first metallic layer 26 and the adhesiveness contact of the first metallic layer 26 with the third metallic layer 43. Therefore, electrolytic plating carried out in a later process becomes good. Said differently, a sheet resistance necessary for the electrolytic plating may be certainly maintained.

Further, since the interconnections 41 are formed by the semi-additive method, a dimensional accuracy of the interconnections 41 is improved to miniaturize its pattern like L/S=5/5 μm.

As a modification of Embodiment 1 and Embodiment 2, the insulating layer may be made of three layers or more. In this case, it is possible to drastically reduce the amount of alpha rays reaching the semiconductor substrate by decreasing the contained amount of an inorganic filler or nulling and increasing the contained amount of the polyimide in the insulating layer closer to the semiconductor device.

Referring to FIG. 14, the process of using the semiconductor substrate 31 having the plural semiconductor device forming regions A and the scribe regions B including the cutting positions C for separating the semiconductor device forming regions and the semiconductor device forming regions A is exemplified. However, the plural semiconductor chips may not be formed on the semiconductor substrate. One semiconductor chip may be formed on a sheet of semiconductor substrate.

As described, the embodiments may provide the semiconductor device having the semiconductor chip on which interconnections are formed and the method of manufacturing the semiconductor device, in which the adhesiveness contact between the semiconductor chip and the insulating layer is improved and the insulating layer is prevented from peeling off from the semiconductor chip.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a semiconductor chip including
      a semiconductor substrate,
      a semiconductor integrated circuit formed on a first surface of the semiconductor substrate,
      an electrode pad formed on a circuit forming face of the semiconductor substrate, and
      a protection layer;
   an internal connection terminal formed on the electrode pad;
   a stepped portion being a groove that is formed along the protection layer and a part of the semiconductor substrate and formed along an outer edge portion of the circuit forming face of the semiconductor chip;
   a first insulating layer formed on the protection layer, the first insulating layer being configured to cover at least the stepped portion by filling the stepped portion;
   a second insulating layer configured to cover the first insulating layer; and
   an interconnection formed on the second insulating layer and electrically connected to the electrode pad via the internal connection terminal.

2. The semiconductor device according to claim 1, wherein a surface of the stepped portion is roughened.

3. The semiconductor device according to claim 1, wherein a periphery of the internal connection terminal is covered by only the second insulating layer except for portions in which the electrode pad and the interconnection are in contact with the internal connection terminal.

4. The semiconductor device according to claim 1, further comprising:
   an externally connecting pad formed on the interconnection,
   wherein the first insulating layer is formed directly beneath the externally connecting pad on the circuit forming face of the semiconductor substrate.

5. The semiconductor device according to claim 1, wherein the first insulating layer and the second insulating layer contains any one or both of polyimide and a polyimide compound, and
a first aggregate amount of the polyimide and the polyimide compound contained in the first insulating layer is larger than a second aggregate amount of the polyimide and the polyimide compound contained in the second insulating layer.

6. The semiconductor device according to claim 1, wherein at least the second insulating layer contains an inorganic filler, and
a second amount of the inorganic filler contained in the second insulating layer is determined to cause an alpha ray detectable amount to be 0.0015 count/cm$^2$·h or less.

7. The semiconductor device according to claim 6, wherein a first amount of the inorganic filler contained in the first insulating layer is determined to cause an alpha ray detectable amount to be 0.0015 count/cm$^2$·h or less, and
the first amount of the inorganic filler contained in the first insulating layer is smaller than the second amount of the inorganic filler contained in the second insulating layer.

8. The semiconductor device according to claim 6, wherein the first insulating layer does not contain the inorganic filler.

9. The semiconductor device according to claim 1, wherein at least one of the first insulating layer and the second insulating layer contains a material which shields visible rays and ultraviolet rays.

10. The semiconductor device according to claim 1, wherein amounts of $Cl^-$ and $Na^+$ being ionic impurities contained in the first insulating layer and the second insulating layer are 10 ppm or less, respectively.

11. The semiconductor device according to claim 1, wherein amounts of $NH_4$ being an ionic impurity contained in the first insulating layer and the second insulating layer are 50 ppm or less, respectively.

12. The semiconductor device according to claim 1, wherein a solder resist is formed on the second insulating layer to cover the interconnection, and
the solder resist does not contain an inorganic filler.

13. The semiconductor device according to claim 4, wherein the material of the externally connecting pad does not contain Pb.

14. The semiconductor device according to claim 1, wherein the upper surface of the first insulating layer is roughened.

* * * * *